(12) United States Patent
Schumann et al.

(10) Patent No.: US 11,521,785 B2
(45) Date of Patent: *Dec. 6, 2022

(54) HIGH DENSITY COIL DESIGN AND PROCESS

(71) Applicant: Hutchinson Technology Incorporated, Hutchinson, MN (US)

(72) Inventors: John L. Schumann, Litchfield, MN (US); Nole D. German, Hutchinson, MN (US); Trent A. Johnson, Hutchinson, MN (US); Duane M. Jelkin, Hutchinson, MN (US); Matthew S. Lang, Excelsior, MN (US); Ryan N. Ruzicka, Waconia, MN (US); Forrest A. Cravens, Hutchinson, MN (US); Todd A. Peter, Darwin, MN (US); Zachary A. Pokornowski, Cokato, MN (US)

(73) Assignee: Hutchinson Technology Incorporated, Hutchinson, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/693,125

(22) Filed: Nov. 22, 2019

(65) Prior Publication Data

US 2020/0090854 A1 Mar. 19, 2020

Related U.S. Application Data

(63) Continuation-in-part of application No. 15/817,049, filed on Nov. 17, 2017, now Pat. No. 10,640,879.

(Continued)

(51) Int. Cl.
*B32B 3/00* (2006.01)
*H01F 27/28* (2006.01)
(Continued)

(52) U.S. Cl.
CPC .......... *H01F 27/2804* (2013.01); *C25D 3/38* (2013.01); *C25D 7/00* (2013.01); *G06K 19/0723* (2013.01);
(Continued)

(58) Field of Classification Search
None
See application file for complete search history.

(56) References Cited

U.S. PATENT DOCUMENTS

| 4,315,985 A | 2/1982 | Castellani et al. |
| 4,596,762 A | 6/1986 | Gruner |

(Continued)

FOREIGN PATENT DOCUMENTS

| CN | 110140203 A | 8/2019 |
| JP | 64-4091 A | 1/1989 |

(Continued)

OTHER PUBLICATIONS

Andricacos, P.C. et al., "Damascene Copper Electroplating for Chip Interconnections", IBM Journal of Research and Development, vol. 42, No. 5, pp. 567-574, Sep. 1998.

(Continued)

*Primary Examiner* — Seth Dumbris
(74) *Attorney, Agent, or Firm* — DLA Piper LLP (US)

(57) ABSTRACT

Devices including a substrate and a plurality of coil portions disposed on the substrate. The plurality of coil portions electrically coupled to form a coil structure.

19 Claims, 45 Drawing Sheets

Related U.S. Application Data

(60) Provisional application No. 62/774,027, filed on Nov. 30, 2018, provisional application No. 62/423,995, filed on Nov. 18, 2016.

(51) Int. Cl.

| | | |
|---|---|---|
| *C25D 7/00* | (2006.01) | |
| *C25D 3/38* | (2006.01) | |
| *H05K 1/18* | (2006.01) | |
| *H05K 1/11* | (2006.01) | |
| *G06K 19/07* | (2006.01) | |
| *G11B 5/48* | (2006.01) | |
| *H01F 41/04* | (2006.01) | |

(52) U.S. Cl.
CPC ............ *G11B 5/484* (2013.01); *H01F 41/041* (2013.01); *H05K 1/111* (2013.01); *H05K 1/181* (2013.01); *H01F 2027/2819* (2013.01); *H05K 2201/1003* (2013.01); *H05K 2201/10363* (2013.01); *H05K 2201/10522* (2013.01)

(56) References Cited

U.S. PATENT DOCUMENTS

| | | |
|---|---|---|
| 5,209,817 A | 5/1993 | Ahmad et al. |
| 5,867,347 A * | 2/1999 | Knight ................. G11B 5/4873 360/294.5 |
| 6,239,979 B1 | 5/2001 | Ruff |
| 6,423,200 B1 | 7/2002 | Hymes |
| 6,600,404 B1 | 7/2003 | Kajino |
| 6,791,845 B2 * | 9/2004 | Belopolsky .......... H05K 3/3415 174/535 |
| 7,027,141 B2 | 4/2006 | Girard et al. |
| 7,176,773 B2 | 2/2007 | Shoji |
| 7,384,531 B1 | 6/2008 | Peltoma et al. |
| 7,388,733 B2 | 6/2008 | Swanson et al. |
| 7,697,237 B1 | 4/2010 | Danielson |
| 7,929,252 B1 | 4/2011 | Hentges et al. |
| 8,144,430 B2 | 3/2012 | Hentges et al. |
| 8,169,746 B1 | 5/2012 | Rice et al. |
| 8,344,842 B1 | 1/2013 | Luzanov |
| 8,513,124 B1 | 8/2013 | Ponnuswamy et al. |
| 8,885,299 B1 | 11/2014 | Bennin et al. |
| 9,366,879 B1 | 6/2016 | Miller |
| 9,945,042 B2 | 4/2018 | Cha et al. |
| 9,976,224 B2 | 5/2018 | Jeong et al. |
| 10,640,879 B2 | 5/2020 | Riemer et al. |
| 2002/0112963 A1 | 8/2002 | Nakano et al. |
| 2003/0188886 A1 | 10/2003 | Fey et al. |
| 2004/0159257 A1 * | 8/2004 | Mathieu ........... G06K 19/07779 101/491 |
| 2004/0164835 A1 | 8/2004 | Shoji |
| 2004/0183743 A1 | 9/2004 | Reasoner et al. |
| 2005/0141138 A1 * | 6/2005 | Shiraishi ................ G11B 5/486 360/234.5 |
| 2005/0173152 A1 | 8/2005 | Post et al. |
| 2005/0263389 A1 | 12/2005 | Gung et al. |
| 2006/0118905 A1 | 6/2006 | Himori et al. |
| 2008/0007473 A1 | 1/2008 | Yosui et al. |
| 2008/0020641 A1 | 1/2008 | Hiew et al. |
| 2009/0096092 A1 | 4/2009 | Patel |
| 2010/0051334 A1 | 3/2010 | Ho et al. |
| 2010/0132997 A1 | 6/2010 | Hando |
| 2010/0271161 A1 | 10/2010 | Yan et al. |
| 2012/0098728 A1 * | 4/2012 | Kato ..................... G08B 13/00 343/856 |
| 2013/0222101 A1 | 8/2013 | Ito et al. |
| 2013/0333820 A1 | 12/2013 | Sherrer |
| 2014/0043129 A1 | 2/2014 | Wi et al. |
| 2014/0104133 A1 * | 4/2014 | Finn ................. G06K 19/07769 343/866 |
| 2014/0141548 A1 | 5/2014 | Mostoller et al. |
| 2014/0146649 A1 | 5/2014 | Bennin et al. |
| 2014/0183751 A1 * | 7/2014 | Yoshioka ............... G11B 5/486 257/773 |
| 2014/0247101 A1 | 9/2014 | Cha et al. |
| 2015/0028107 A1 * | 1/2015 | Fischer ................ B42D 25/455 235/488 |
| 2015/0035640 A1 | 2/2015 | Wang et al. |
| 2015/0036540 A1 | 2/2015 | Kasslin et al. |
| 2015/0170823 A1 | 6/2015 | Jeong et al. |
| 2015/0270053 A1 | 9/2015 | Cha et al. |
| 2015/0303065 A1 | 10/2015 | Buckalew et al. |
| 2016/0163444 A1 | 6/2016 | Choi et al. |
| 2016/0167958 A1 | 6/2016 | Shkel et al. |
| 2016/0293320 A1 | 10/2016 | Kim et al. |
| 2017/0150608 A1 | 5/2017 | Yoon et al. |
| 2018/0054900 A1 | 2/2018 | Ueda et al. |
| 2018/0142370 A1 | 5/2018 | Riemer et al. |
| 2020/0090852 A1 | 3/2020 | Riemer et al. |
| 2020/0232112 A1 | 7/2020 | Riemer et al. |

FOREIGN PATENT DOCUMENTS

| | | |
|---|---|---|
| JP | 5-48247 A | 2/1993 |
| JP | 2010-62325 A | 3/2010 |
| JP | 2010-67317 A | 3/2010 |
| JP | 2014-80674 A | 5/2014 |
| KR | 10-2019-0082295 A | 7/2019 |
| WO | 2018/094280 A1 | 5/2018 |

OTHER PUBLICATIONS

Moffat, T.P. et al., "Curvature Enhanced Adsorbate Coverage Mechanism for Bottom-Up Superfilling and Bump Control in Damascene Processing", Electrochimica Acta, vol. 53, Issue 1, pp. 145-154, Nov. 2007.
Romankiw, L.T. et al., "Thin Film Magnetic Heads—Early Inventions and Their Ongoing Impact on Magnetic Storage and Electrochemistry", ECS Transactions, vol. 50, Issue 10, pp. 3-17, 2012.
Vereecken, P.M., et al., "The Chemistry of Additives in Damascene Copper Plating", IBM Journal of Research and Development, vol. 49, No. 1, pp. 3-18, Jan. 2005.
International Search Report and Written Opinion in International Application No. PCT/US2017/062416, dated Jan. 25, 2018.
International Preliminary Report on Patentability in International Application No. PCT/US2017/062416 dated May 31, 2019.
International Search Report and Written Opinion in International Application No. PCT/US2019/062885, dated Feb. 7, 2020.
International Search Report and Written Opinion in International Application No. PCT/US2019/062883, dated Feb. 7, 2020.
Restriction Requirement for U.S. Appl. No. 15/817,049 dated Apr. 3, 2019.
Office Action for U.S. Appl. No. 15/817,049 dated Jul. 18, 2019.
Notice of Allowance for U.S. Appl. No. 15/817,049 dated Dec. 20, 2019.
Office Action for U.S. Appl. No. 16/693,169 dated Apr. 7, 2020.
Office Action for U.S. Appl. No. 16/693,169 dated Jul. 16, 2020.
Office Action for U.S. Appl. No. 16/827,583 dated Dec. 24, 2020.
Office Action for U.S. Appl. No. 16/693,169 dated Jan. 28, 2021.
International Preliminary Report on Patentability in International Application No. PCT/US2019/062885, dated Jun. 10, 2021.
International Preliminary Report on Patentability in International Application No. PCT/US2019/062883, dated Jun. 10, 2021.
Notice of Reasons for Refusal in Japanese Application No. 2019-526467, dated Sep. 21, 2021.
Office Action for U.S. Appl. No. 16/693,169 dated Aug. 24, 2021.
Office Action for U.S. Appl. No. 16/827,583 dated Sep. 20, 2021.
Notice of Decision of Refusal in Japanese Application No. 2019-526467, dated Apr. 12, 2022.
Notice of Preliminary Rejection in Korean Application No. 10-2019-7016946, dated Jan. 2, 2022.
Notice of Allowance for U.S. Appl. No. 16/693,169 dated Mar. 9, 2022.

(56) References Cited

OTHER PUBLICATIONS

Office Action for U.S. Appl. No. 16/827,583 dated Apr. 12, 2022.

* cited by examiner

901

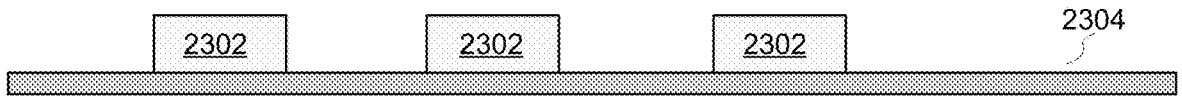

Figure 21a

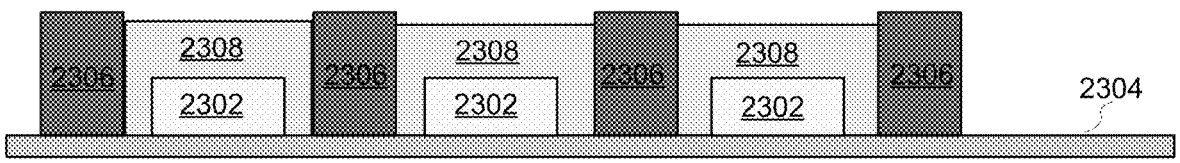

Figure 21b

| Step | Bath Component | Prefered | Unit | Range or comment |
|---|---|---|---|---|
| Crown Plating and optionally Formation of Metal Layer and Conformal Plating (all steps with one plating bath for some embodiments) | | | | |
| | Copper | 12 | g/liter | will depend on fluid velocity at article to plate. Low velocity will require a higher copper content, higher will require less copper. Also depends on current carrying capacity of item to plate. A low capacity will require less copper in bath. |
| | Acid | 1.8 | Molar | 1 to 2.5 molar |
| | Chlorides | 50 | ppm | 30 to 90 |
| | SPS (or MPS, DPS, or similar brightener) | 20 | ppm | 5-50 ppm range - Some embodiments may use up to 100 ppm |
| | PEG (PPG, EPE, Pluronic) | 500 | ppm | 100-750 range |
| | Leveler | 0 | ppm | As little as possible |
| Formation of Metal Layer | | | | |
| | Copper | 32 | g/liter | range is broad 10 to 40 g/L |
| | Acid | 1.8 | Molar | range is broad 0.5 to 2.5 molar |
| | Chlorides | 50 | ppm | 30 to 90 ppm |
| | SPS (or MPS, DPS, or similar brightener) | 20 | ppm | 5-50 ppm range - have seen some papers where even 100 ppm is used |
| | PEG (PPG, EPE, Pluronic) | 400 | ppm | 100-750 range |
| | Leveler | 2 | ppm | High concentration causes edges to round down - desirable, too little will cause edges to curve up - undesirable |
| Conformal Plating | | | | |
| | Copper | 32 | g/liter | range is broad 10 to 40 g/L, but low copper content limits plating rate and throughput suffers |
| | Acid | 1.8 | Molar | range is broad 0.5 to 2.5 molar |
| | Chlorides | 50 | ppm | 30 to 90 ppm |
| | SPS (or MPS, DPS, or similar brightener) | 20 | ppm | 5-50 ppm range - have seen some papers where even 100 ppm is used |
| | PEG (PPG, EPE, Pluronic) | 400 | ppm | 100-750 range |
| | Leveler | 2 | ppm | High concentration helps keep plating uniform on sides and top and allows higher machine throughput |

Figure 22

HIGH DENSITY COIL DESIGN AND PROCESS

CROSS-REFERENCE TO RELATED APPLICATIONS

This application claims the benefit of U.S. Provisional Application No. 62/774,027 filed on Nov. 30, 2018 and is a continuation-in-part of U.S. patent application Ser. No. 15/817,049, filed Nov. 17, 2019, which claims priority from U.S. Provisional Patent Application No. 62/423,995, filed on Nov. 18, 2016, each of which is hereby incorporated by reference in their entireties.

FIELD

The invention relates generally to coil structures and manufacturing processes thereof.

BACKGROUND

Electroplating processes for manufacturing structures such as copper or copper alloy circuit structures such as leads, traces and via interconnects are generally known and disclosed, for example, in the Castellani et al. U.S. Pat. No. 4,315,985 entitled Fine-Line Circuit Fabrication and Photoresist Application Therefor. Processes of these types are, for example, used in connection with the manufacture of disk drive head suspensions as disclosed in the following patents: Bennin et al. U.S. Pat. No. 8,885,299 entitled Low Resistance Ground Joints for Dual Stage Actuation Disk Drive Suspensions; Rice et al. U.S. Pat. No. 8,169,746 entitled Integrated Lead Suspension with Multiple Trace Configurations; Hentges et al. U.S. Pat. No. 8,144,430 entitled Multi-Layer Ground Plane Structures for Integrated Lead Suspensions; Hentges et al. U.S. Pat. No. 7,929,252 entitled Multi-Layer Ground Plane Structures for Integrated Lead Suspensions; Swanson et al. U.S. Pat. No. 7,388,733 entitled Method for Making Noble Metal Conductive Leads for Suspension Assemblies; and Peltoma et al. U.S. Pat. No. 7,384,531 entitled Plated Ground Features for Integrated Lead Suspensions. Processes of these types are used also in connection with the manufacture of camera lens suspensions as disclosed, for example, in the Miller U.S. Pat. No. 9,366,879 entitled Camera Lens Suspension with Polymer Bearings.

Superfilling and superconformal plating processes and compositions are also known and disclosed, for example, in the following articles: Vereecken et al, "The chemistry of additives in damascene copper plating," IBM J. of Res. & Dev., vol. 49, no. 1, January 2005; Andricacos et al. "Damascene copper electroplating for chip interconnections,","," IBM J. of Res. & Dev., vol. 42, no. 5, September 1998; and Moffat et al., "Curvature enhanced adsorbate coverage mechanism for bottom-up superfilling and bump control in damascene processing," Electrochimica Acta 53, pp. 145-154, 2007. By these processes, electroplating inside trenches (e.g., photoresist mask trenches defining spaces for the structures to be electroplated) occurs preferentially in the bottom. Voids in the deposited structures can thereby be avoided. All of the above-identified patents and articles are hereby incorporated by reference in their entireties and for all purposes.

There remains a continuing need for enhanced circuit structures. There is also a continuing need for efficient and effective processes, including electroplating processes, for manufacturing circuit and other structures.

SUMMARY

Devices including high-aspect ratio electroplated structures and methods of forming high-aspect ratio electroplated structures are described. A method for manufacturing metal structures includes providing a substrate having a metal base characterized by a height to width aspect ratio and electroplating a metal crown on the base to form the metal structure with a height to width aspect ratio greater than the aspect ratio of the base.

Other features and advantages of embodiments of the present invention will be apparent from the accompanying drawings and from the detailed description that follows.

BRIEF DESCRIPTION OF THE DRAWINGS

Embodiments of the present invention are illustrated, by way of example and not limitation, in the figures of the accompanying drawings, in which like references indicate similar elements and in which:

FIGS. 21a,b illustrate a process for forming high-aspect ratio electroplated structures according to an embodiment using photoresist during a conformal plating process;

FIG. 22 illustrates exemplary chemistries used for a process to form the initial metal layer, a standard/conformal plating process, and a crown plating process according to various embodiments;

DETAILED DESCRIPTION

High-aspect ratio electroplated structures and methods of manufacturing in accordance with embodiments of the invention are described. The high-aspect ratio electroplated structures provide tighter conductor pitch than current technologies. For example, high-aspect ratio electroplated structures, according to various embodiments, include a conductor stack with a cross-sectional area of the conductor stack that is greater than 50%. Moreover, the high-aspect ratio electroplated structures enable multiple layers of conductors according to embodiments. Further, the high-aspect ratio electroplated structures, according to various embodiments, enable precision alignment from layer to layer. For example, the high-aspect ratio electroplated structure can have alignment of less than 0.030 mm from layer to layer. The high-aspect ratio electroplated structures, according to various embodiments, enable reduced overall stack height.

The high-aspect ratio electroplated structures, according to various embodiments, enable thin dielectric material between a coil formed using the high-aspect ratio electroplated structures and a magnet. This enables the coil to produce stronger electro-magnetic fields than current printed circuit coils, such as those illustrated in FIG. 1. Thus, the high-aspect ratio electroplated structures are more cost effective, produce higher performance devices, and reduce the required footprint of devices over current technologies.

Figure 2:
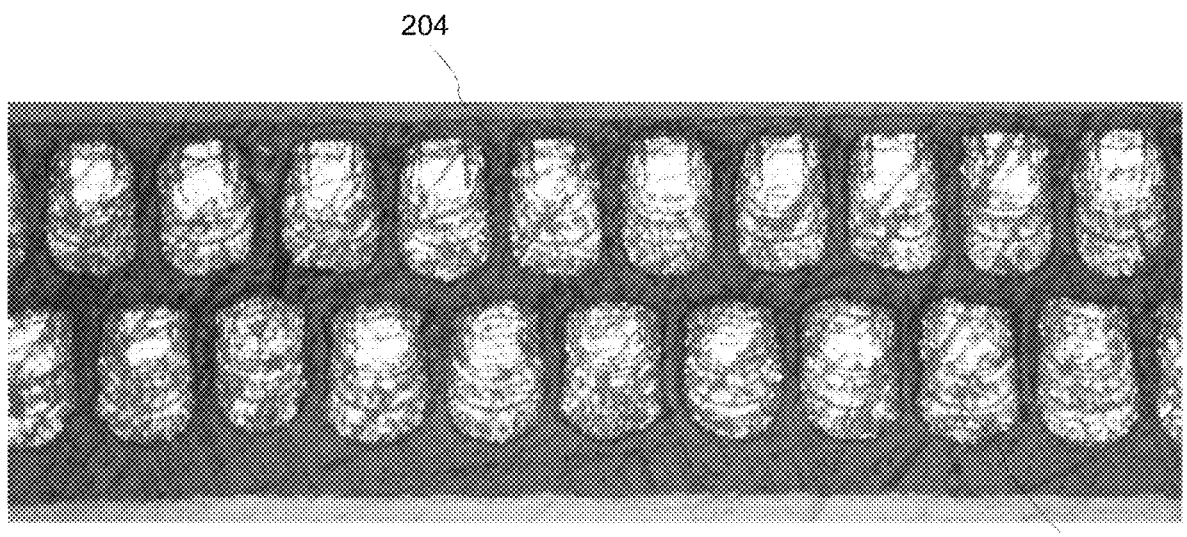
FIG. 2 illustrates a high-density precision coil including high-aspect ratio electroplated structures according to an embodiment.

FIG. 2 illustrates a high-density precision coil including high-aspect ratio electroplated structures according to an embodiment. The high-aspect ratio electroplated structures 202 are formed in a row with a dielectric material in between each row and each high-aspect ratio electroplated structure 204. The high-density precision coil can be formed as helical coils or other coil types.

Figure 3:
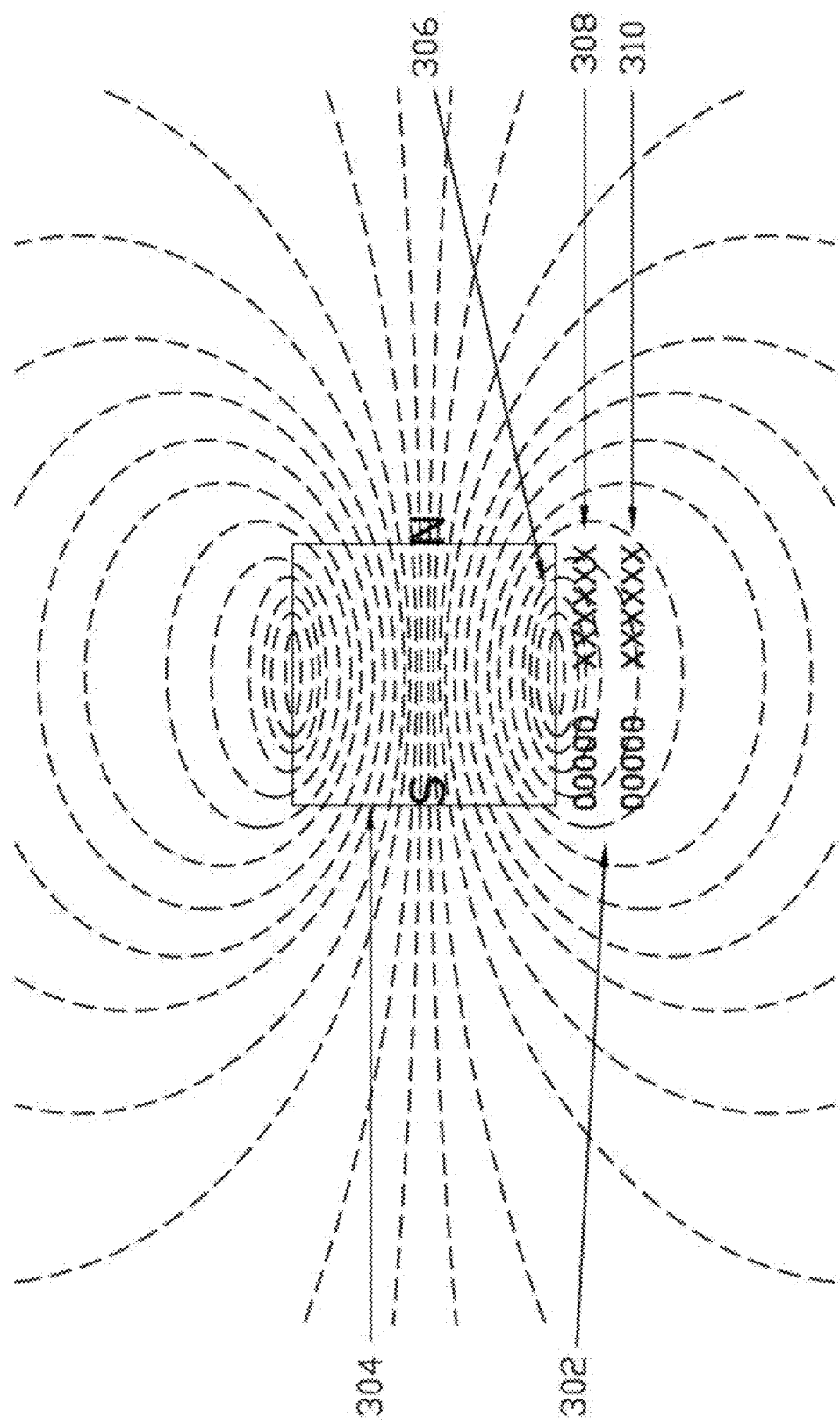
FIG. 3 illustrates a diagram used to represent the electromagnetic force generated by a high-density precision coil including high-aspect ratio electroplated structures according to an embodiment.

FIG. 3 illustrates a diagram used to represent the electromagnetic force generated by a high-density precision coil including high-aspect ratio electroplated structures according to an embodiment. The diagram includes a coils cross-section 302 in proximity of a magnet 304. The highest electro-magnetic force 306 is in the coil layer nearer 308 to the magnet 304. The coil layer 310 further from the magnet 304 applies less force. Primary factors that affect force come from the Lorentz equation: $\vec{F}=\vec{J}\times\vec{B}$. Because the strength of the magnitude of $\vec{B}$ decreases with distance between the coil and magnet, so $\vec{J}$ is the current flowing through the copper. Any area of cross section 302 that is not a conductor does not contribute to the force ($\vec{F}$).

Primary factors that affect force capability of a coil include the number of turns within a magnetic field (turns nearest the poles of the magnet provide the greatest force), the distance of the coil from the magnet (layers closer to the magnet will apply more force), and the total percent of copper cross-section area within the magnetic field. The use of high-aspect ratio electroplated structures according to various embodiments improves these aspects in comparison to coils using current coil technologies.

For example, a coil having two layers using current technologies has an overall thickness of approximately 210 micrometers, a conductor pitch of 38 micrometers, a cross section percentage of copper of approximately 20%, an estimated resistance of 3.1 ohms, an estimated force ratio of 1.0 (estimated B ratio of 1.0 and estimated J ratio of 1.0), and an estimated power ratio of 1.0. In comparison, a high density precision coil including high-aspect ratio electroplated structures, according to various embodiments, has an overall thickness of approximately 116 micrometers, a conductor pitch of 40 micrometers, a cross section percentage of copper of approximately 60%, an estimated resistance of 5.5 ohms, an estimated force ratio of 1.2 (estimated B ratio of 1.5 and estimated J ratio of 0.8), and an estimated power ratio of 0.71. Thus, a high density precision coil including high-aspect ratio electroplated structures, according to various embodiments, is a higher performance device. So, such a high density precision coil, according to some embodiments, provides 20% more force with 30% less power in half the thickness of a coil using current state of the art techniques.

Figure 1:
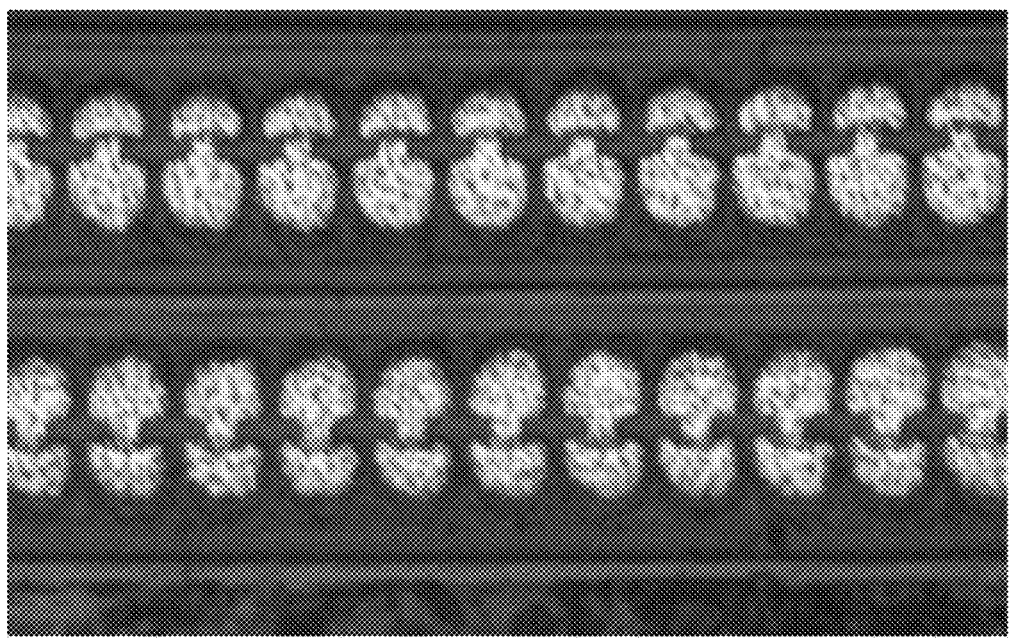
FIG. 1 illustrates a coil fabricated using current printed circuit technologies.
Figure 4:
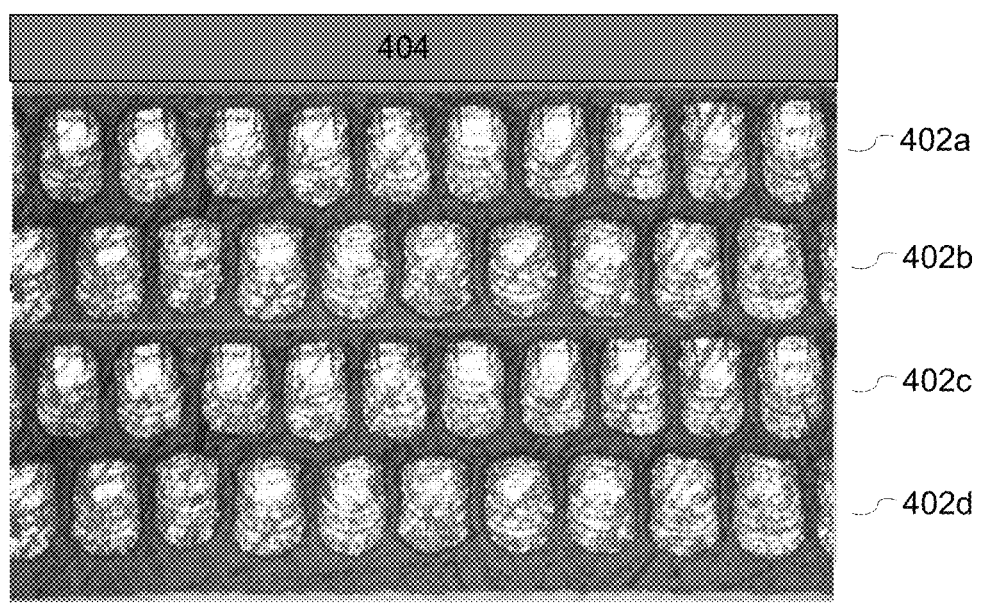
FIG. 4 illustrates a device including multiple layers of high-aspect ratio electroplated structures according to an embodiment configured for a linear motor type application.

FIG. 4 illustrates a device including multiple layers of high-aspect ratio electroplated structures according to an embodiment configured for a linear motor type application. Because of the dimension advantage over the current technologies, each layer 402a-d of high-aspect ratio electroplated structures is in closer proximity to a magnet 404 than is possible with current technologies, such as illustrated in FIG. 1. Further, the closer proximity of each layer 402a-d to the magnet 404 improves the force capability of the linear motor by taking advantage of the volume $\vec{B}$ field (magnetic flux density). Thus, the use of multilayer high-aspect ratio electroplated structures for a linear motor would require less layers than that using current technologies. Further, such a structure provides greater flexibility in obtaining electrical characteristics like low resistance.

Figure 5:
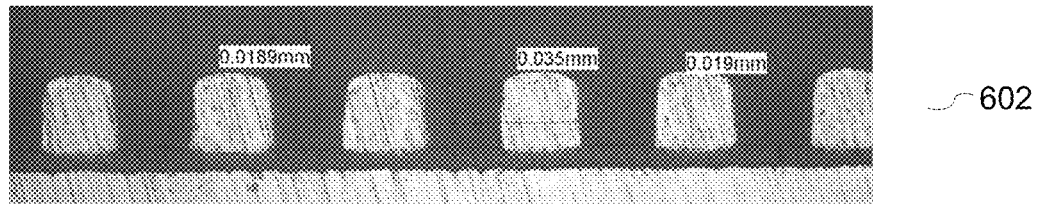
FIG. 5 illustrates high-aspect ratio electroplated structures according to some embodiments.

FIG. 5 illustrates high-aspect ratio electroplated structures, according to some embodiments, at a stage during the manufacturing process. The layer of high-aspect ratio electroplated structures 602 at this stage during the manufacturing process are formed using a semi-additive technology to create fine pitch, resist defined, conductors having an initial height to width aspect ratio (A/B) of approximately 1 to 1. For example, a high-aspect ratio electroplated structure may have a 20 micrometer height and a 20 micrometer width. According to some embodiments, the plating process is stopped at this point in order to remove the defining work, such as a photoresist mask, and seed layers using techniques including those known in the art.

Figure 6:
FIG. 6 illustrates the high-aspect ratio electroplated structures, according to some embodiments.

FIG. 6 illustrates the high-aspect ratio electroplated structures, according to some embodiments, at another stage during the manufacturing process. The layer of high-aspect ratio electroplated structures 702 at this stage during the manufacturing process are formed using crown plate technology to convert the semi-additive conductors to a high-aspect ratio, high percentage metal conductor circuit. For example, the high-aspect ratio electroplated structures have a final height to width ratio (A/S) greater than 1 to 1. The final height to width ratio may be in a range including 1.2 to 3.0 according to various embodiments. Other embodiments include a final height to width ratio of greater than 3.0. However, one skilled in the art would understand that any final height to width ratio can be obtained to meet design and performance criteria using the techniques described herein. At the stage of formation as illustrated in FIG. 6 formed from the previous stage as illustrated in FIG. 5, there is no particular limit on the final height of the high-aspect ratio electroplated structures as disclosed in the various embodiments.

Figure 7:
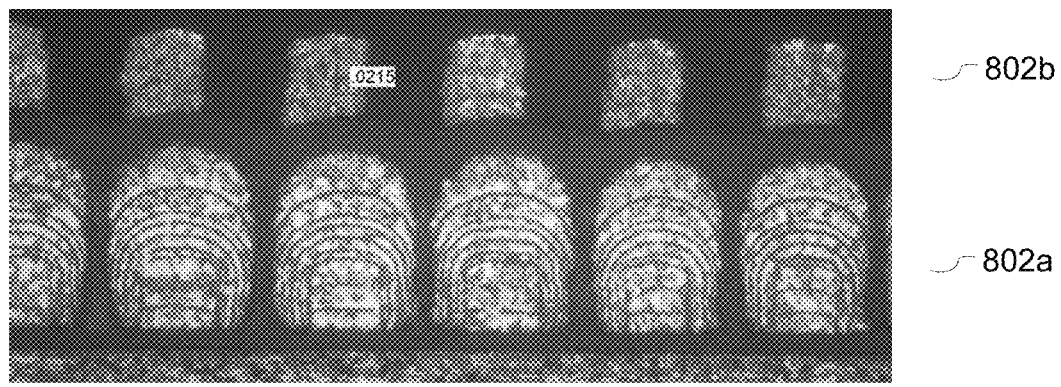
FIG. 7 illustrates the high-aspect ratio electroplated structures according to some embodiments.
Figure 8:
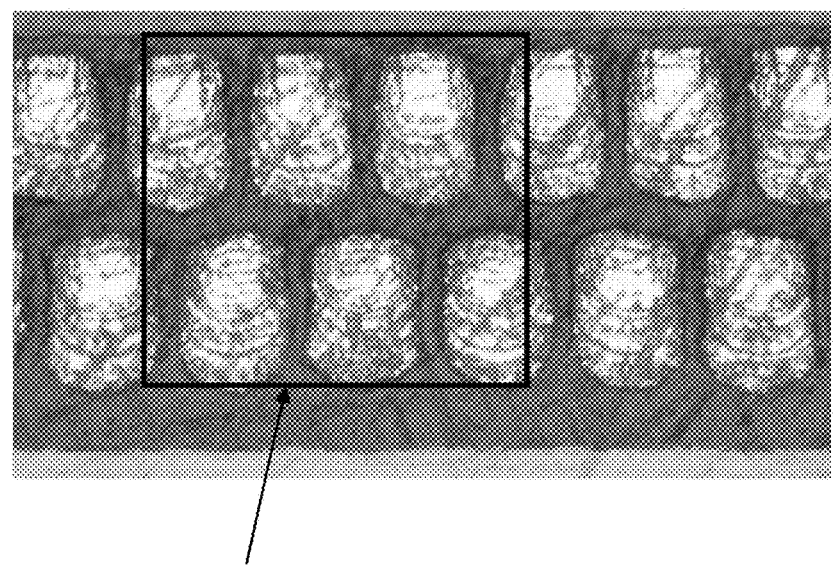
FIG. 8 illustrates a device having multiple layers of high-aspect ratio electroplated structures, according to some embodiments, with a high density cross-sectional area.

FIG. 7 illustrates the high-aspect ratio electroplated structures, according to some embodiments, at yet another stage during the manufacturing process. The layers of high-aspect ratio electroplated structures 802a,b at this stage during the manufacturing process are formed using planarization techniques to convert to allow multiple layers of high-aspect ratio electroplated structures to be stacked using semi-additive technology to form a subsequent layer. FIG. 8 illustrates a device having multiple layers of high-aspect ratio electroplated structures, according to some embodiments, with a high fraction of conductor cross-sectional area 901.

Methods used to form the high-aspect ratio electroplated structures from structures, such as those illustrated in FIG. 5, include using a low current density plating technique. This plating technique plates the side walls until the desired space is obtained between the high-aspect ratio electroplated structures. For various embodiments if the space between the high-aspect ratio electroplated structures is not narrowed enough, then unwanted pinching at the top can occur.

Figure 9:
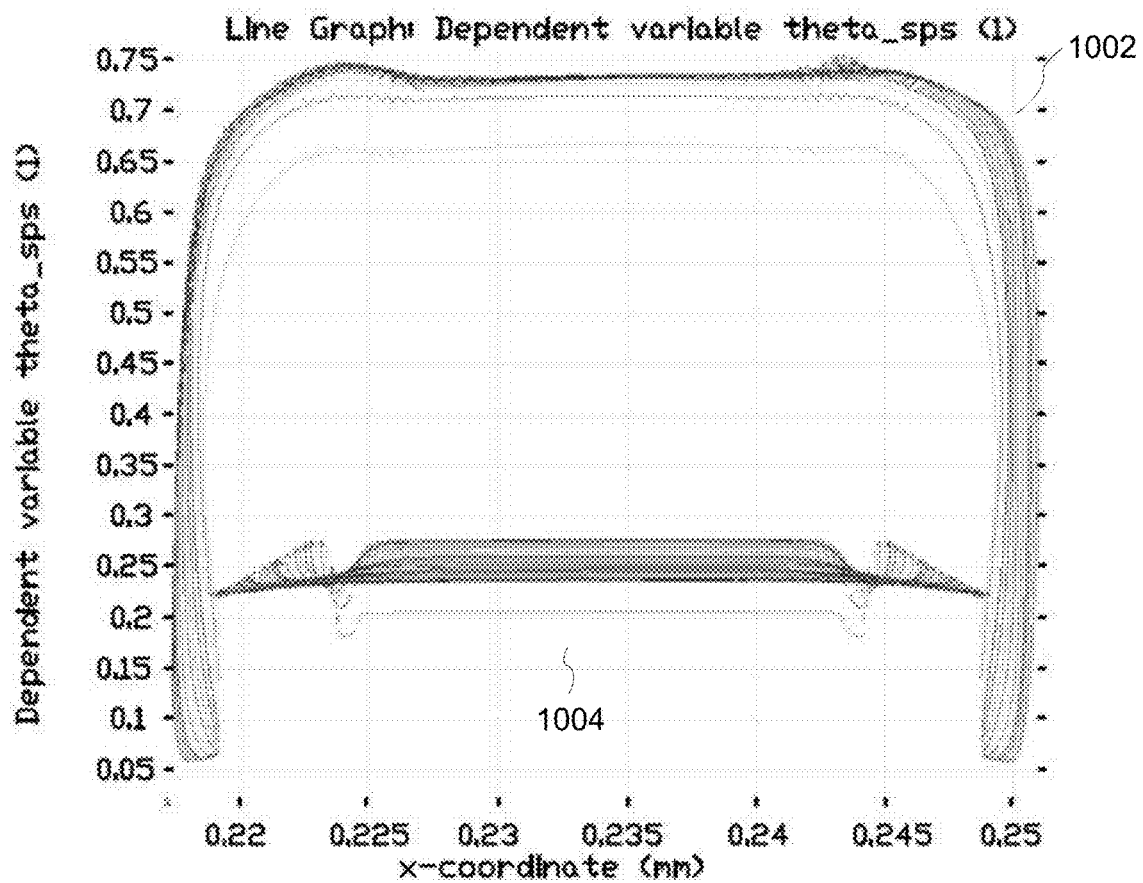
FIG. 9 illustrates a graph indicating the SPS coverage during a high current density plating technique and during a low current density plating technique according to embodiments.

Pinching occurs where the top edges of adjacent structures grow together and pinch off the gaps, which results in a short circuit. For various embodiments, the low current density plating process is enhanced by sufficient fluid exchange, such that a fresh plating bath is continuously made available to the surfaces where copper plating is occurring. Further, the methods used to form the high-aspect ratio electroplated structures include using a high current density plating technique. This high current density plating technique runs at a high percentage of the mass transfer limit. This plates primarily or solely onto the top of the conductive materials that form the high-aspect ratio electroplated structures. The high current density plating process is enhanced by precise current density control. FIG. 9 illustrates a graph with upper lines 1002 that indicate the high SPS coverage during the high current density plating technique according to an embodiment and with lower lines 1004 that indicate the low, very uniform, accelerator coverage during a low current density plating technique according to an embodiment.

Figure 10A:
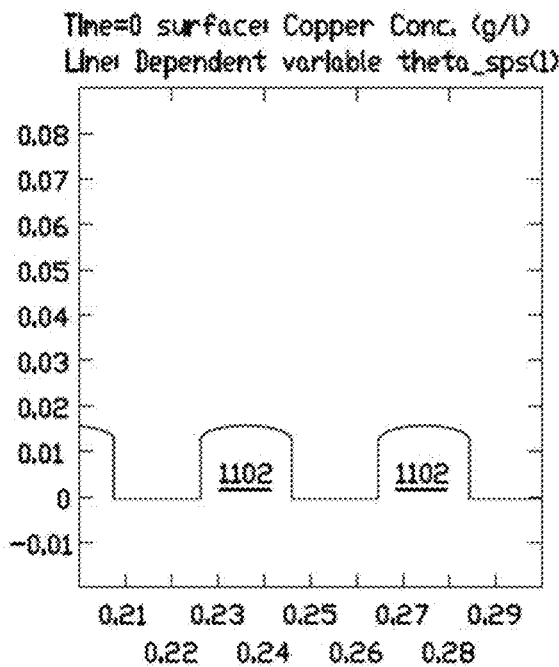
FIGS. 10a-f illustrate a process for forming high-aspect ratio electroplated structures according to an embodiment.
Figure 10B:
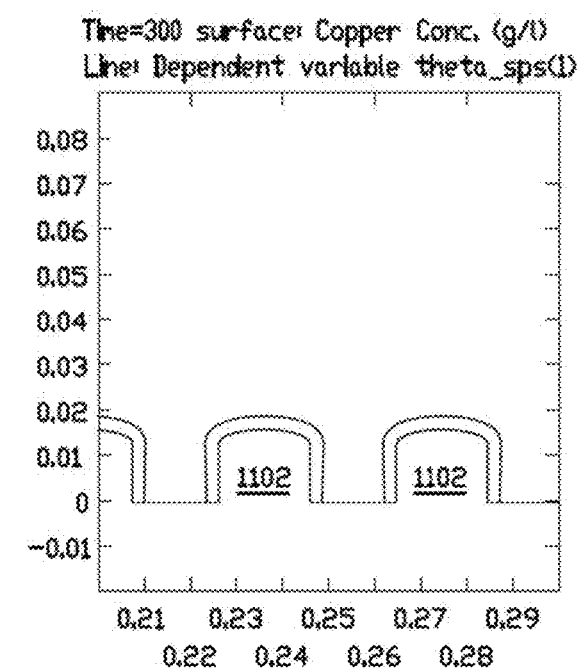

FIGS. 10a-f illustrate a process for forming high-aspect ratio electroplated structures according to an embodiment. FIG. 10a illustrates traces 1102 formed at a thick limit of resist capability at a time T1 of the process. For some embodiments, the pre-plated traditional traces are formed of copper using a process, such as a damascene process, or using etching and deposit techniques including those known in the art. FIG. 10b illustrates the formation of the high-aspect ratio electroplated structures at a time T2 during a low current density or conformal plating process. A conformal plating process, according to an embodiment, grows all surfaces of the traces at approximately the same rate. Further, the conformal plating process suppresses plating kinetic (low accelerator coverage). The conformal plating process also provides a fairly uniform metal concentration that has high, uniform suppressor coverage to compensate. This suppressed plating kinetic effect can be enhanced by inclusion of a leveler to the plating bath. Obtaining a uniform metal concentration and obtaining high, uniform suppressor coverage require lower current densities. According to some embodiments, a conformal plating process that uses 2 amps per square decimeter is used for the plating, such as copper, the brightener additive, the temperature and fluid mechanics of the platers. An example of such a conformal plating process includes, but is not limited to, a low current density plate process. At low current densities, the plating bath maintains a uniformly suppressed state providing conformal plating. For another embodiment, the addition of a leveler can be used in the plating bath to provide for a higher current density and faster plating. For yet another embodiment, increasing the copper content to near the solubility limit of copper sulfate in the plating bath can be used to further increase in the current density. This provides the ability to double the current density or even greater to achieve the same conformal plating quality. For example, the copper content may be as high as 40 grams per Liter with reduced acid content to prevent common ion effects.

Figure 10C:
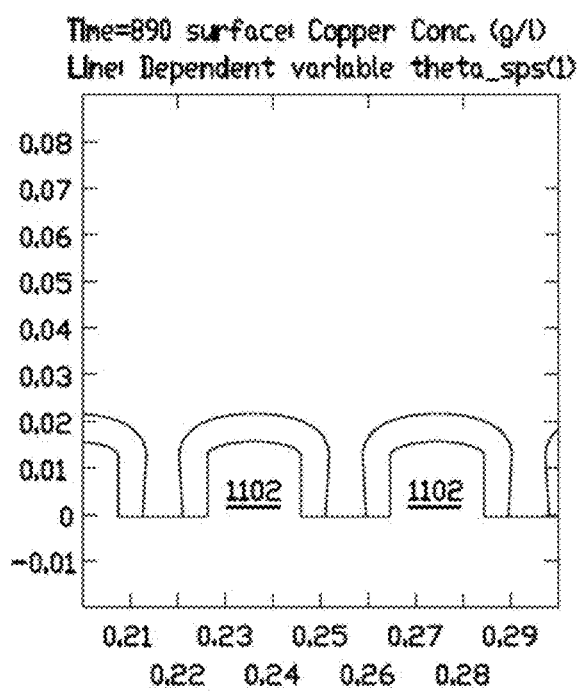

For some embodiments, the low current density plate process deposits a conductive material, such as copper, onto the top and sidewalls of the traces 1102, for example T2 is approximately five minutes into the process during the low current density plate process (T1+5 minutes). FIG. 10c illustrates the formation of the high-aspect ratio electroplated structures at a time T3 into the process during the low current density plate process. For an embodiment, the low current density plate process deposits a conductive material, such as copper, onto the top and sidewalls of the traces 1102, for example T3 is approximately five minutes into the process during the low current density plate process (T1+15 minutes).

Figure 10D:
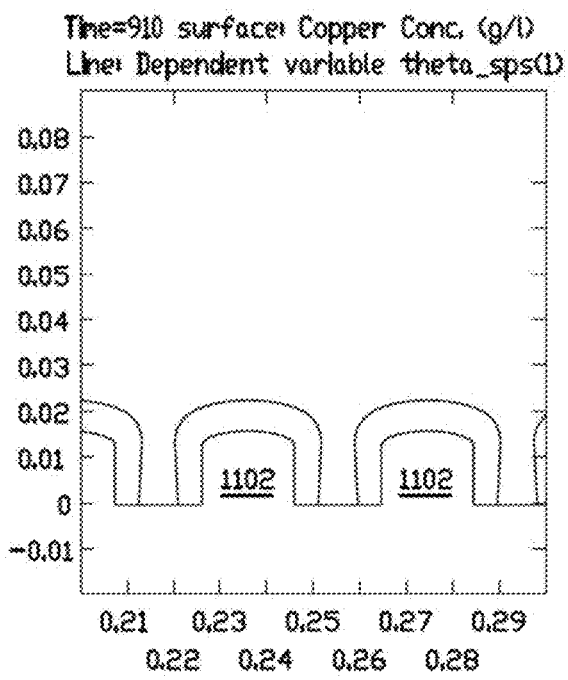

FIG. 10d illustrates the formation of the high-aspect ratio electroplated structures at a time T4 into the process during crown plating process, such as a high current anisotropic super-plating process. For example, T4 is approximately 15 minutes and 10 seconds into process (T1+15 minutes 10 seconds). For some embodiments, the high current anisotropic super-plating process is a crown plate. A crown plate is based on balancing the interactions between the following factors: metal concentration in the solution; brightener additive; suppressor additives; mass transfer—fluid exchange rate to surface; leveler; and current density at substrate. The metal concentration in the solution may include, but is not limited to, copper. The brightener additive may include, but are not limited to, SPS (bis(3-sulfopropyl)-disulfide), DPS (3-N,N-dimethylaminodithiocarbamoyl-1-propanesulfonic acid), and MPS (mercaptopropylsulfonic acid). The suppressor additive may include, but is not limited to, straight PEG of various molecular weights including those known to those skilled in the art, poloxamines, co-block polymer of poly-ethylene and polypropylene glycols such as water soluble poloxamers known by various trade names such as BASF pluronic f127, and random co-polymers such as the DOW® UCON family of high performance fluids, again at various ratios of the monomers and various molecular weights, Polyvinylpyrolidones of various molecular weights.

The high current anisotropic super-plating process, according to some embodiments, includes a suppressed exchange current that is 1% of accelerated current. Further, the side walls of the high-aspect ratio electroplated structures being formed have a nearly zero accelerator coverage. The nearly zero accelerator coverage is achieved by shifting the Nernst Potential for copper deposition to favor suppressor coverage. Moreover, high over potential and copper availability (transport phenomena) leads to high accelerator coverage at the top of the structure being formed. The copper bulk concentrate also may be tuned to support the nearly zero accelerator coverage during the process. For example, the copper bulk concentrate for the high current anisotropic super-plating process is 14 grams per Liter or less. For some embodiments, the copper bulk concentrate depends on the specific fluid mechanics. Because various embodiments of the process run at a high fraction of the mass-transfer-limit, small differences in fluid velocity across the article to be plated will impact what the mass-transfer-limit is, achieving a sufficient control of the gap between plated lines without a high degree of control of the fluid velocity across all areas of the article to be plated is difficult. The high current anisotropic super-plating process, according to some embodiments, includes a leveler additive to defeat accelerator coverage to minimize or eliminate plating on the side walls of the structure being formed. For other embodiments, a plating bath is used without a leveler additive.

At elevated current densities, such as those used during the high current anisotropic super-plating process, a three-fold feedback mechanism comes into play according to some embodiments. The mass-transfer effects deplete copper in the space between the traces. Moreover, the high current densities support an accelerator (e.g., SPS) dominated surface. To maintain suppressed side walls, mass transfer is tuned to lower the Nernst potential through copper mass transfer effects. For example, the fluid boundary layer thickness and spacing between each trace is designed to lower the Nernst potential.

Further, high current anisotropic super-plating process, according to some embodiments, includes operating at a copper concentration where these differences can create a greater than four times concentration difference. During such conditions, the lower copper concentration and Nernst potential contributes to a decrease in plating rate. For example, when the Nernst potential is shifted approximately in a range of 50 millivolts ("mV") to 60 mV this can contribute to a twenty times decrease in the plating rate. Such conditions induce Tafel kinetics, which for copper plating is a ten times change in current for every 120 mV change in applied voltage, not rectifier voltage. Lower sidewall current feeds back to the top surface of the structures being formed where diffusion length is short, which promotes faster delivery of metal from the plating bath (solution) to the surface and higher accelerator coverage instead of suppression, and high Nernst potential. For some embodiments, a two additive system (e.g., brightener and suppressor) is used. Leveler diminishes the feed-back mechanism by blocking the SPS action on the top side of the plated feature.

As the spacing between metal conductors or traces continue to shrink, the aspect ratio of the height to width of the space between the metal conductors increase substantially. According to some embodiments, methods of electroplating processes provided herein achieve plating in the spacing between metal conductors at aspect ratios of 7:1 and greater.

Methods of forming high-aspect ratio electroplated structures, according to some embodiments, provide selective formation of metal crown plating at selective locations or regions. In one exemplary embodiment, selective formation of a metal crown is achieved by carrying out the electroplating process according the relationship:

$$\frac{C}{C\infty} \leq 0.33$$

where C is the concentration of the metal (in this instance copper) where the plating takes place, and $C\infty$ is the bulk concentration in the plating bath. This relationship can also be expressed as carrying out the electroplating process where $$\frac{C}{C\infty}$$

is equal to or greater than 67 percent (%) of the mass transfer limit. According to other embodiments, selective formation of a metal crown is achieved by carrying out the electroplating process according to the relationship:

$$\frac{C}{C\infty} \leq 0.2$$

or where $$\frac{C}{C\infty}$$

is equal to or greater than 80% of the mass transfer limit. In another aspect, selective formation of a metal crown is achieved by carrying out the electroplating process according the relationship:

$$\frac{i}{i\,\text{limit}} \geq 0.8$$

here i is the current density and $i_{limit}$ is current density limit.

Figure 10E:
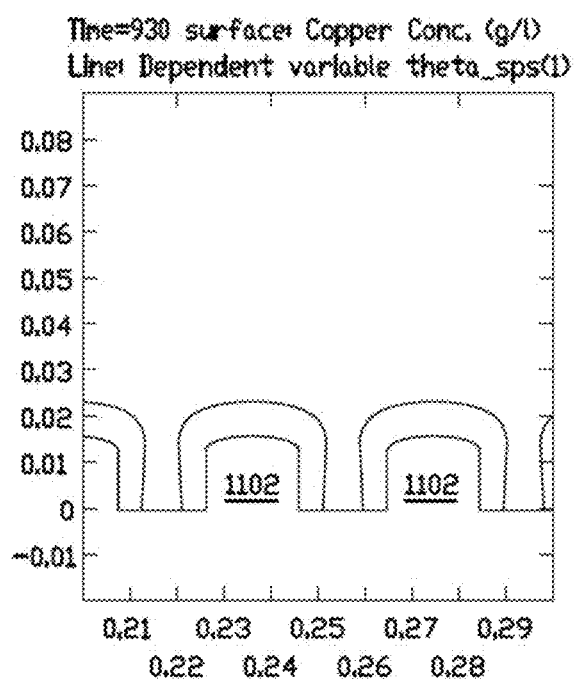
Figure 10F:
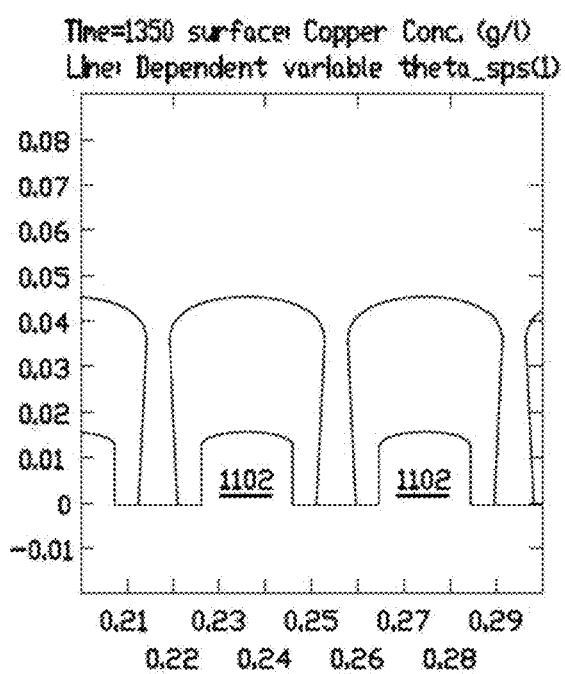

FIG. 10e illustrates the formation of the high-aspect ratio electroplated structures at a time T5 during a high current anisotropic super-plating process. For example, T5 is approximately 15 minutes and 30 seconds into process (T1+15 minutes 30 seconds). For another embodiment, the formation of the high-aspect ratio electroplated structures as illustrated in FIG. 10e occurs at a time T5=T1+5 minutes. FIG. 10f illustrates the formation of the high-aspect ratio electroplated structures at a time T6 during a high current anisotropic super-plating process. This illustrates the end of the crown plating process, which finalizes the formation of the high-aspect ratio electroplated structures according to some embodiments. For example, T6 is approximately 20 minutes into the process (T1+20 minutes). For another embodiment, the formation of the high-aspect ratio electroplated structures as illustrated in FIG. 10f occurs at a time T6=T1+10 minutes.

For some embodiments, the methods for forming high-aspect ratio electroplated structures use processes including conformal plating and anisotropic plating as described herein. The conformal plating process uses ⅔ of the total plating time according to some embodiments. For other embodiments, the conformal plating process uses ⅓ of the total plating time. Further, the conformal plating process starts at 2 amps per square decimeter ("ASD") for a low metal plating bath or 4 ASD for a high metal plating bath. For example, the plating bath includes 12 grams per Liter of copper and 1.85 molar (mole per Liter) of sulfuric acid. Alternatively, the conformal plating process is a process that plates at a rate of 0.4 to 1.2 micrometers per minute. The conformal plating process, according to an embodiment, continues until the space between the traces is in a range including 6-8 micrometers. The current density will slowly decrease as the surface area of the structures being formed increases. However, the process will achieve a uniform current density and growth rate of all the surfaces being formed. For some embodiments the current can be increased to maintain current density as the surface area of the high-aspect ratio structures being formed increases.

The anisotropic plating process, according to some embodiments, uses ⅓ of the total plating time to form the high-aspect ratio electroplated structures. The anisotropic plating process increases the ASD to 7 ASD (3.5 times the current of the conformal plating process) but, on average, double that at the top of the metal structure being formed. The same fluid flow can be maintained as used in the conformal plating process. For example, the plating rate is 3 micrometers per minute the top of the structure being formed with nearly zero plating rate on the side walls of the structure. As the structure grows, the average current drops in half, but peak current density is maintained at around 14 ASD at the top of the structured according to embodiments. For example, a peak current density is just over 50% of the mass-transfer-limit at the top surface and even though the side walls are exposed to approximately 3 grams per Liter of copper, the side walls plate at less than 10% of the mass-transfer limit or a 5:1 plating rate. At higher fractions of the mass transfer limit, one can get higher plating rate ratios.

Embodiments of the methods for forming high-aspect ratio electroplated structures include variations to those described above to form high-aspect ratio electroplated structures including different characteristics. For example, the copper content in a plating bath configured as an anisotropic bath can be different than the 13.5 grams per Liter as described above. Altering the copper content in a flat trace bath while using the same current density can be used to control the spacing between the high-aspect ratio electroplated structures. Another embodiment of the method described herein includes using a flat trace bath having a flat trace bath with a copper content of 12 grams per Liter to form high-aspect ratio electroplated structures spaced 8 micrometers apart. Yet another embodiment of the method described herein includes using a flat trace bath having a flat trace bath with a 15 grams per Liter to form high-aspect ratio electroplated structures spaced 4 micrometers apart. Thus, one skilled in the art would understand that adjusting other parameters of the methods described herein can be used to alter the characteristics of the high-aspect ratio electroplated structures. Some embodiments of the methods described herein include adjusting current density to match current plater conditions, such as mass-transfer rate, metal contained in the plating bath, fluid velocity, copper concentration, additives used, and temperature.

The method to form high-aspect ratio electroplated structures also includes using a thin dielectric process. According to some embodiments, photosensitive polyimide is used as the dielectric between each high-aspect ratio electroplated structure. The liquid photosensitive polyimide enables small via capability, good coverage between the high-aspect ratio conductors, good registration/margin capability, is a high reliability material, and has a coefficient of thermal expansion ("CTE") that is a close match to copper. The liquid photosensitive polyimide can easily fill the gap between the high-aspect ratio electroplated structures. According to some embodiments, the use of liquid photosensitive polyimide is used to create via access down to 0.030 millimeters. Other dielectrics that could be used include, but are not limited to, KMPR and SU-8.

Figure 11:
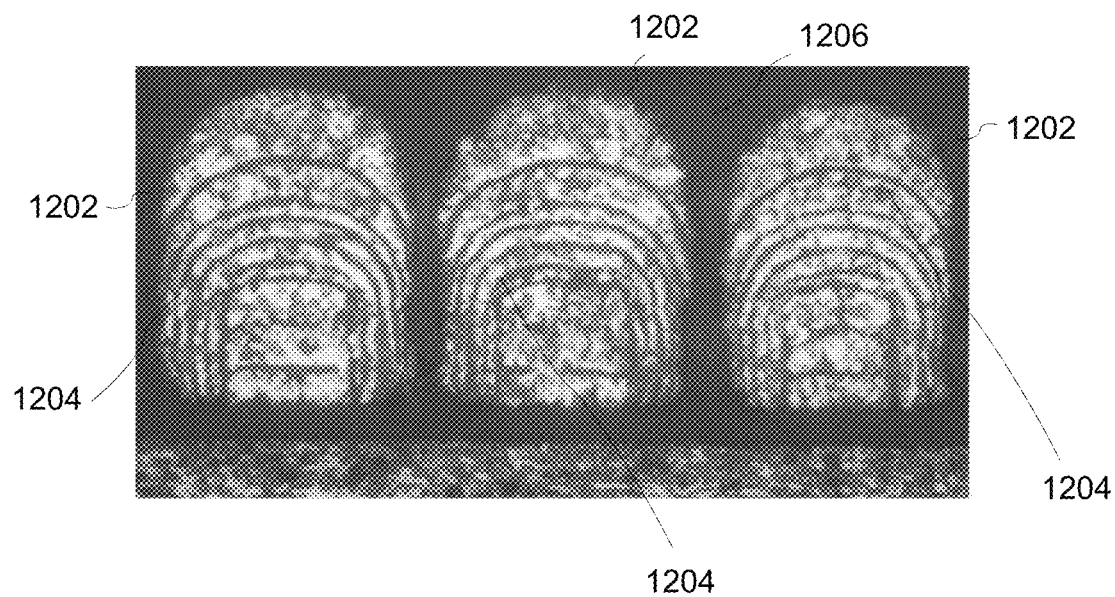
FIG. 11 illustrates high-aspect ratio electroplated structures according to some embodiments.
Figure 12:
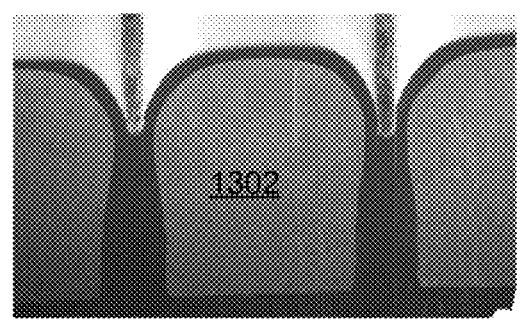
FIG. 12 illustrates a perspective view of high-aspect ratio electroplated structures according to some embodiments.

FIG. 11 illustrates high-aspect ratio electroplated structures, according to some embodiments, formed using methods described herein. Each high-aspect ratio electroplated structure 1202 includes multiple grain lines 1204 that show how the electroplating process progresses to form the structures. The thin dielectric 1206 is formed in between the high-aspect ratio electroplated structures 1202 and disposed on the high-aspect ratio electroplated structures 1202. FIG. 12 illustrates a perspective view of high-aspect ratio electroplated structures 1302, according to some embodiments, formed using methods described herein.

Figure 13A:
FIGS. 13a,b illustrate a high density precision coil formed using high-aspect ratio electroplated structures according to an embodiment.
Figure 13B:
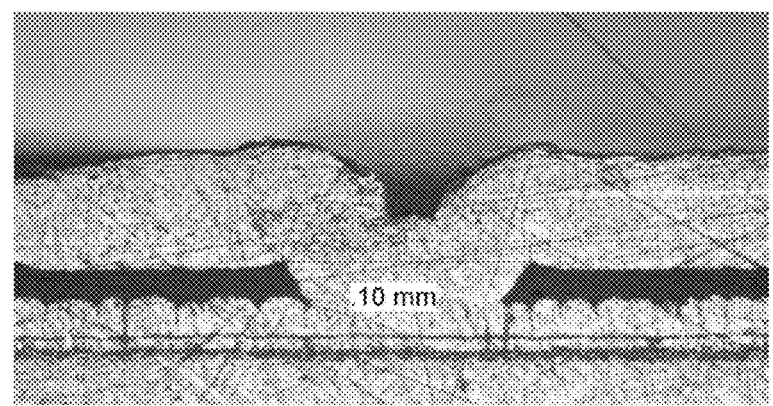

The methods described herein can be used to form high-aspect ratio electroplated structures that form high density precision coils. FIG. 13a illustrates a high density precision coil formed using high-aspect ratio electroplated structures according to an embodiment. The coil 1402 is formed of high-aspect ratio electroplated structures such as those described herein. The high density precision coil also includes a center coil via 1404. The center coil via 1404 reduces the voltage drop across the coil during the manufacture steps described herein. Further, the center coil via 1404 enables the ability to better control the variability of the pitch within a coil through better control of the voltage drop and the current during the anisotropic plating process described herein. The center coil via 1404 also enables better control of the voltage drop of the formed high density precision coil. FIG. 13b illustrates a cross-section of a center coil via 1404 as part of a high density precision coil as described herein.

Figure 14:
FIG. 14 illustrates the high-aspect ratio electroplated structures including high resolution stacked conductor layers according to an embodiment.

FIG. 14 illustrates the high-aspect ratio electroplated structures including high resolution stacked conductor layers according to an embodiment. The first conductor layer 1502a includes high-aspect ratio electroplated structures 1504 formed using techniques including those described herein. A first dielectric layer 1508 is formed using a thin dielectric process using techniques including those described herein. The first dielectric layer 1508 fills all the spaces between the high-aspect ratio electroplated structures of the first conductor layer 1502a and forms a coating over the high-aspect ratio electroplated structures 1504. The first dielectric layer 1508 is planarized using techniques know in the art. The second conductor layer 1502b includes high-aspect ratio electroplated structures 1506 formed over the planarized surfaced of the first dielectric layer 1508. A second dielectric layer 1510 is formed using a thin dielectric process using techniques including those described herein to fill all the spaces between the high-aspect ratio electroplated structures 1506 of the second conductor layer 1502b and to form a coating over the high-aspect ratio electroplated structures 1506. The second dielectric layer 1510 can also be planarized. Additional layers including high-aspect ratio electroplated structures can be formed using the techniques described herein.

Figure 15:
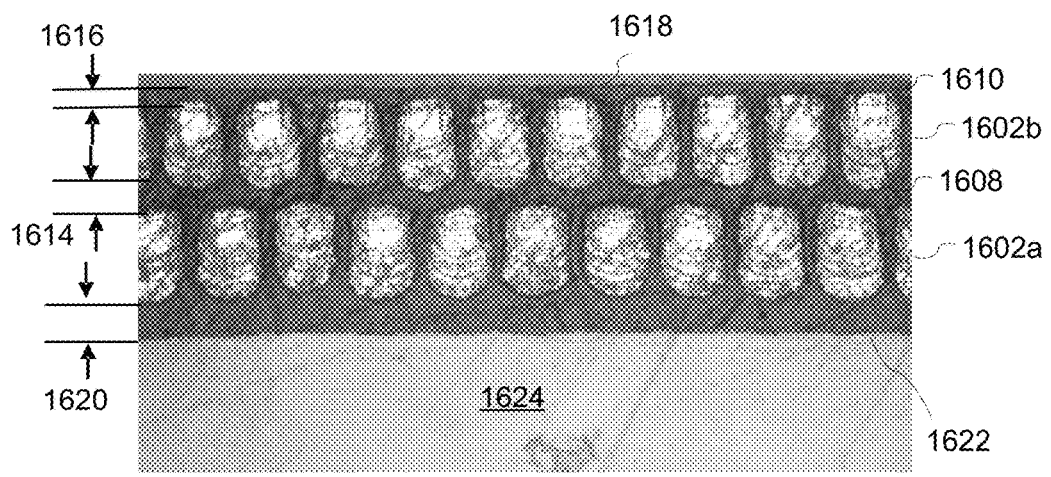
FIG. 15 illustrates a high-density precision coil including high-aspect ratio electroplated structures according to an embodiment.

FIG. 15 illustrates a high-density precision coil including high-aspect ratio electroplated structures according to an embodiment including high resolution stacked conductor layers. The first conductor layer 1602a includes high-aspect ratio electroplated structures formed using techniques including those described herein. A first dielectric layer 1608 is formed using a thin dielectric process using techniques including those described herein. The first dielectric layer 1608 fills all the spaces between the high-aspect ratio electroplated structures of the first conductor layer 1602a and forms a coating over the high-aspect ratio electroplated structures. The first dielectric layer 1608 is planarized using techniques know in the art. The second conductor layer 1602b includes high-aspect ratio electroplated structures formed over the planarized surfaced of the first dielectric layer 1608. A second dielectric layer 1610 is formed using a thin dielectric process using techniques including those described herein to fill all the spaces between the high-aspect ratio electroplated structures of the second conductor layer 1602b and to form a coating over the high-aspect ratio electroplated structures. The second dielectric layer 1610 can also be planarized. Additional layers including high-aspect ratio electroplated structures can be formed using the techniques described herein.

The high-density precision coil is formed to have a first distance 1614 between a high-aspect ratio electroplated structure of the first conductor layer 1602a and a high-aspect ratio electroplated structure of the second conductor layer 1602b. For various embodiments, the first distance 1614 is less than 0.020 millimeters. For another embodiment, the first distance 1614 is 0.010 millimeters. The high-density precision coil is formed to have a second distance 1616 between a surface 1618 of the second dielectric layer 1610 and a high-aspect ratio electroplated structure of the first conductor layer 1602a. For various embodiments, the second distance 1616 is less than 0.010 millimeters. For some embodiments, the second distance 1616 is 0.005 millimeters. For some embodiments, the second distance 1616 can be the starting gap minus the final desired gap divided by 2. The high-density precision coil is formed to have a third distance 1620 between a high-aspect ratio electroplated structure of the first conductor layer 1602a and a surface of the first dielectric layer 1622. For various embodiments, the third distance 1620 is less than 0.020 millimeters. For some embodiments, the third distance 1620 is less than 0.015 millimeters. For another embodiment, the third distance 1620 is 0.010 millimeters. For various embodiments, the first dielectric layer is formed on a substrate 1624 using techniques including those described herein. For some embodiments the substrate 1624 is a stainless steel layer. One skilled in the art would understand that the substrate 1624 can be formed other materials including, but not limited to, steel alloys, copper alloys such as bronze, pure copper, nickel alloys, beryllium copper alloys and other metals including those known in the art.

Other advantages of forming devices using the high-aspect ratio electroplated structures as described herein include devices with high structural strength, high reliability, and high heat dissipation capacity. The high structural strength is provided through the ability to form very dense concentration of metal high-aspect ratio electroplated structures on all layers of a device. Further, processes for forming the metal high-aspect ratio electroplated structures described herein provide cross directional alignment of the structures from layer to layer adding to the high structural strength. High structural strength of the devices formed using processes for forming the metal high-aspect ratio electroplated structures described herein is also as a result of good adhesion of the dielectric layer material, such as the photosensitive polyimide layers, to the structures. For some embodiments, the high-aspect ratio electroplated structures formed using techniques described herein are coated with a non-magnetic nickel layer to increase adhesion of the dielectric layer. This would further increase the high structural strength of the final device formed using the high-aspect ratio electroplated structures described herein.

The reliability of the devices formed using the high-aspect ratio electroplated structures described herein is also high because of the use of high reliability materials, such as photosensitive polyimide for the dielectric layers, which provides robust electrical performance. Using the techniques described herein, provide the capability to form devices with less dielectric material and reduce the overall thickness of the formed device. Thus, the heat dissipation is increased through increased thermal conductivity over devices using current process technologies.

Figure 16A:
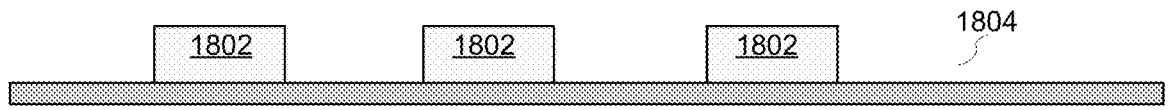
FIG. 16a-c illustrate a process for forming high-aspect ratio electroplated structures according to another embodiment.
Figure 16B:
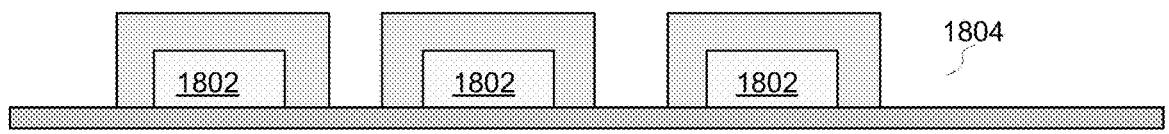
Figure 16C:
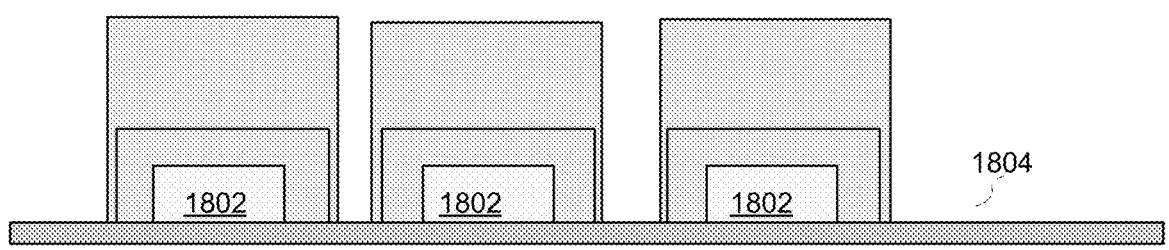

FIGS. 16*a-c* illustrate a process for forming high-aspect ratio electroplated structures according to another embodiment. FIG. 16*a* illustrates traces 1802 formed on a substrate 1804 using a subtractive etch. According to some embodiments, a metal layer formed over substrate 1804. A photoresist layer is formed over a metal layer using techniques including those known in the art. For some embodiments, the photoresist layer is a photosensitive polyimide deposited over the metal layer in a liquid form. The photoresist is pattered and developed using techniques including those known in the art. The metal layer is then etched using techniques including those known in the art. After the etching process, the traces 1802 are formed.

FIG. 16*b* illustrates the formation of the high-aspect ratio electroplated structures using a conformal plating process, such as those described herein. FIG. 16*c* illustrates the formation of the high-aspect ratio electroplated structures using a crown plating process, such as those described herein. For various embodiments, the high-aspect ratio electroplated structures are formed without using the conformal plating process, such as that described with reference to FIG. 16*b*. Instead, a crown plating process, such as that described with reference to FIG. 16*c*, is used after the formation of traces 1802 as illustrated in FIG. 16*a*.

Figure 17:
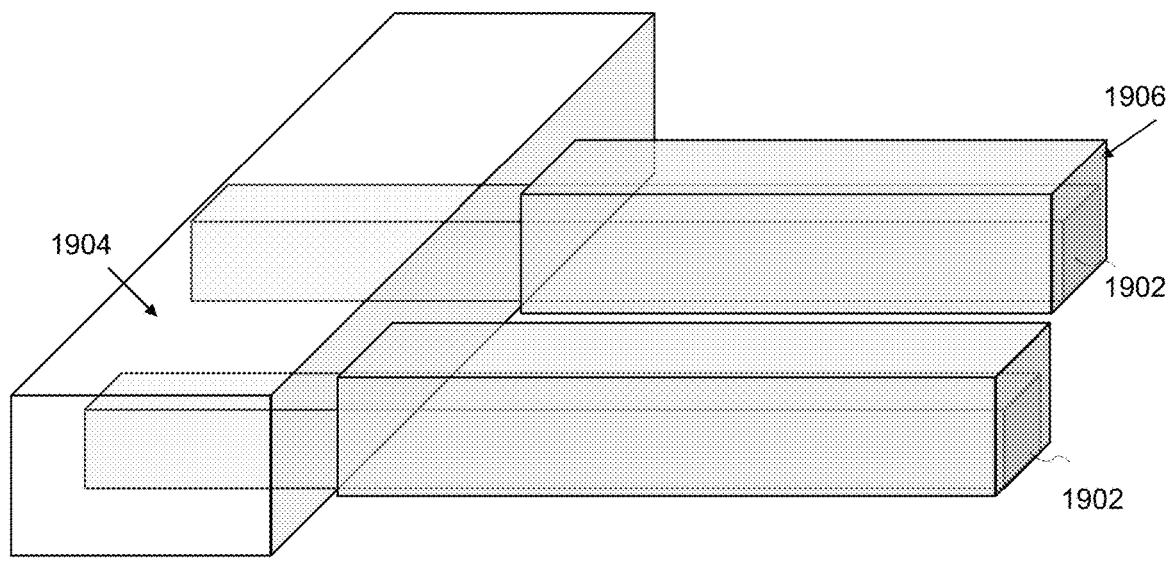
FIG. 17 illustrates a selective formation of high-aspect ratio electroplated structures according to an embodiment.
Figure 18:
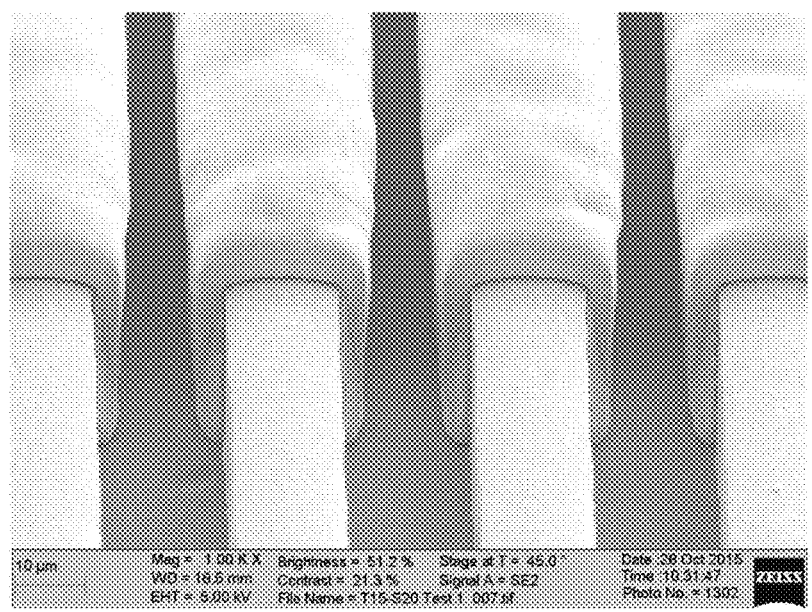
FIG. 18 illustrates a perspective view of high-aspect ratio electroplated structures according to an embodiment formed with the metal crown portion formed selectively on traces.

FIG. 17 illustrates a selective formation of high-aspect ratio electroplated structures according to an embodiment. Once traces 1902 are formed using techniques including those described herein, a photoresist layer 1904 is formed over a section of one or more of the formed traces 1902. The photoresist layer 1904 can be a photosensitive polyimide and deposited and formed using techniques including those described herein. The metal crown 1906 is formed on the traces 1902 using one or both of a conformal plating process and a crown plating process as described herein. FIG. 18 illustrates a perspective view of high-aspect ratio electroplated structures according to an embodiment formed with the metal crown portion formed selectively on traces. Selective formation of a metal crown portion on traces, according to some embodiments, is used to improve structural properties of the high-aspect ratio electroplated structures, improve electrical performance of the high-aspect ratio electroplated structures, improve heat transfer properties, and to meet custom dimensional requirements for devices formed using the high-aspect ratio electroplated structures. Examples of electrical performance improvements include, but are not limited to, capacitance, inductance, and resistance properties of a high-aspect ratio electroplated structure. Further, the selective formation of a metal crown portion on a trace can be used to tune mechanical or electrical properties of a circuit formed using high-aspect ratio electroplated structures.

Figure 19:
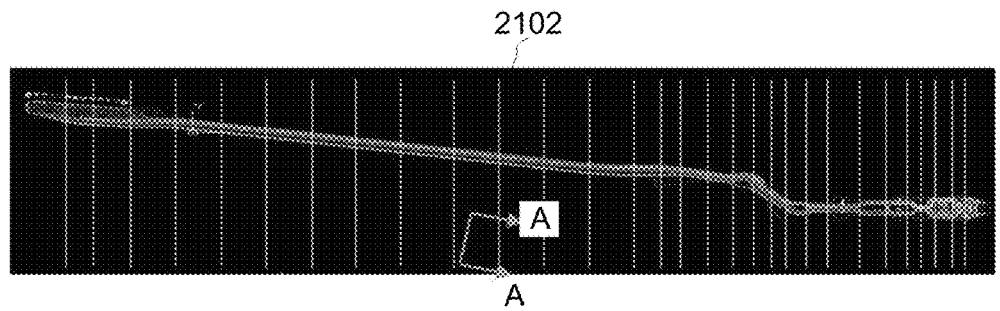
FIG. 19 illustrates a hard drive disk suspension flexure that includes high-aspect ratio electroplated structures according to an embodiment.
Figure 20:
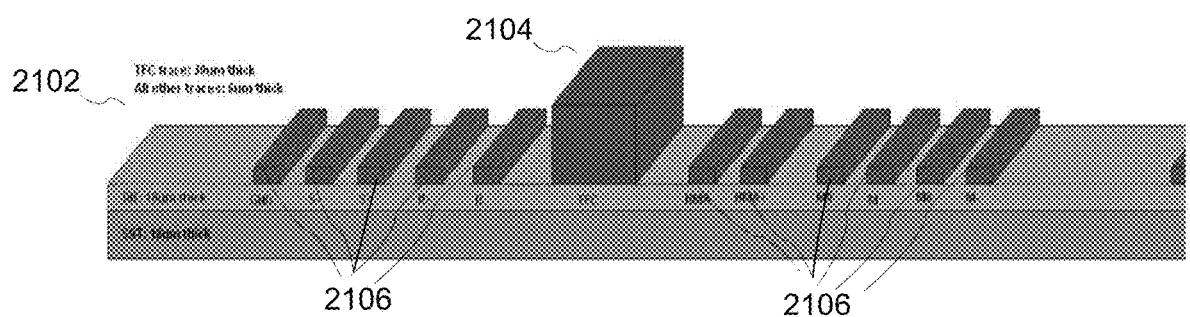
FIG. 20 illustrates a cross sectional view of the hard disk drive suspension flexure illustrated in FIG. 19.

FIG. 19 illustrates a hard drive disk suspension flexure 2102 that includes high-aspect ratio electroplated structures, according to an embodiment, formed using selective formation as described herein. FIG. 20 illustrates a cross sectional view of the hard disk drive suspension flexure illustrated in FIG. 19, taken along line A-A. The cross section of the flexure 2102 includes a high-aspect ratio electroplated structure 2104 and traces 2106. The high-aspect ratio electroplated structure 2104 formed using a selective formation technique as described herein. Forming a high-aspect ratio electroplated structure 2104 to use as a conductor in predetermined regions of a flexure can achieve a reduction in DC resistance. This allows fine lines and spaces where needed on the flexure while meeting design requirements for DC resistance and improve electrical performance of a flexure.

FIGS. 21*a,b* illustrate a process for forming high-aspect ratio electroplated structures according to an embodiment using photoresist during a conformal plating process. FIG. 21*a* illustrates traces 2302 formed on a substrate 2304 using techniques including those described herein. FIG. 21*b* illustrates the forming of the high-aspect ratio electroplated structures using a plating process as described herein. Photoresist portions 2306 are formed over the substrate 2304 using deposition and patterning techniques including those described herein. Once the photoresist portions 2306 are formed one or both of a conformal plating process and a crown plating process is performed to form the metal portion 2308 on the traces 2302. The photoresist portions 2306 can be used to better define spacing between the high-aspect ratio electroplated structures.

FIG. 22 illustrates exemplary chemistries used for a process to form the initial metal layer, a standard/conformal plating process, and a crown plating process according to various embodiments.

Figure 23:
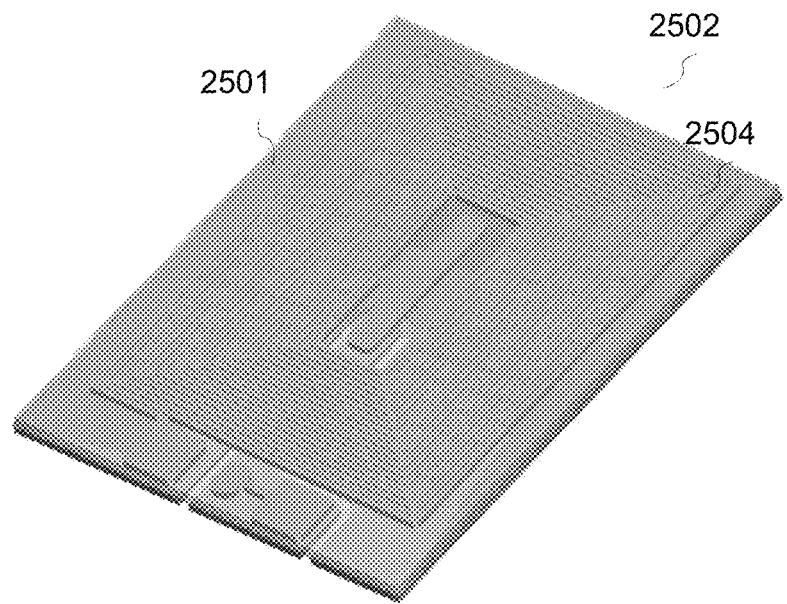
FIG. 23 illustrates a perspective view of a top surface of an inductive coupling coil formed from high-aspect ratio electroplated structures according to an embodiment.

FIG. 23 illustrates a perspective view of a top surface 2501 of an inductive coupling coil 2502 formed from high-aspect ratio electroplated structures 2504 according to an embodiment with an integrated tuning capacitor. The use of high-aspect ratio electroplated structures to form the inductive coupling coil reduces the footprint of the inductive coupling coil compared with inductive coupling coils using current technologies to form the coil. This enables the inductive coupling coil 2502 to be used in applications that where space is limited. Further, the use of a capacitor integrated into the inductive coupling coil further reduces the footprint of the inductive coupling coil because extra space requirements are not needed to accommodate a discrete capacitor, such as a surface-mount technology ("SMT") capacitor.

Figure 24:
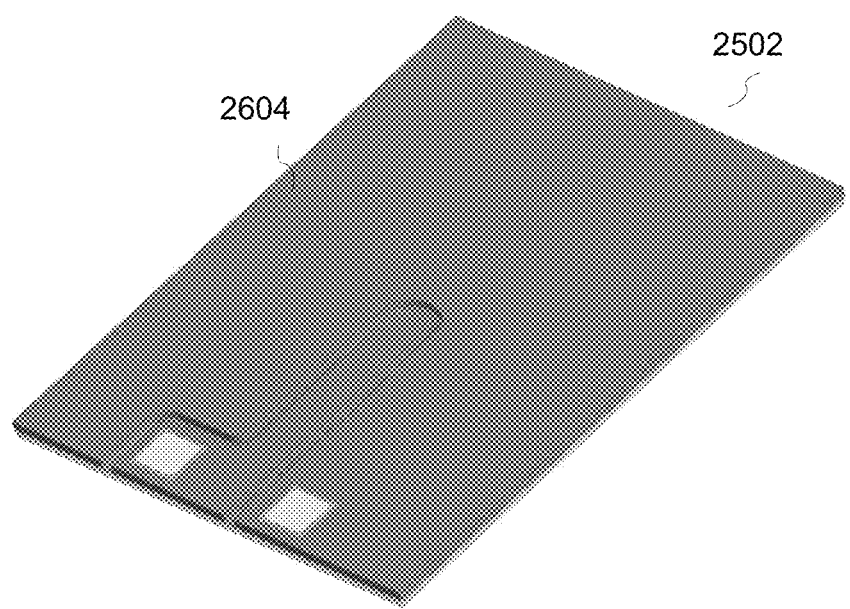
FIG. 24 illustrates a perspective view of a back surface of the embodiment of the inductive coupling coil illustrated in FIG. 21.
Figure 25:
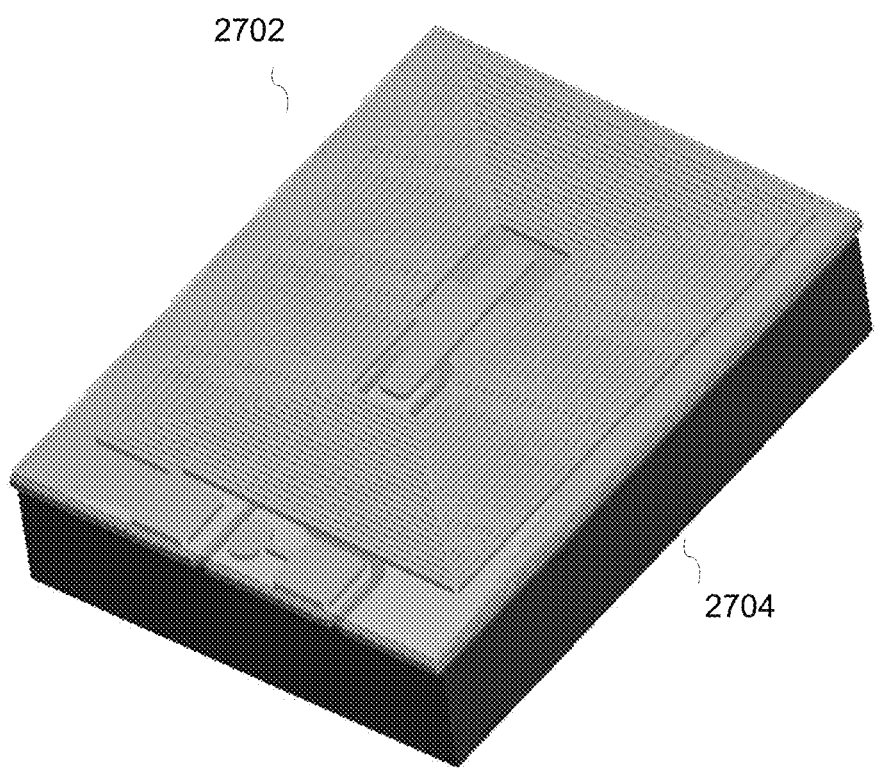
FIG. 25 illustrates a perspective view of a top surface of an inductive coupling coil 2502 according to an embodiment coupled with a radio frequency identification chip.

FIG. 24 illustrates a perspective view of a back surface 2604 of the embodiment of the inductive coupling coil 2502 illustrated in FIG. 23. FIG. 25 illustrates a perspective view of a top surface of an inductive coupling coil 2502 according to an embodiment coupled with a radio frequency identification ("RFID") chip 2704.

Figure 26A:
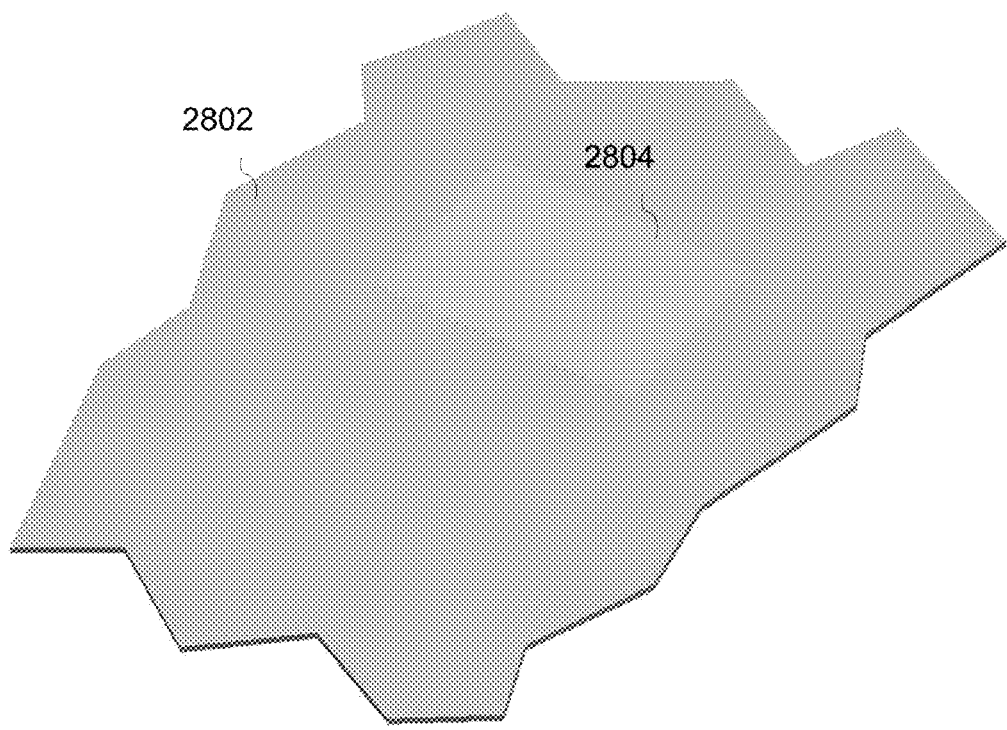
FIGS. 26a-j illustrate a method of forming an inductive coupling coil formed from high-aspect ratio electroplated structures according to an embodiment.

FIGS. 26*a-j* illustrate a method of forming an inductive coupling coil 2502 formed from high-aspect ratio electroplated structures 2504 according to an embodiment. According to various embodiments the inductive coupling coil includes an integrated tuning capacitor. FIG. 26*a* illustrates a substrate 2802 formed using techniques including those known in the art. For some embodiments, the substrate 2802 is formed of stainless steel. Other materials that can be used to for a substrate include, but are not limited to, steel alloys, copper, copper alloys, aluminum, non-conductor materials that can be metalized using techniques including plasma vapor deposition, chemical vapor deposition, and electroless chemical deposition. A shadow mask 2804 is formed over the substrate 2802. The shadow mask 2804, according some embodiments, is a high-K dielectric. Examples of high-K dielectrics that may be used include, but are not limited to, titanium dioxide (TiO2), niobium oxide (Nb2O5), tantalum oxide (TaO), aluminum oxide (Al2O3), silicon dioxide (SiO2), polyimide, SU-8, KMPR, and other high permittivity dielectric materials. According to some embodiments, the shadow mask 2804 is formed using a sputter process using techniques including those known in the art. The shadow mask 2804, for some embodiments, is formed to have a thickness in a range including 500 to 1000 Angstroms. For other embodiments, the shadow mask 2804 is formed using screen printing of a high-permittivity ink. An example of a high-permittivity ink includes an ink includes an epoxy loaded with particles made from one or more of titanium dioxide (TiO2), niobium oxide (Nb2O5), tantalum oxide (TaO), aluminum oxide (Al2O3), silicon dioxide (SiO2), polyimide, and other high-permittivity dielectric materials. For yet other embodiments, the shadow mask 2804 is formed using a slot die application of a photo imageable dielectric doped with a high-K filler. An example of a high-K filler includes zirconium dioxide (ZrO2).

Figure 26B:
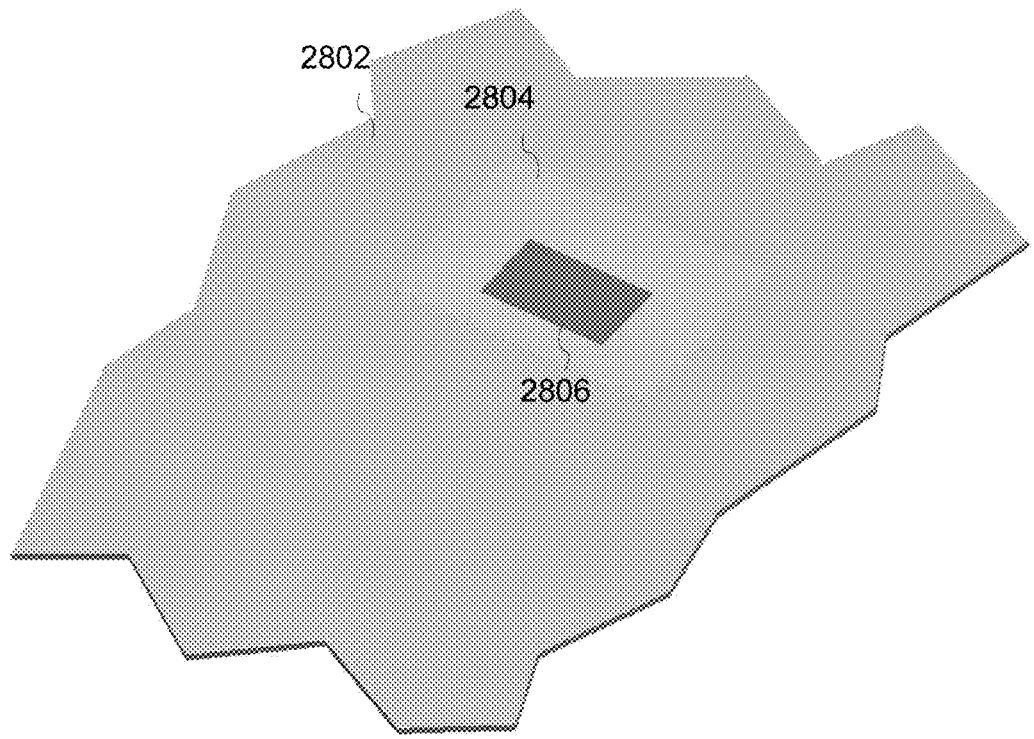

FIG. 26*b* illustrates a metallic capacitor plate 2806 formed over the shadow mask 2804. The metallic capacitor plate 2806 and the substrate 2802 form the two capacitor plates of the integrated capacitor. The thickness of the shadow mask 2804 can be used to set the effective capacitance of the integrated capacitor. Further, the purity of the high-K dielectric used to form the shadow mask 2804 can be used to set the effective capacitance of the integrated capacitor. The surface area of the metallic capacitor plate 2806 can also be used to set the effective capacitance of the integrated capacitor.

Figure 26C:
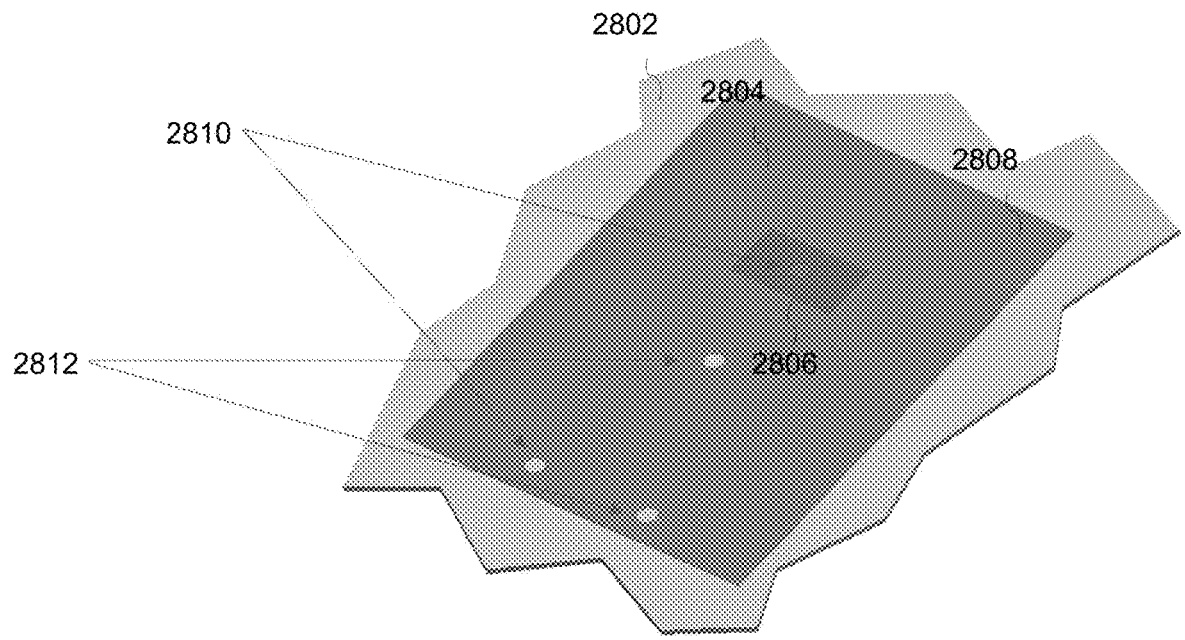

FIG. 26*c* illustrates a base dielectric layer 2808 formed over the shadow mask 2804, the metallic capacitor plate 2806, and at least a portion of the substrate 2802. According to some embodiments, the base dielectric layer 2808 is formed by depositing a dielectric material, patterning the dielectric material, and curing the dielectric material using techniques including those known in the art. Examples of dielectric material that can be used include, but are not limited to, polyimide, SU-8, KMPR, and a hard baked photoresists—such as that sold by IBM®. The base dielectric layer 2808 may also be patterned or etch to form vias. For example, jumper vias 2812 and shunt capacitor vias 2810 are formed in the base dielectric layer 2808. The shunt capacitor vias 2810 are formed to interconnect the integrated capacitor to the rest of the circuit to be formed. Similarly, the jumper vias 2812 are used to interconnect circuit elements to be formed to the substrate 2802.

Figure 26D:
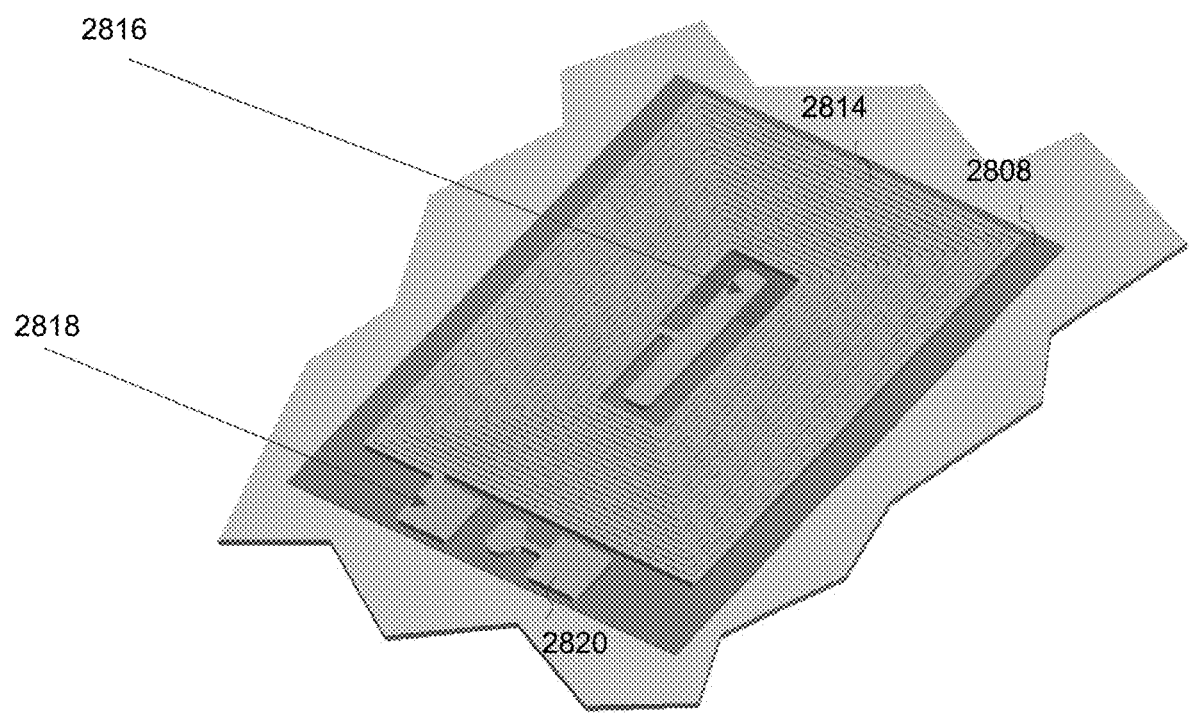

FIG. 26*d* illustrates a coil 2814 formed over the base dielectric layer 2808 using high-aspect ratio electroplated structures to form the coil using techniques including those described herein. For some embodiments, the coil 2814 is a single layer coil. The coil 2814 includes a center connect portion 2816 that connects to one of the shunt capacitor vias 2810 and one of the jumper vias 2812 that is in electrical contact with the metallic capacitor plate 2806 of the integrated capacitor. The coil 2814 also includes a capacitor connection portion 2818 to connect the coil 2814 to the other one of the shunt capacitor vias 2810 that is in electrical contact with the substrate 2802 configured as a lower plate of the integrated capacitor. According various embodiments, a terminal pad 2820 is formed of high-aspect ratio electroplated structures using techniques including those described herein. The terminal pad 2820 can be formed during the same processes used form the coil 2814.

Figure 26E:
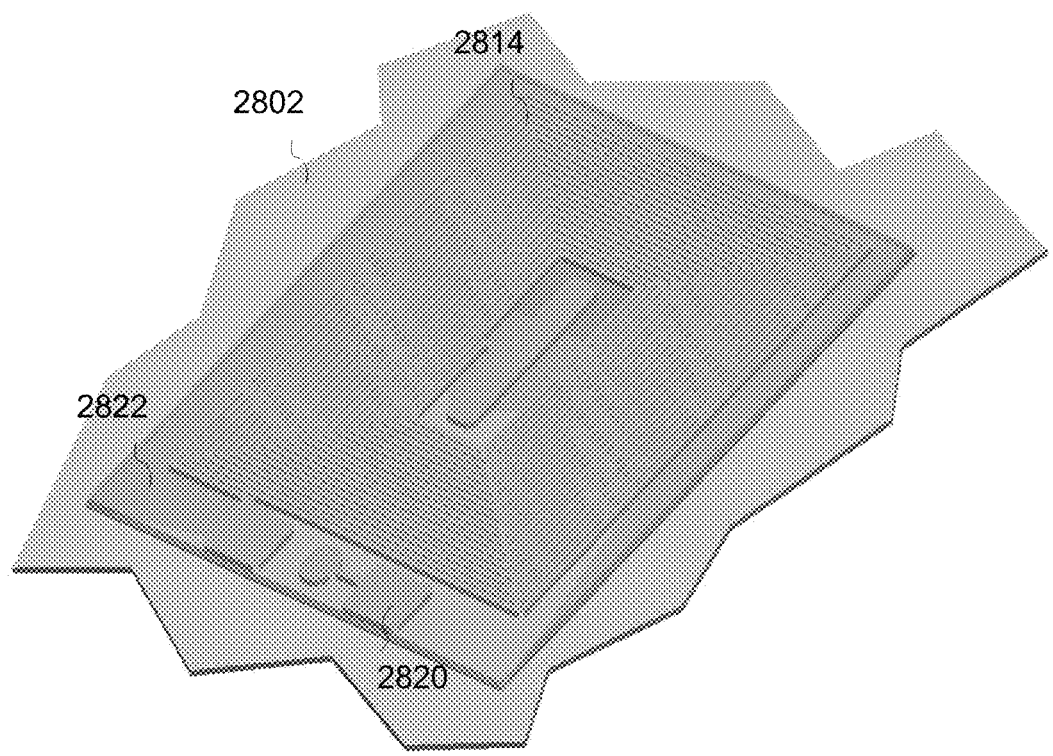

FIG. 26*e* illustrates a covercoat 2822 formed over the coil 2814, the terminal pad 2820, and the base dielectric layer 2808 to encase the coil side of the inductive coupling coil. The covercoat 2822 is formed using deposition, etching, and patterning steps including those known in the art. The covercoat 2822, for example, can be formed from polyimide solder mask, SU-8, KMPR, or epoxy.

Figure 26F:
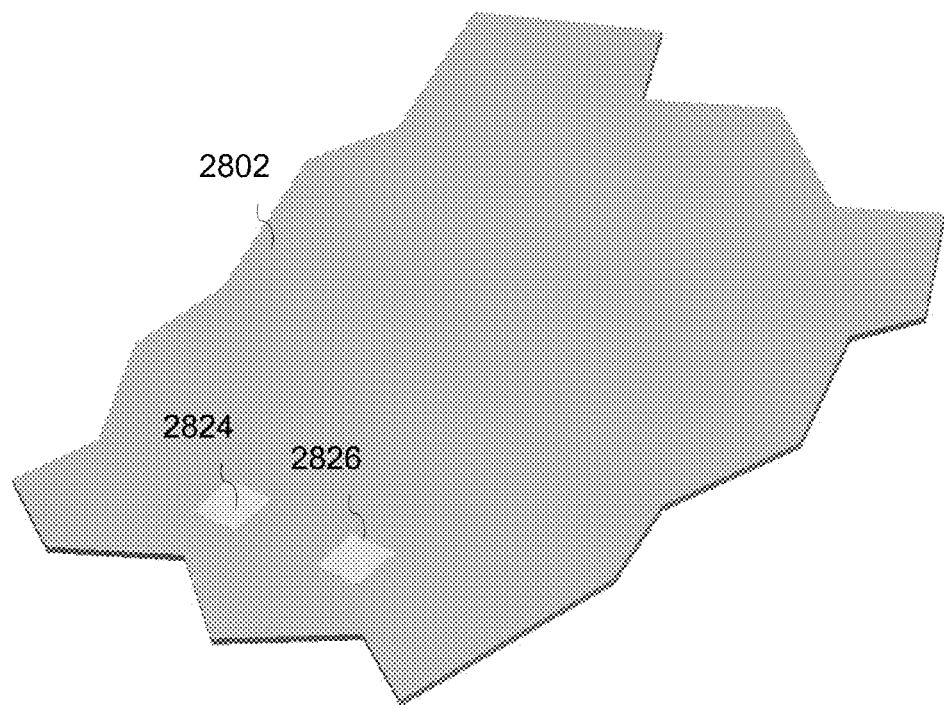

FIG. 26*f* illustrates the backside of the inductive coupling coil being formed according to an embodiment. At least a first solder pad 2824 and a second solder pad 2826 are formed on as side opposite of the substrate 2802 from the coil 2814. According to some embodiments, the first solder pad 2824 and the second solder pad 2826 are formed of gold using deposition and pattering techniques including those known in the art. The first solder pad 2824 and the second solder pad 2826 are formed to provide electrical contacts for attaching an integrated circuit chip, such as an RFID chip, to the substrate 2802.

Figure 26G:
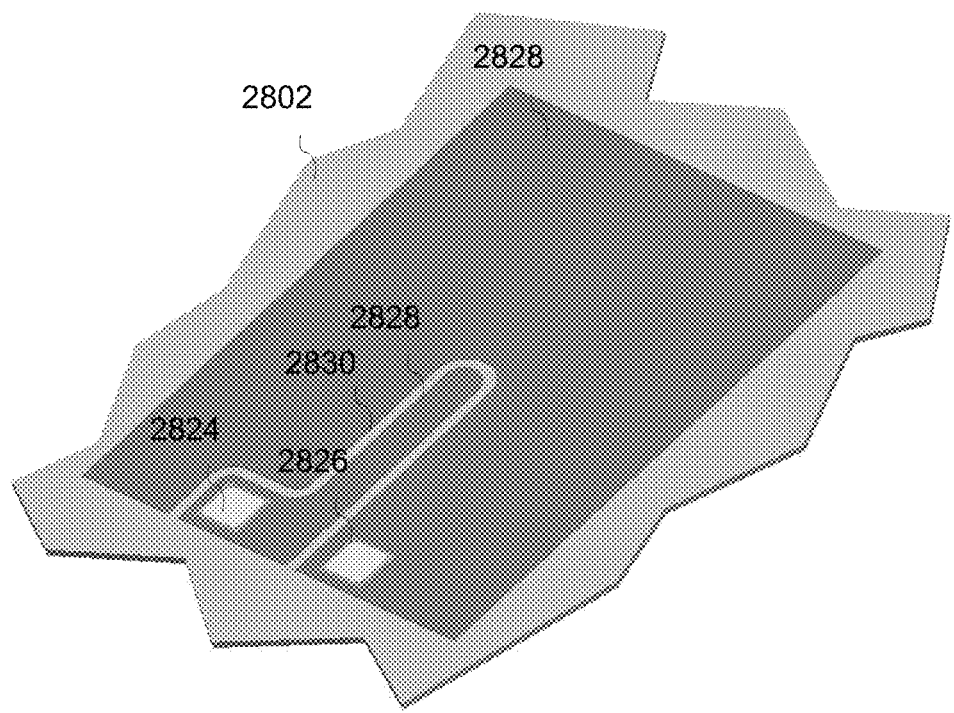

FIG. 26*g* illustrates a backside dielectric layer 2828 formed on the backside of the inductive coupling coil being formed according to an embodiment. The method of forming an inductive coupling coil may optionally include forming a backside dielectric layer 2828 on the substrate 2802. The backside dielectric layer 2828 is formed using techniques similar to those to form the base dielectric layer 2808. The backside dielectric layer 2828, according to some embodiments, is patterned to prevent a short circuit between the substrate 2802 and an attached integrated circuit chip. The backside dielectric layer 2828, according to various embodiments, is patterned to provide a jumper pattern 2830 for the substrate 2802 to be etched to form a jumper path in a subsequent step. Other patterns in the backside dielectric can be formed to also etch other portion of the substrate 2802.

Figure 26H:
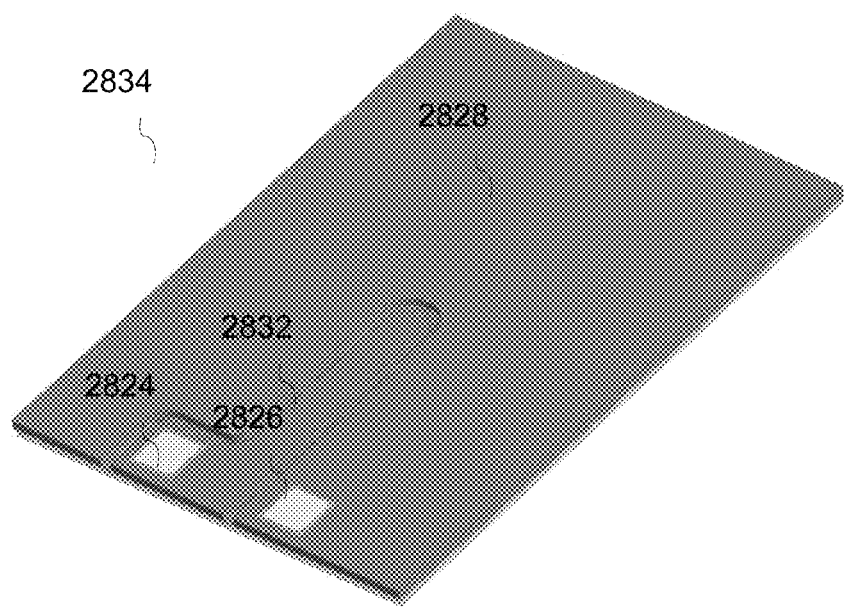
Figure 26I:
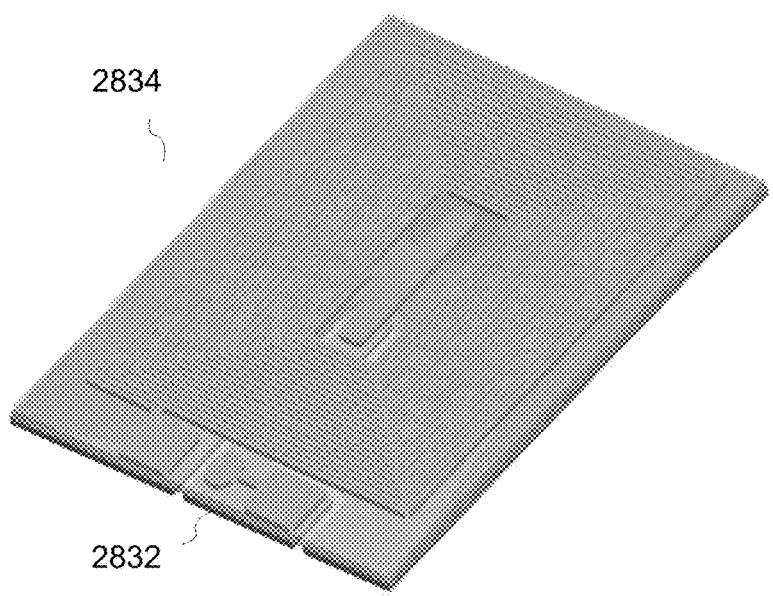

FIG. 26*h* illustrates the inductive coupling coil 2834, according to an embodiment, formed into its final shape. The portions of the substrate 2802 not covered by the backside dielectric layer 2828 are etched. Such a portion etched includes the jumper pattern 2830 to form a jumper path 2832. The etching is performed using techniques including those known in the art. One skilled in the art would understand that other portions of the substrate 2802 can be etched to form other conductive paths similar to the jumper path 2832. FIG. 26*i* illustrates the coil side of the inductive coupling coil 2834, according to an embodiment, that includes a jumper path 2832.

Figure 26J:
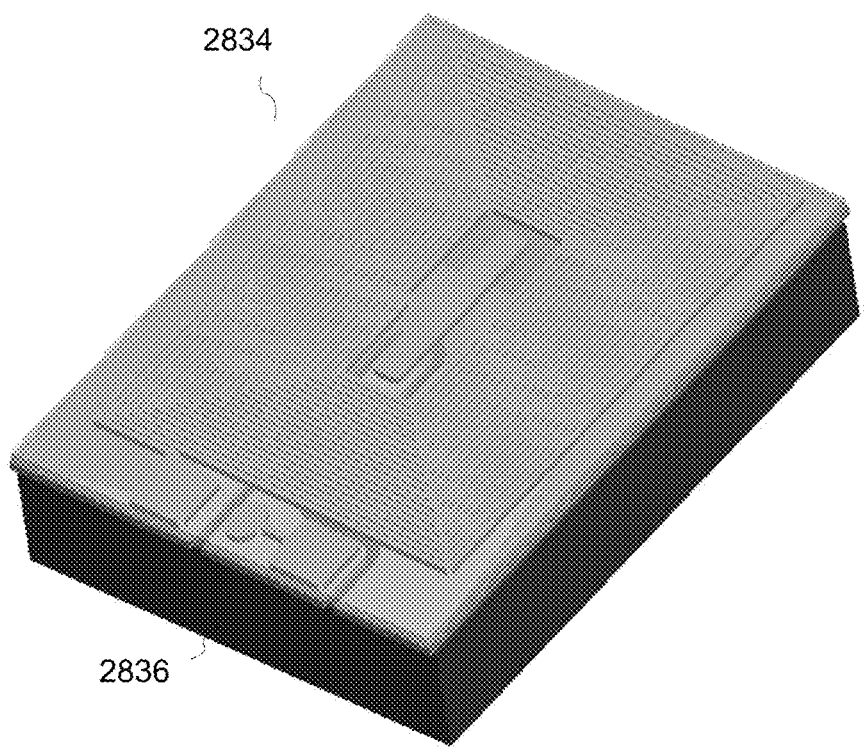

FIG. 26*j* illustrates the coil side of the inductive coupling coil 2834, according to an embodiment, that includes an integrate chip 2836 attached to the backside of the inductive coil. The method for forming the inductive coupling coil 2834 may optionally include steps to attach an integrated chip 2836, such as an RFID chip, to the inductive coupling coil 2834 using techniques including those known in the art. Such an integrated chip 2836 is attached using an adhesive including, but not limited to, conductive epoxy, solder, and other materials used to connect electrical connections.

The integration of a capacitor into devices that include high-aspect ratio electroplated structures provides the ability to take the advantage of the small footprint requirements enabled by the use high-aspect ratio electroplated structures. Other embodiments of the inductive coupling coil include inductive coupling coils that have multiple integrated capacitors. The integrated capacitors can be connected in parallel or in series as is known in the art. Other devices including high-aspect ratio electroplated structures that could also include integrated capacitors include, but are not limited to, a buck transform, signal conditioning devices, tuning devices, and other devices that would include one or more inductors and one or more capacitors.

The high-aspect ratio electroplated structures according to embodiments described herein can be used to form a device or form part of a device to optimize performance and achieve small footprints. Such devices include, but are not limited to, power converters (e.g., Buck transformer, voltage divider, AC transformer), actuators (e.g. linear, VCM), antennas (e.g., RFID, wireless power transfer for batter charging, and security chips), wireless passive coils, cellphone and medical device battery with recharging, proximity sensors, pressure sensors, non-contact connector, micromotor, micro-fluidics, cooling/heat-sink on a package, a long narrow flexible circuit with air core capacitance and inductance (e.g., for a catheter), interdigitated acoustic wave transducer, haptic vibrator, implantables (e.g., pacemaker, stimulators, bone growth device), magnetic resonance imaging ("MRI") device for procedures (e.g., esophageal, colonoscopy), beyond haptic (e.g., clothing, gloves), surface coated for detection/filter release, security systems, high energy density battery, inductive heating device (for small localized area), magnetic field for fluid/drug dispersion and dose delivery through channel pulses, tracking and information device (e.g., agriculture, food, valuables), credit card security, sound systems (e.g., speaker coils, recharging mechanism in headphones, earbuds), thermal transfers, mechanical-thermal conductive seal, energy harvester, and interlocking shapes (similar to hook and loop fasteners). In addition, the high-aspect ratio electroplated structures as described herein can used to form high bandwidth, low impedance interconnects. The use of the high-aspect ratio electroplated structures in the interconnects can be used to improve electrical characteristics (e.g., resistance, inductance, capacitance), improve heat transfer properties, and customize dimensional requirements (thickness control). The interconnects including the high-aspect ratio electroplated structures as described herein can be used to tune the bandwidth of one or more circuits for a given frequency range. Other interconnect applications including the high-aspect ratio electroplated structures can integrate one or more circuits of varying currents (signal and power for example). The use of high-aspect ratio electroplated structures allows circuits having different cross sections, allows some to have more current carrying capability, to be fabricated together in close proximity to maintain a condensed overall package size. The high-aspect ratio electroplated structures can also be used in interconnects for mechanical purposes. For example, it may be desirable to have some regions of the circuit protrude above others to serve as a mechanical stop, bearing, electrical contact zone, or for added stiffness.

Figure 27:
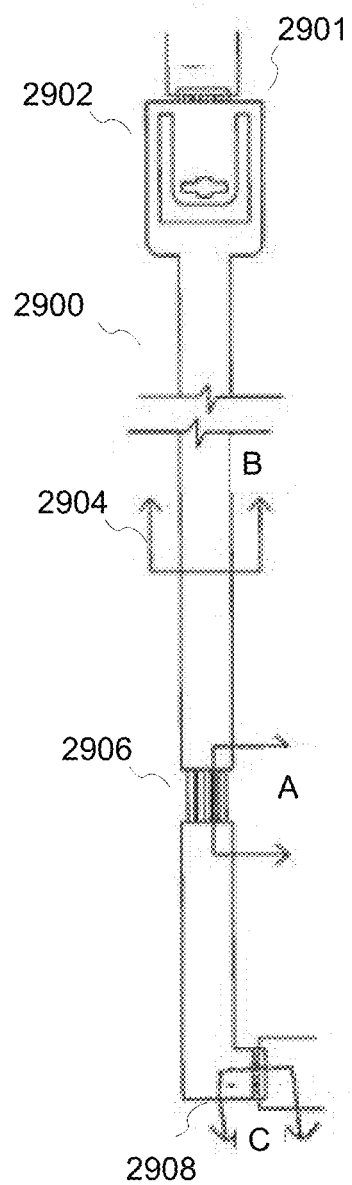
FIG. 27 illustrates plan view of a flexure for a suspension for a hard disk drive including high-aspect ratio electroplated structures according to an embodiment.

FIG. 27 illustrates plan view of a flexure for a suspension for a hard disk drive including high-aspect ratio electroplated structures according to an embodiment. The flexure 2900 includes a distal portion 2901, a gimbal portion 2902, a middle portion 2904, a gap portion 2906, and a proximal portion 2908. The proximal portion 2908 is configured to attached to a baseplate such that the distal portion 2901 extends over spinning disk media. The gimbal portion 2902, according to some embodiments, is configured to include one or more motors, such as a piezoelectric motor, and one or more electrical components, such as a head slider for reading or writing to the disk media, and components for heat-assisted magnetic recording ("HAMR")/thermally-assisted magnetic recording ("TAMR") or microwave assisted magnetic recording ("MAMR"). The one or more motors and one or more electrical components are electrically connected to other circuitry though one or more traces formed on a conductor layer of the flexure that extends from the distal portion 2901 of the flexure 2900 through the middle portion 2904 over a gap portion 2906 and beyond the proximate portion 2908. The gap portion 2906 is a portion of the flexure where the substrate layer, such as a stainless steel layer, is partially of completely removed. Thus, one or more of the traces in the conductor layer of the flexure extend over the gap portion 2906 without any support. One skilled in the art would understand that a flexure may have one or more gap portions 2906 at any location along the flexure.

Figure 28:
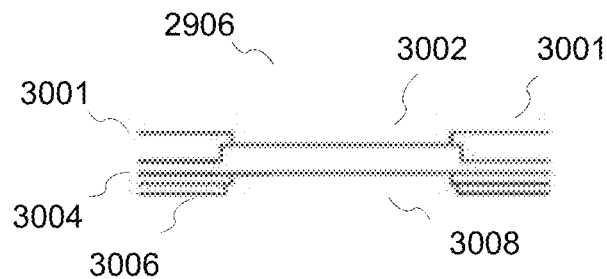
FIG. 28 illustrates a cross-section of a gap portion of a flexure at a gap portion taken along the line A as illustrated in FIG. 27.

FIG. 28 illustrates a cross-section of a gap portion of a flexure at a gap portion taken along the line A as illustrated in FIG. 27. The gap portion 2906 includes a trace 3002 disposed over a dielectric layer 3004. The dielectric layer, such as a polyimide layer, is disposed over a substrate 3006, such as a stainless steel layer. The substrate 3006 and the dielectric layer 3004 define a void 3008 such that the trace 3002 extends over the void 3008. The trace 3002 includes a metal crown portion to form a high-aspect ratio structure. The metal crown portion are formed selectively on trace 3002 using techniques described herein. The metal crown portion are formed on trace 3002 to provide additional strength to span the void 3008 and when used to electrically couple with interconnects at the region of the void 3008.

Figure 29:
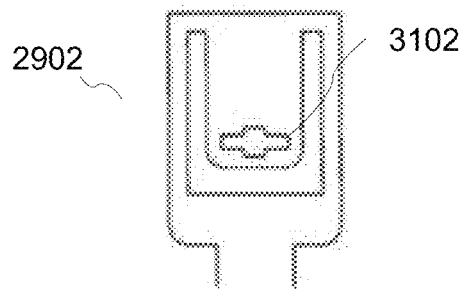
FIG. 29 illustrates a gimbal portion with a mass structure according to an embodiment.

FIG. 29 illustrates a gimbal portion 2902 with a mass structure 3102 according to an embodiment. The mass structure 3102 is formed using high-aspect ratio electroplated structures using techniques described herein. For some embodiments, the mass structure 3102 is used as a weight to tune the resonance of the gimbal portion 2902. Thus, the shape, size, and location of the mass structure 3102 can be determined to tune the resonance of the gimbal portion 2902 to enhance the performance of a hard drive suspension. The processes described herein used to form the high-ratio aspect structures can be used to maintain the size of the high-aspect ratio structures such that the resonance can be fine tuned. Moreover, the processes are capable of forming high-ratio aspect structures at dimensions beyond the capabilities of current lithography process enabling more control over the final structure formed.

Mass structure 3102 can also be configured to use as a mechanical stop. For example, one or more mechanical stops can be formed into any shape to act as a backstop and/or used to align the mounting of a component on the gimbal portion 2902 or other portion of a flexure.

Figure 30:
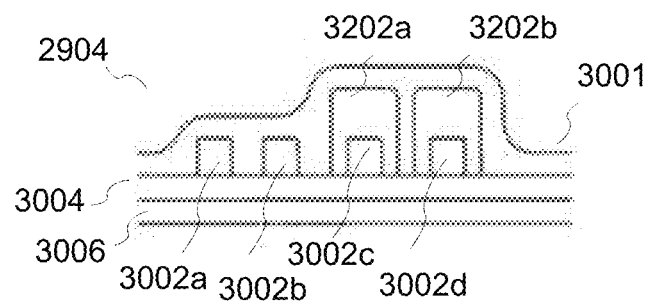
FIG. 30 illustrates a cross section of a proximal portion of a flexure including high-aspect ratio electroplated structures according to an embodiment, taken along line B as illustrated in FIG. 27.

FIG. 30 illustrates a cross section of a proximal portion of a flexure including high-aspect ratio electroplated structures according to an embodiment, taken along line B as illustrated in FIG. 27. The proximal portion 2904 includes a conductor layer including traces 3002*a,b,c,d* disposed over a dielectric layer 3004. The dielectric layer 3004 is disposed over a substrate 3006. A cover layer 3001 is disposed over the conductor layer and the dielectric layer. The conductor layer includes conventional traces 3002*a,b* and traces 3002*c,d* formed with at least a portion of the traces including a metal crown portion 3202*a,b* to form a high-aspect ratio electroplated structure using techniques described herein. One or more portions of traces 3002*a,b,c,d* can be formed to include metal crown portions 3202*a,b* to tune the impedance of each trace. For example, the resistance of the trace can be tuned as needed to meet desired performance characteristics. Another example, include using the metal crown portion to tune impedance by closing the distance between adjacent traces 3002*a,b,c,d*.

Figure 31:
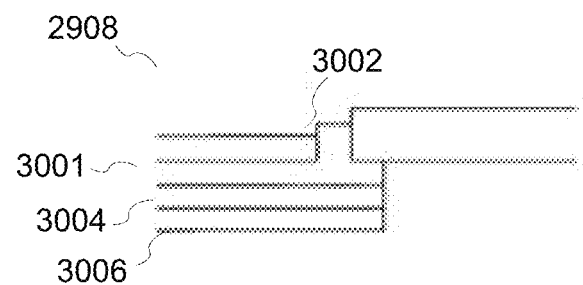
FIG. 31 illustrates a cross section of a proximate portion of a flexure including high-aspect ratio structures according to an embodiment, taken along line C as illustrated in FIG. 27.

FIG. 31 illustrates a cross section of a proximate portion of a flexure including high-aspect ratio structures according to an embodiment, taken along line C as illustrated in FIG. 27. The proximate portion of the flexure includes a conductor layer including at least a trace 3002 disposed over a dielectric layer 3004. The dielectric layer 3004 disposed on the substrate 3008. Further, a cover layer 3001 is disposed over the formed to include a metal crown portion to form a high-aspect ratio electroplated structure using techniques described herein. The trace 3002 is configured as a high-aspect ratio structure to match the impedance of the trace with a terminating connector and to provide strength to the joint electrically coupling the trace 3002 with the connector.

Figure 32:
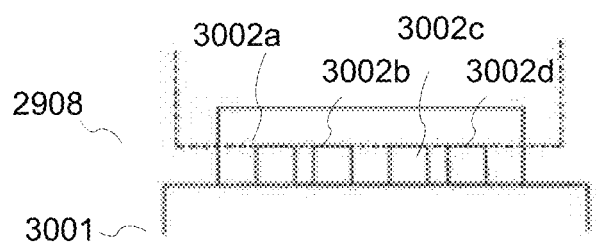
FIG. 32 illustrates a plan view of the proximate portion of the flexure including high-aspect ratio structures according to an embodiment.

FIG. 32 illustrates a plan view of the proximate portion 2908 of the flexure including high-aspect ratio structures according to an embodiment. The use of high-aspect ratio structures as described with reference to use with a flexure are also applicable with other circuit board technologies, for example for use in microcircuits and radio frequency ("RF") circuits.

Figure 33:
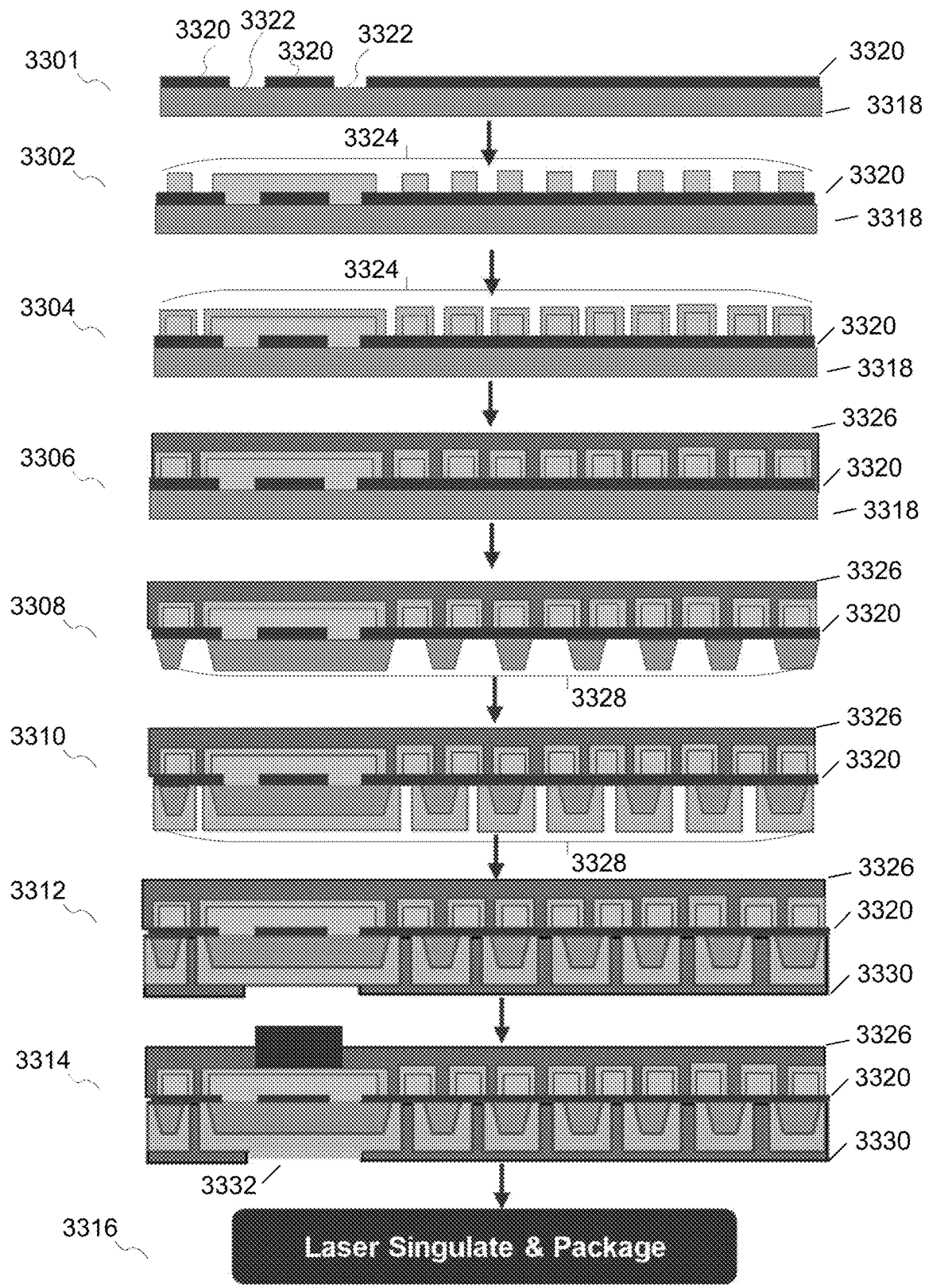
FIG. 33 illustrates a process for forming high-aspect ratio electro plated structures according to an embodiment.

FIG. 33 illustrates a process for forming high-aspect ratio electro plated structures according to an embodiment. As illustrated a copper layer 3318 is used as a substrate. However, other conductive material can be used as a substrate. At 3301, a dielectric layer 3320 is disposed on the copper layer 3318, such as those described herein, is marked and punched. A dielectric layer 3320 can be formed using materials including, but not limited to, photo-imageable or non-photo-imageable materials, polymer, ceramic, and other insulation materials. The copper layer 3318, for some embodiments, is a copper alloy layer such as those described herein. For some embodiments, one or more through holes or vias 3322 are marked and punched in the dielectric layer to expose the copper layer 3318. According to some embodiments, the dielectric layer 3320 is a photo-imagable dielectric material and the one or more through holes or vias 3322 are created using patterning and development techniques including those described herein. Other embodiments include using a laser, drilling, or etching the dielectric layer 3320 to create the one or more through hole or vias 3322. For some embodiments, the copper alloy layer has a thickness in a range including 15 microns to 40 microns. At 3302, traces 3324 or other conductive features are disposed on the dielectric layer 3320 on the side of the dielectric layer opposite from the copper layer 3318. For some embodiments, a seed layer is sputtered to form a pattern on the dielectric layer 3320 using techniques including those described herein. Other embodiments include using electroless plating to form a seed layer. A plating process, such as those described herein, is used to form the one or more traces 3324 and conductive features to a desired thickness using techniques including those described herein.

At 3304, a conformal plating process, such as those described herein, is used to build up the one or more traces and conductive features to increase the thickness or further enhance the shape of the one or more traces and conductive features on the side of the dielectric layer 3320 opposite from the copper layer 3318 using techniques including those described herein. For some embodiments, at 3304, a crown plating process, such as those described herein, is used in addition to a conformal plating process on the side of the dielectric layer 3320 opposite from the copper layer 3318. For some embodiments, a crown plating process is used instead of a conformal plating process.

At 3306, a dielectric layer 3326, such as a covercoat, is disposed on the one or more traces 3324 and conductive features on the side of the dielectric layer opposite from the copper layer 3318 using techniques including those described herein. For some embodiments, a covercoat is not included. For example, the formed one or more traces 3324 and conductive features could be plated with a gold layer. At 3308, the copper layer 3318 is etched to form a pattern using techniques including those described herein. For some embodiments, the copper layer 3318 is etched to form one or more traces 3328 and/or one or more conductive features.

At 3310, a conformal plating process, such as those described herein, is used to build up the one or more traces 3328 and conductive features to increase the thickness or further enhance the shape of the one or more traces 3328 and conductive features formed in the copper layer 3318 using techniques including those described herein. For some embodiments, at 3310, a crown plating process, such as those described herein, is used in addition to a conformal plating process on the copper layer 3318. For some embodiments, a crown plating process is used instead of a conformal plating process.

At 3312, a dielectric layer 3330, such as a covercoat, is disposed on the one or more traces 3328 and conductive features formed from the copper layer 3318 using techniques including those described herein. For some embodiments, a covercoat is not included. For example, the formed one or more traces 3328 and conductive features could be plated with a gold layer. For some embodiments, the process is used to manufacture multiple circuits or devices on a single substrate. At 3316, for such embodiments, the circuits or devices are singulated and optionally may be packaged using techniques including those known in the art. For some embodiments, the circuits and/or devices are singulated using techniques including, but limited to, laser ablation, fracturing, cutting, etching, etc. For some embodiments, the covercoat described herein could be patterned using patterning techniques described herein. For example, the covercoat is applied in a blanket layer. According to some embodiments, the covercoat is applied using a slot die coat to apply a photoimagable dielectric material. Other techniques such as a roller coating, spray coating, dry film lamination or other known methods for applying a photoimageable or non-photoimageable material could be used. If the material is non-photoimagable then other methods could be used to pattern it (e.g. laser or etching). For some embodiments, one or both dielectric layers/covercoats can be formed to have a surface finish, for example to aid attachment to other structures or substrates. For some embodiments, a surface finish is formed on a dielectric layers/covercoats by texturing or patterning the dielectric layers/covercoats.

At 3314, for some embodiments, a terminal pad 3332, such as a nickel terminal plated with a gold layer can be formed on the substrate 3318 using electroless plating and can be provided with solder. According to some embodiments, a surface finish formed on an exposed copper layer disposed on the top side and/or bottom side is plated using electroless or electrolytic plating of nickel, gold, or other industry standard surface finishes. In addition, solder can be applied to these areas.

Figure 34:
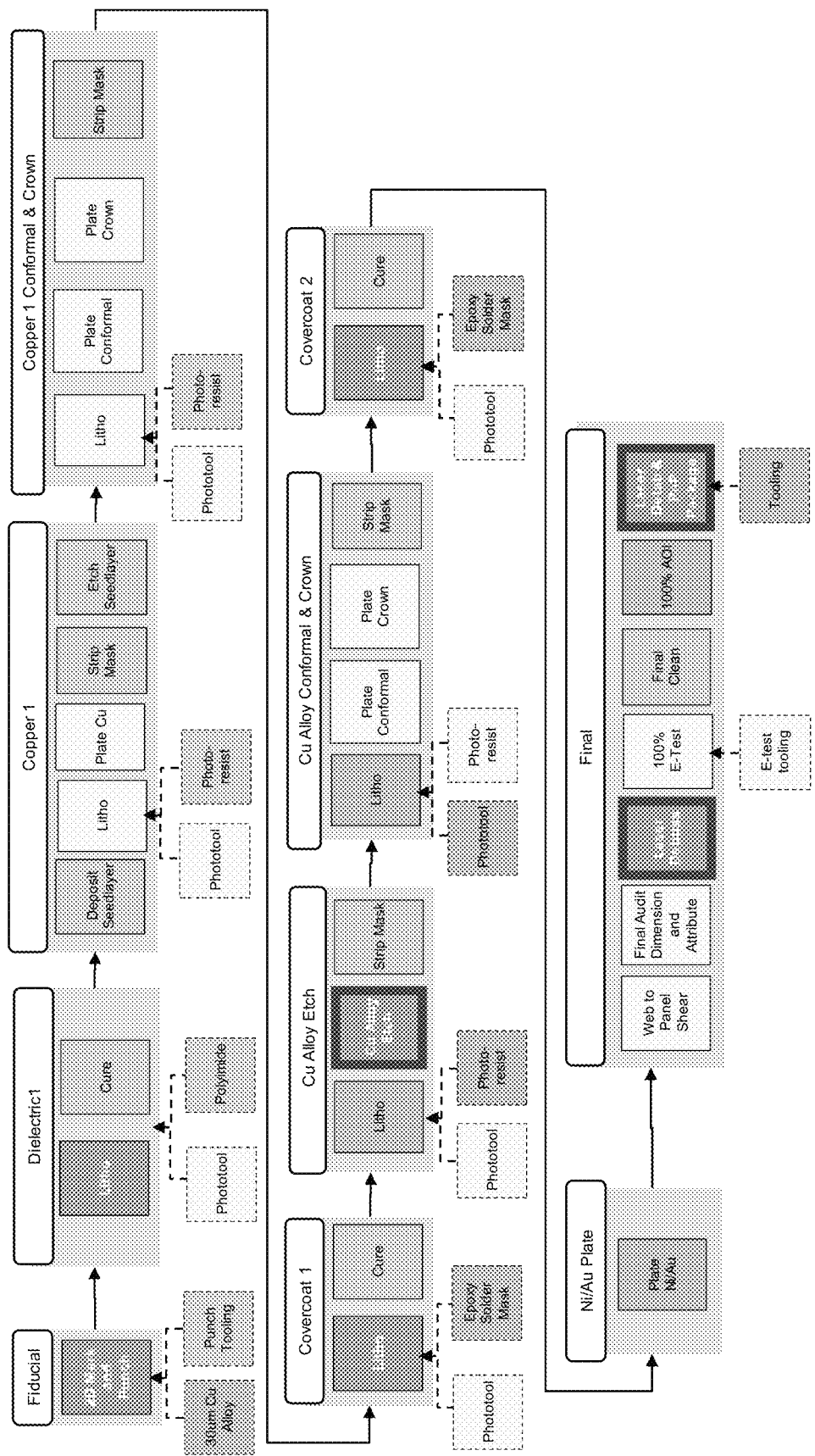
FIG. 34 illustrates a more detailed process similar to the type described with reference to FIG. 33.

FIG. 34 illustrates a more detailed process similar to the type described with reference to FIG. 33 used to form high-aspect ratio electro plated structures according to some embodiments.

Figure 35:
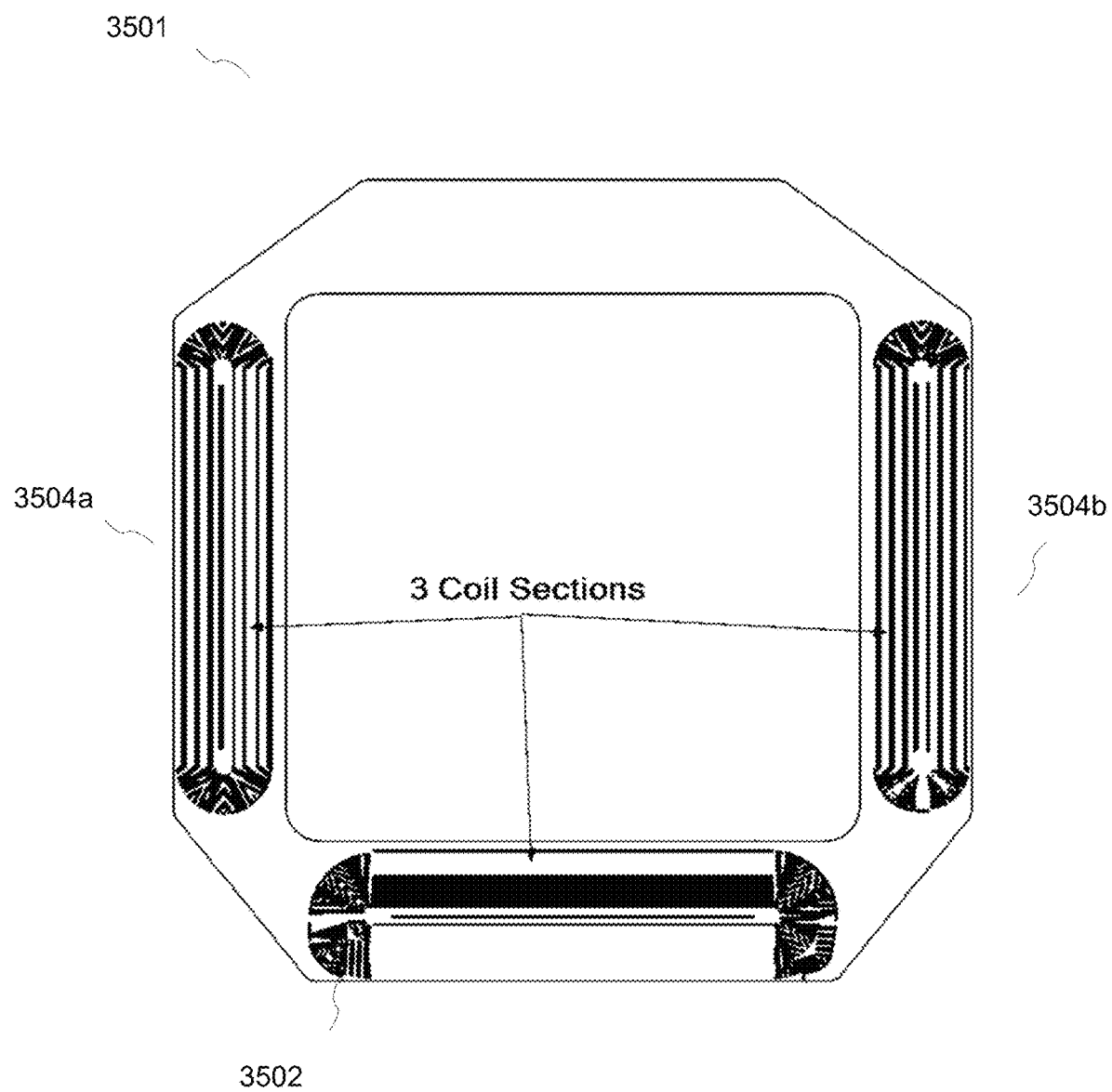
FIG. 35 illustrates a coil according to an embodiment fabricated using processes described herein.

FIG. 35 illustrates a coil fabricated using processes described herein. The coil 3501 includes multiple coil sections, for example three or more, electrically coupled to form the coil 3501. For some embodiments, such as that illustrated in FIG. 35, the number of turns in the outer coil sections 3504 is the same as the inner coil section 3502 between the two outer coil sections 3504. For some embodiments, the inner coil section 3402 includes more turns than the outer coil sections 3504. Other embodiments, include multiple coil sections with a subset of the multiple coil sections electrically coupled, for example, with reference to FIG. 35, two of the multiple coil sections are electrically coupled and the remaining coil section is not electrical coupled with the other two coil sections. Thus, any combination of any number of coil sections can be included with any number of the coil sections electrically coupled with any of the other coil sections.

A plurality of layers including one or more of any of traces and conductive features manufactured using techniques described herein can be formed by stacking each layer and connections between each layer can be made with vias through the layers that are filled with conductive materials such as conductive adhesive.

According to some embodiments, the processes described herein are used to form a coil incorporated with other circuit components, for example, resistance temperature detectors (RTD), strain gauges and other sensors.

Figure 36:
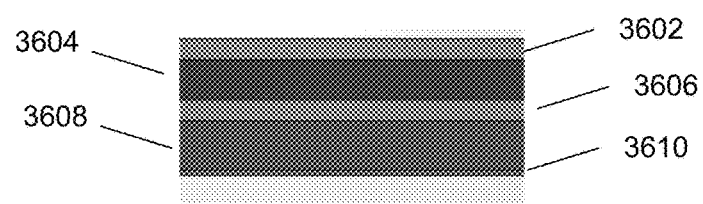
FIG. 36 illustrates a cross section of the coil illustrated in FIG. 37.
Figure 37:
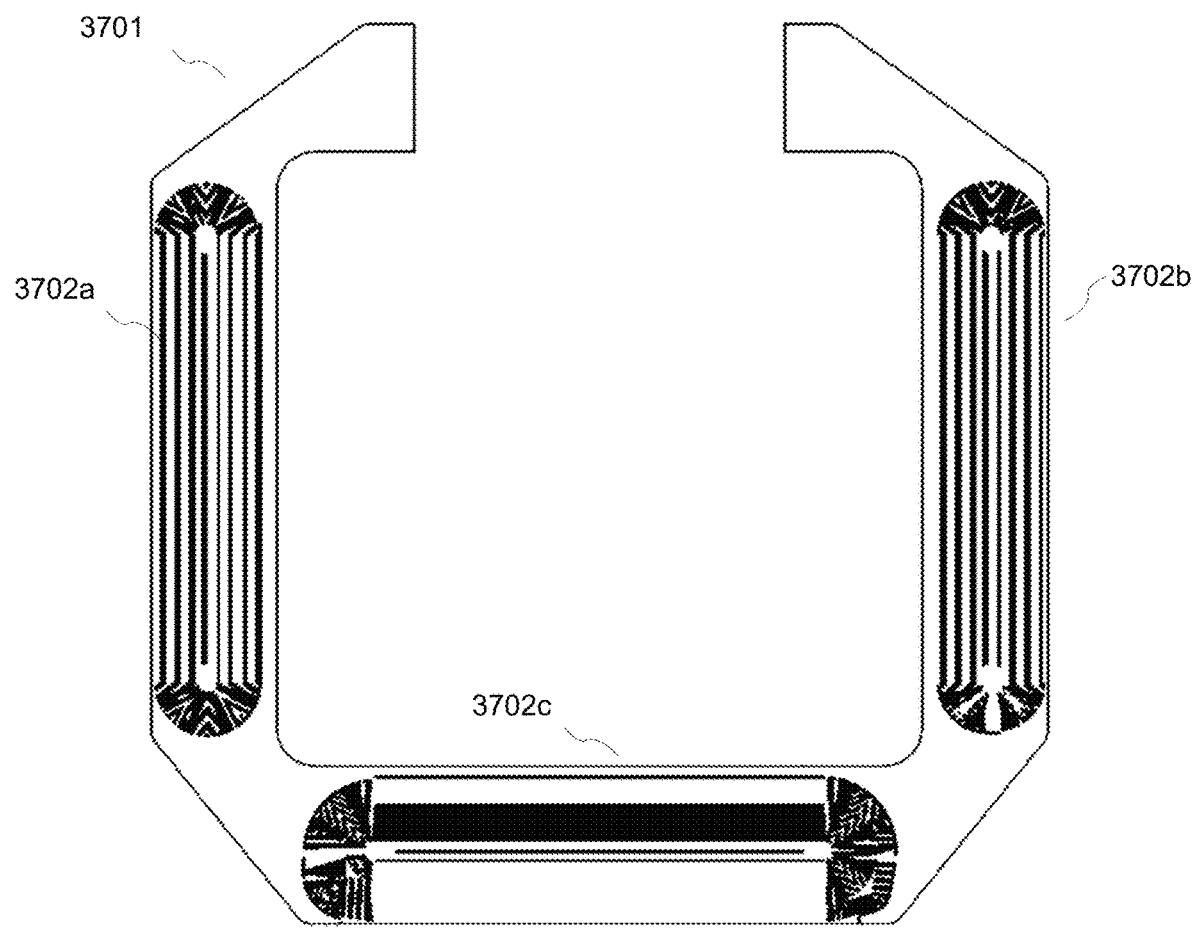
FIG. 37 illustrates a C-Shape coil configuration including multiple coil sections according to an embodiment.
Figure 38:
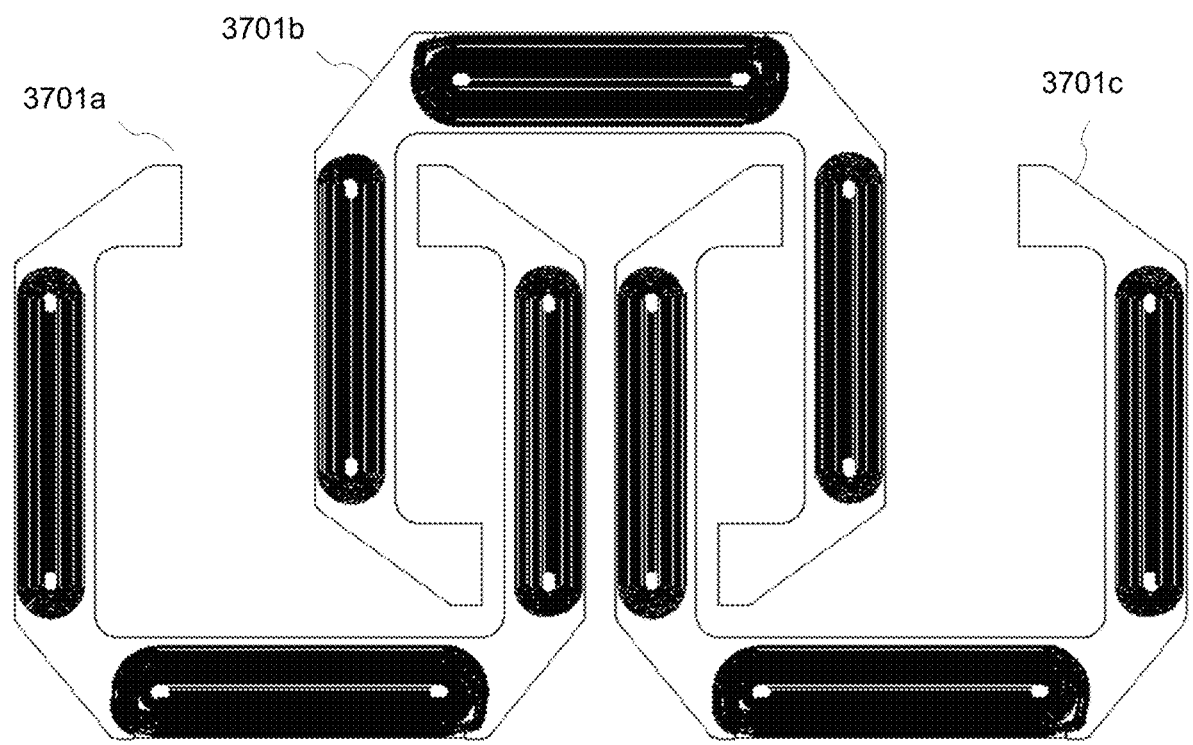
FIG. 38 illustrates a C-Shape coil configuration according to an embodiment.

FIG. 36 illustrates a cross section of the coil illustrated in FIG. 37 including a first dielectric layer/cover layer 3602, a first copper layer 3604, a second dielectric layer 3606, a second copper layer 3608, and a third dielectric layer 3610. FIG. 37 illustrates a C-Shape coil structure 3701 including multiple coil sections 3702 according to an embodiment. For some embodiments, multiple pieces are connected at corners. The C-Shape coil structure 3701, for some embodiments, is formed using techniques including those described herein. The C-Shape coil structure 3701 enables manufacturing efficiencies over current coil geometries. FIG. 38 illustrates a C-Shape coil structure 3701 arrangement, according to an embodiment, that enables manufacturing efficiencies. The interleaved configuration enables more coil structures to be manufactured during the manufacturing process than state of the art coil structures.

Figure 39:
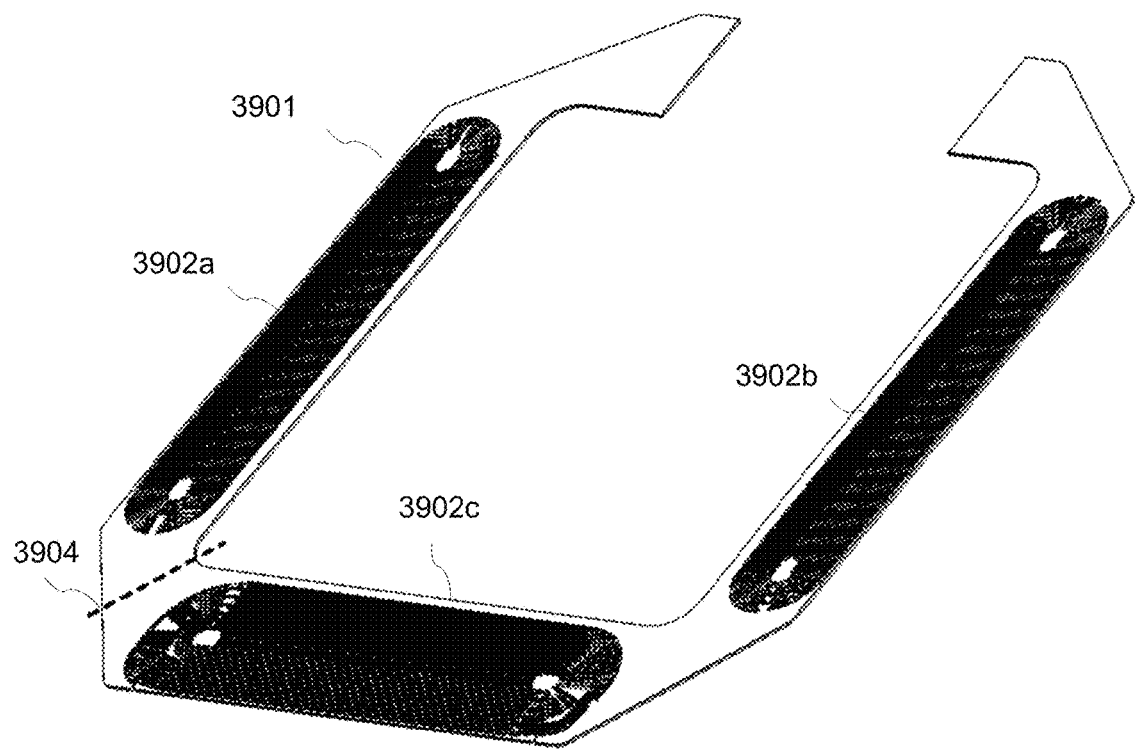
FIG. 39 illustrates a formable/Z plane forming coil structure according to an embodiment.

FIG. 39 illustrates a formable/Z plane forming (e.g. formed off sets) coil structure 3901 according to an embodiment. The coil structure 3901 is configured such that at least one portion or section 3902 can be moved to form the part after circuit fabrication to provide coils or other features such as bond pads substantially in a plane different from other sections 3902 of the coil structure, for example in the Z plane instead of the X,Y plane, For example, one may mechanically form a section 3902 along a dashed line 3904 to present the coil on the left side of the part in the Z-plane.

Figure 40:
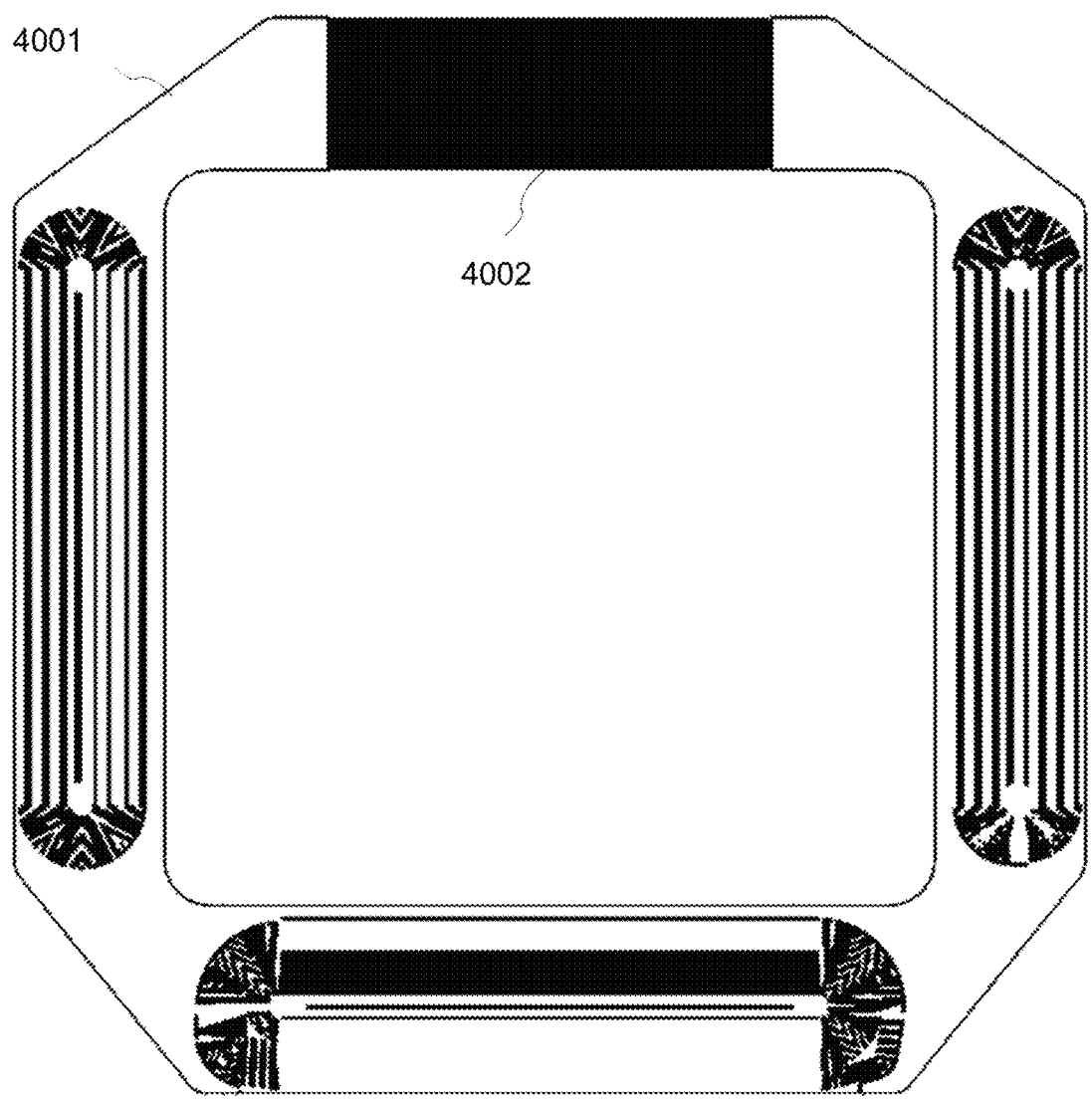
FIG. 40 illustrates a C-Shape coil structure including a bridge according to an embodiment.
Figure 41:
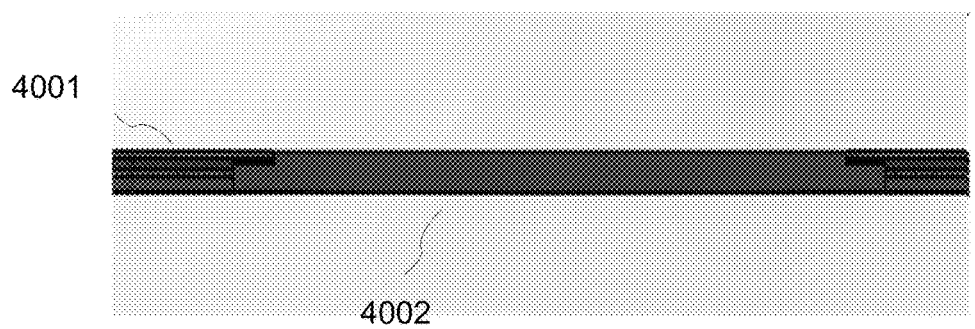
Figure 42:
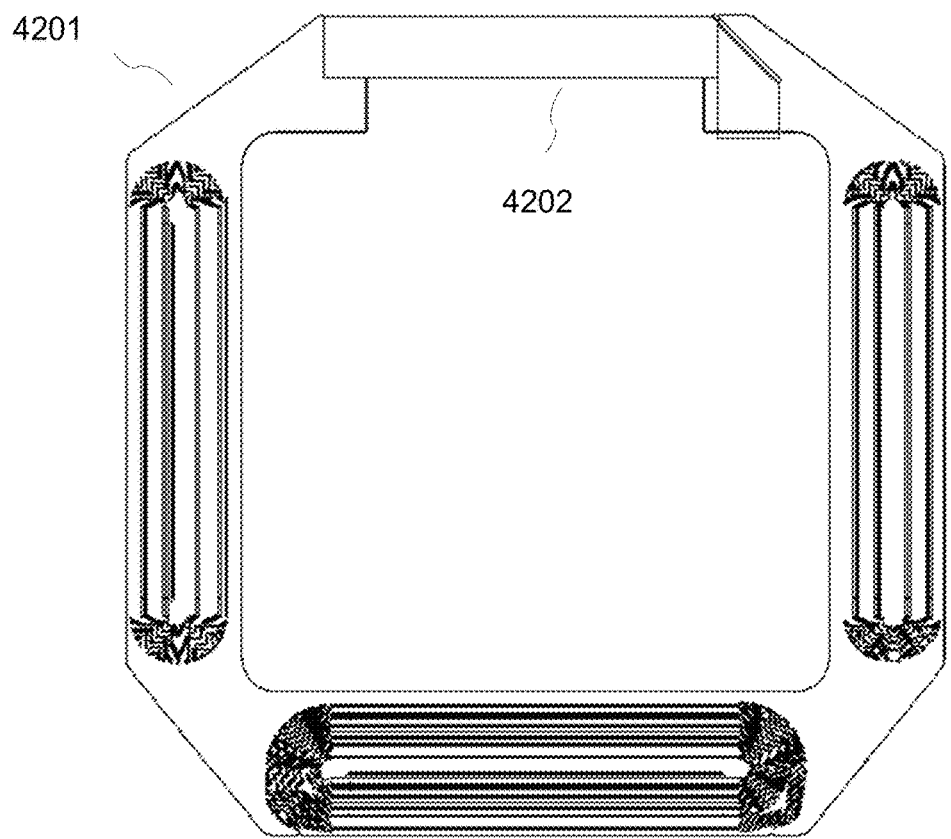
FIGS. 42-44 illustrate embodiments of a C-Shape coil structure including a bridge according to an embodiment.
Figure 43:
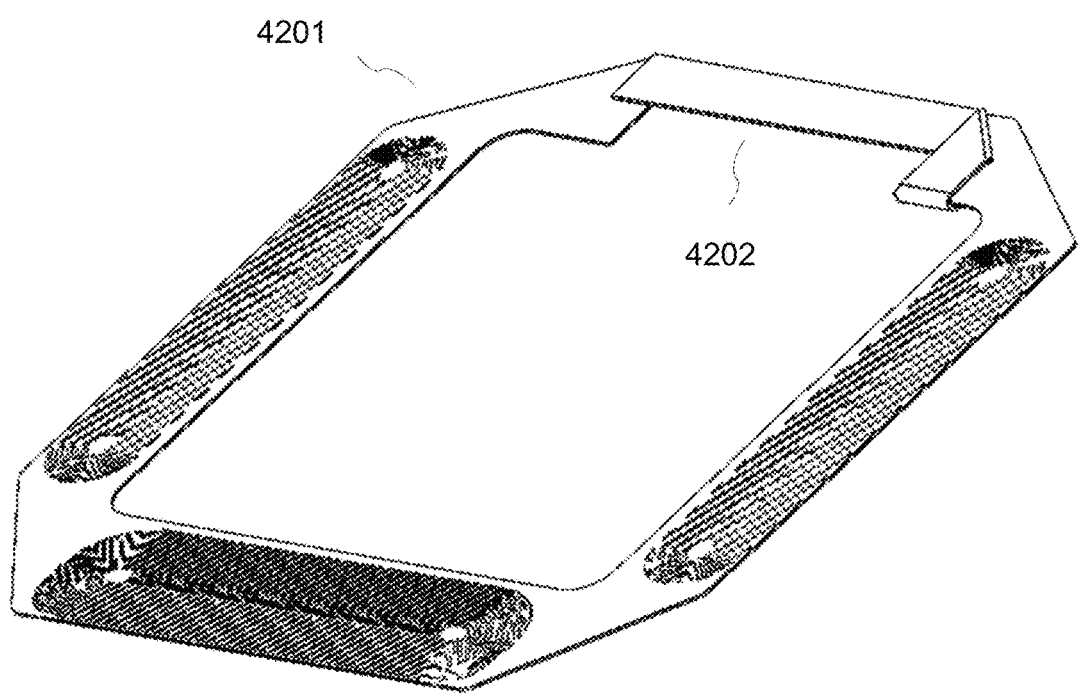
Figure 44:
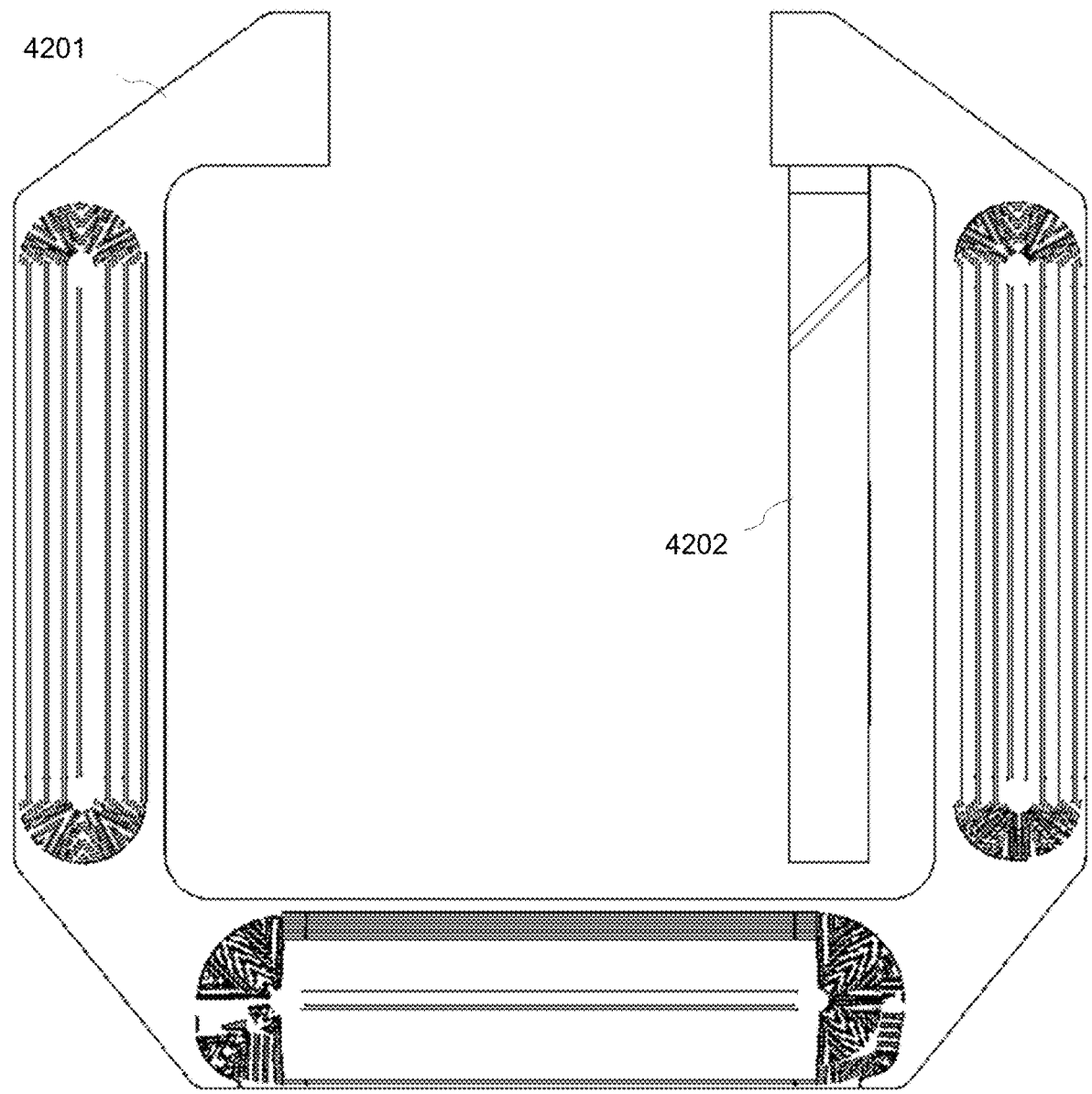

FIG. 40 illustrates a C-Shape coil structure 4001 including a bridge according to an embodiment. The bridge 4002 is configured to add structural strength to the structure to reduce damage, for example during handling or post manufacturing process. FIG. 41 illustrates a cross-section of the bridge 4002 in the C-Shape coil structure 4001 according to the embodiment illustrated in FIG. 40. Other embodiments of a bridge include structures formed in any free spaces between portions of a C-Shape coil structure. For some embodiments, a bridge could be an extension formed on at least one side of a C shape of a coil structure and connected by a joint and then bent at joint to lie across an opening in the C-Shape coil structure and attached to other side to form bridge. FIGS. 42-44 illustrate embodiments of a C-Shape coil structure 4201 including a bridge 4202 formed as an extension on at least one side of the C-shape coil. The bridge thickness could be thinner than the rest of the part for some embodiments. For some embodiments, a bridge is configured to be flush one or more surfaces of a coil structure, for example, with a mounting surface of a coil structure. For other embodiments, a bridge is configured to be recessed or lower than one or more surfaces of a coil structure. For some embodiments, a bridge is attached to a coil structure using adhesive.

Figure 45:
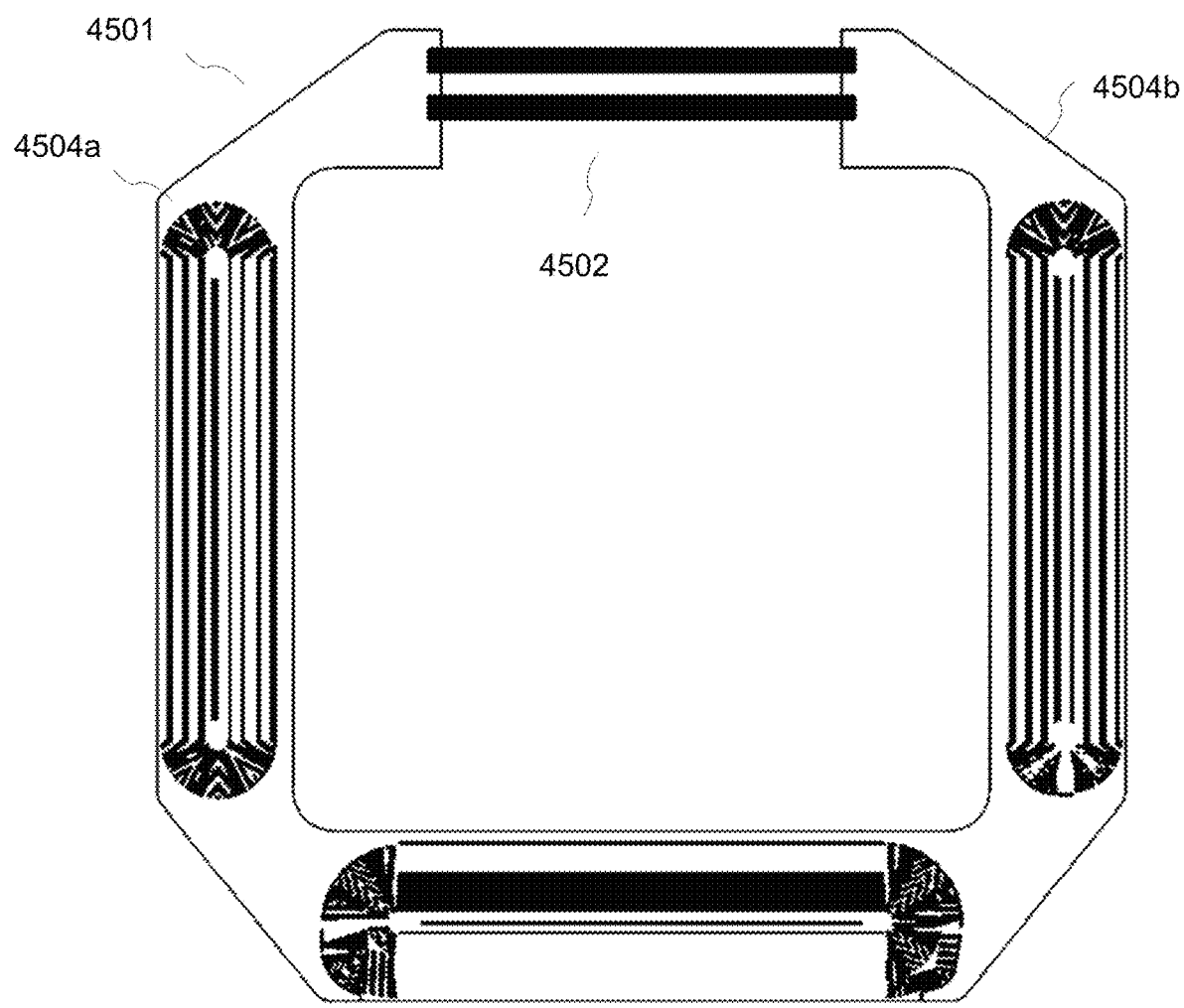
FIG. 45 illustrates a C-Shape coil structure including a bridge according to an embodiment.
Figure 46:
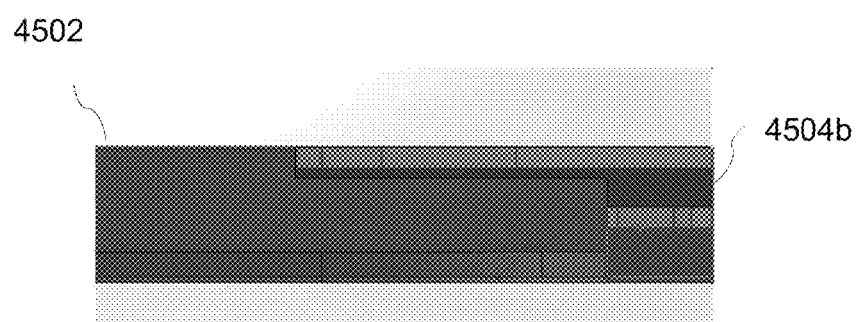
FIG. 46 illustrates a cross-section of the bridge in the C-Shape coil structure according to the embodiment illustrated in FIG. 45.

FIG. 45 illustrates a C-Shape coil structure 4501 including a bridge 4502 according to an embodiment. The bridge 4502 is an adhesive disposed to create a stiff structure in a gap between portions 4504 of the coil. The adhesive can be any attachment material that can be dispensed and cured. For some embodiments, a portion of the adhesive disposed on the coil is thinner than it is in a gap. FIG. 46 illustrates a cross-section of the bridge 4502 in the C-Shape coil structure 4501 according to the embodiment illustrated in FIG. 45.

Figure 47:
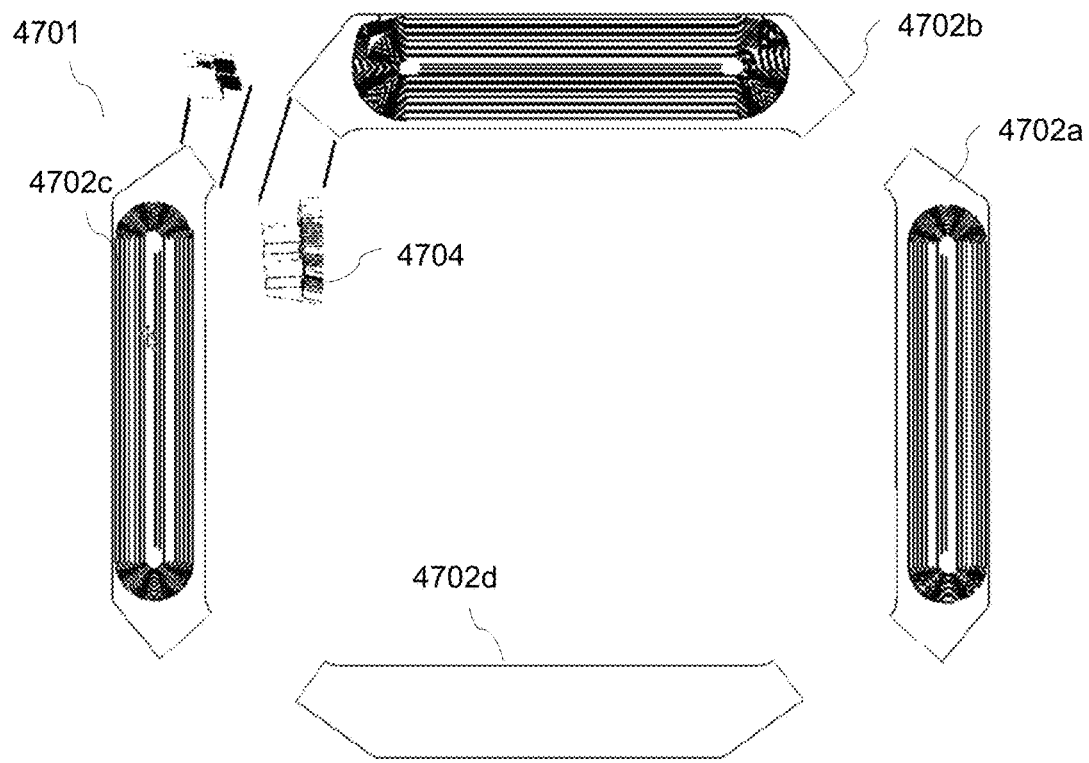
FIG. 47 illustrates a coil structure according to an embodiment formed from multiple individual portions.

FIG. 47 illustrates a coil structure 4701 according to an embodiment formed from multiple individual portions 4702. For some embodiments, each portion includes an assembly tab 4704 for mating with a corresponding portion of the coil structure. For some embodiments, an assembly tab 4704 is configured to include a solder paste or other adhesive for attaching to a corresponding portion. Such a coil structure 4701 would further optimize the number of coil structures that could be manufactured at a given time further adding to lowering costs and other manufacturing efficiencies.

Figure 48:
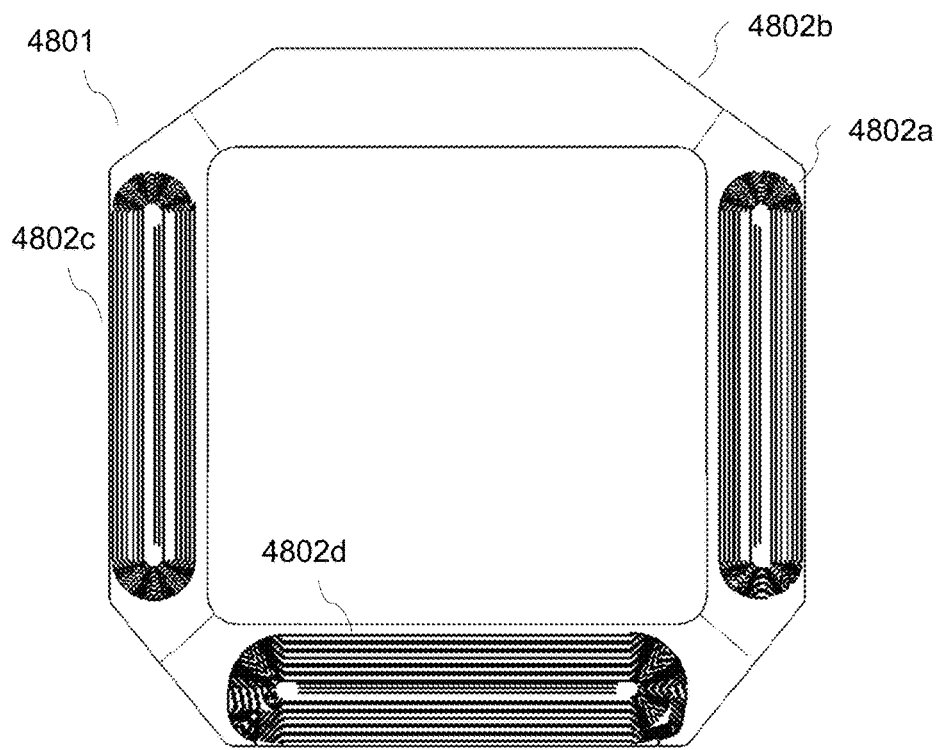
FIG. 48 illustrates a coil structure according to an embodiment including multiple individual portions.
Figure 49:
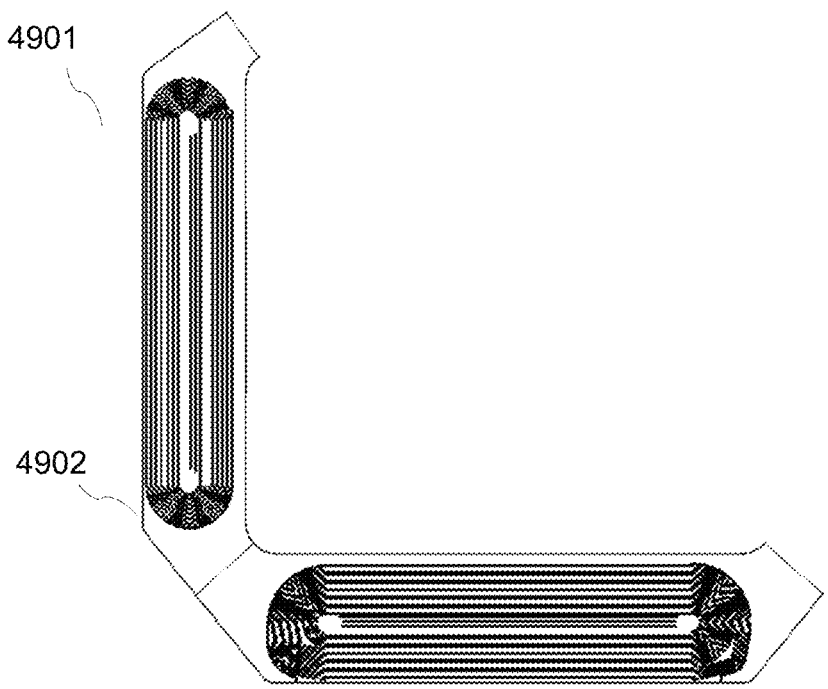
FIG. 49 illustrates an alternative shape for at least one portion of a coil structure according to an embodiment.

FIG. 48 illustrates a coil structure 4801 according to an embodiment including multiple individual portions 4802 assembled to for the coil. FIG. 49 illustrates an alternative shape for at least one portion 4902 of a coil structure 4901 according to an embodiment. Thus, each portion could be made up of any shape and configured to mate with other corresponding portions to form a coil structure.

Figure 50:
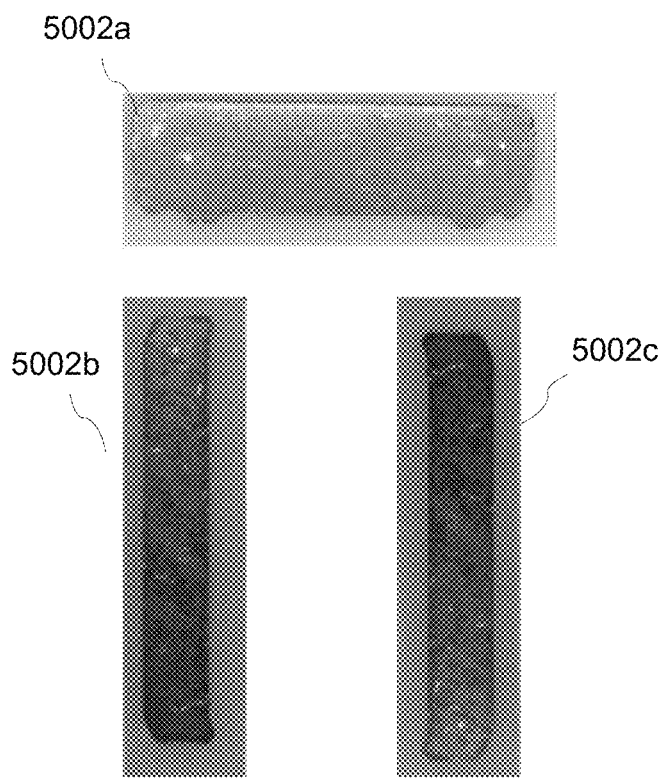
FIG. 50 illustrates surface mount coils to form a coil structure according to an embodiment.
Figure 51:
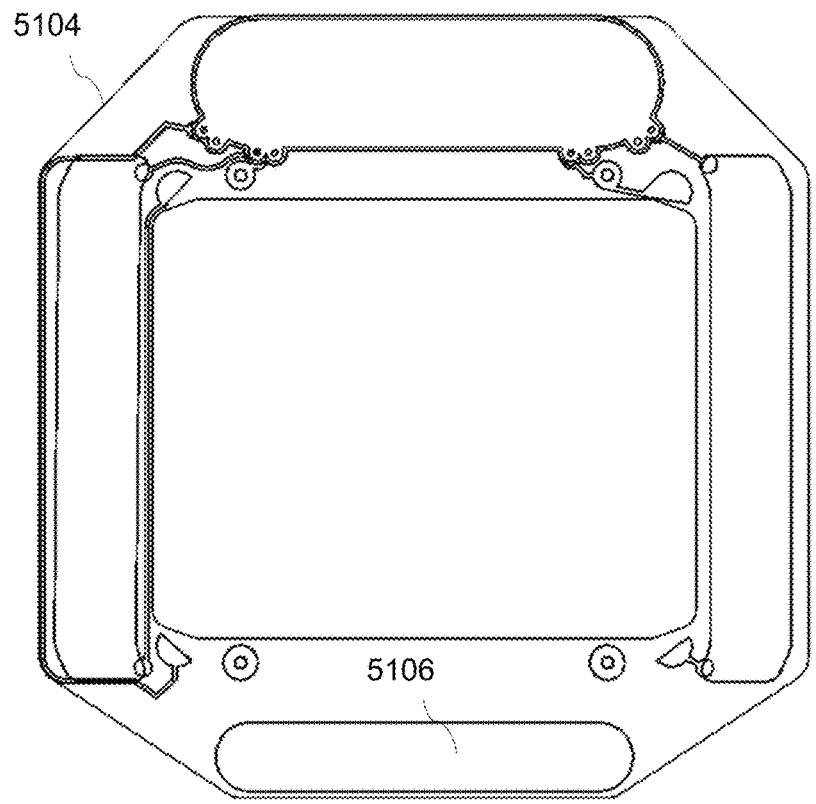
FIG. 51 illustrates surface mount coils are configured to be disposed on a substrate according to an embodiment.
Figure 52:
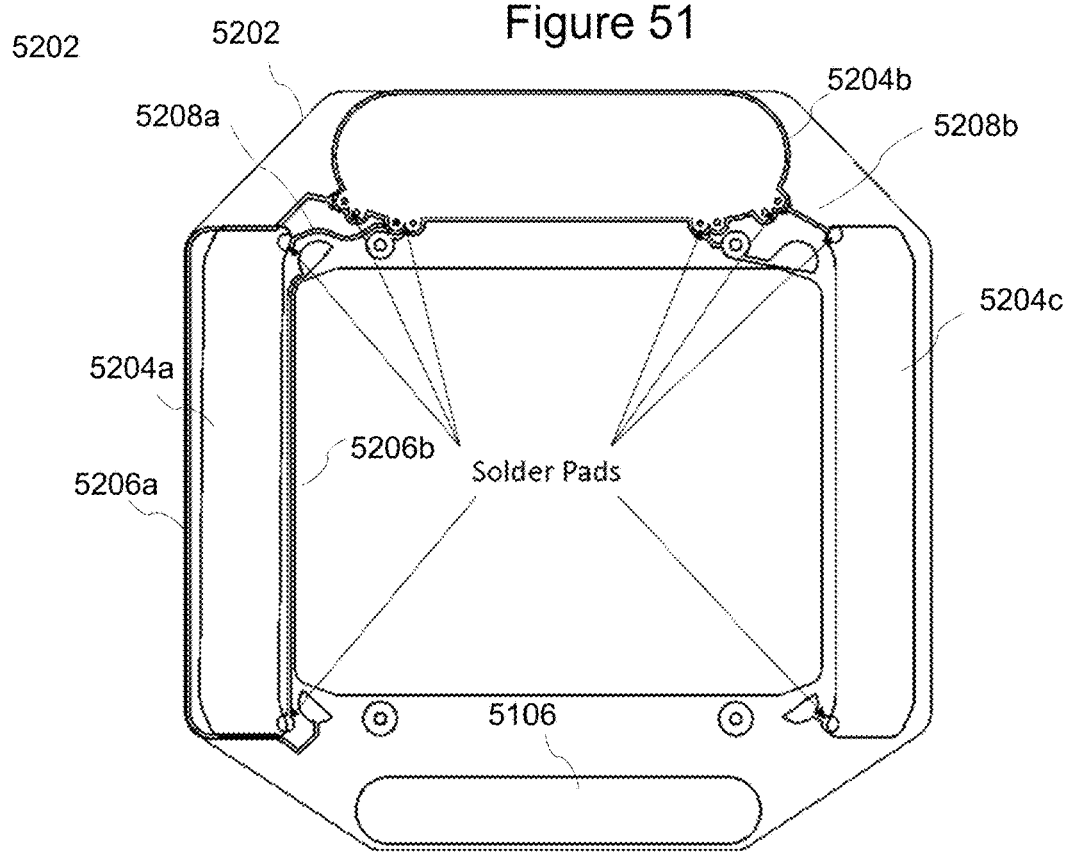
FIG. 52 illustrates a top view of a substrate with the surface mount coils attached according to an embodiment.
Figure 53:
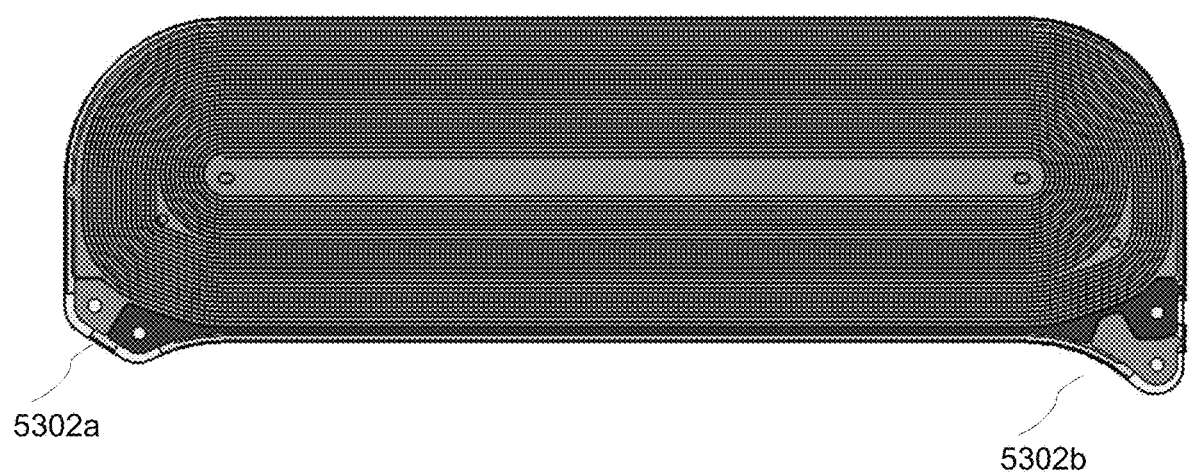
FIG. 53 illustrates a surface mount coil including an integrated trace jumper according to an embodiment.

FIG. 50 illustrates surface mount coils to form a coil structure according to an embodiment. For some embodiments, the surface mount coils 5002 are configured to be disposed on a substrate 5104, for example, such as that illustrated in FIG. 51, which illustrates a top view of such a substrate 5104 including a stiffener 5106 prior to the surface mount coils being attached. FIG. 52 illustrates a top view of a substrate 5202 with the surface mount coils 5204 attached according to an embodiment. For some embodiments, the substrate includes one or more traces 5206 and an optional stiffener 5208 on the substrate 5202. The substrate, according to some embodiments, includes one or more trace jumpers 5208 to electrically couple a surface mount coil 5204 with another one or more surface mount coil 5204. A trace jumper 5208 could also be used to electrically couple one or more surface mount coils 5204 to other components. Alternatively, a trace jumper 5208 can be integrated with a surface mount coil 5204, for example as illustrated in FIG. 53. In this configuration, according to some embodiments, the integrated trace jumper 5302 does not add to the z-height or footprint of the final assembly and eliminates a jumper needing to be added at a later step. A stiffener, such as those described herein, can be copper or other material such as solder mask or polyimide disposed on the substrate, according to some embodiments. A substrate, according to some embodiments, includes connector pads for electrically coupling the surface mount coils to other portions of the coil and/or to other circuits. Individual coils can generally be surface mount structures attached to: planar surfaces that can later be formed into a 3D shape or already formed 3D shape (the 3D shape can be curved). Further, for some embodiments, the surface mounts structures can wrap round corners and conform to shapes, be incorporated with or mounted to other structures ((NFC, RFID, transformers, etc.), and/or can be stacked The one or more surface mount coils can be attached to a substrate through connections including, but not limited to ACF—structural and electrical connection, ultrasonic gold ball bond, and Solder (plate, hot bar reflow, etc. . . . ). Forming surface mount coils separate from a substrate further enables the formation of coil structures having any number of shapes or sizes. Further, the forming the surface mount coils, for example using techniques including those described herein, enable manufacturing efficiencies by enabling a higher number of coils to be formed at the same time thus reducing the cost of a coil. Further, the manufacturing of surface mount coils enables higher copper plating densities helping to reduce the cost of forming a coil structure while not negatively affecting coil performance.

Figure 54:
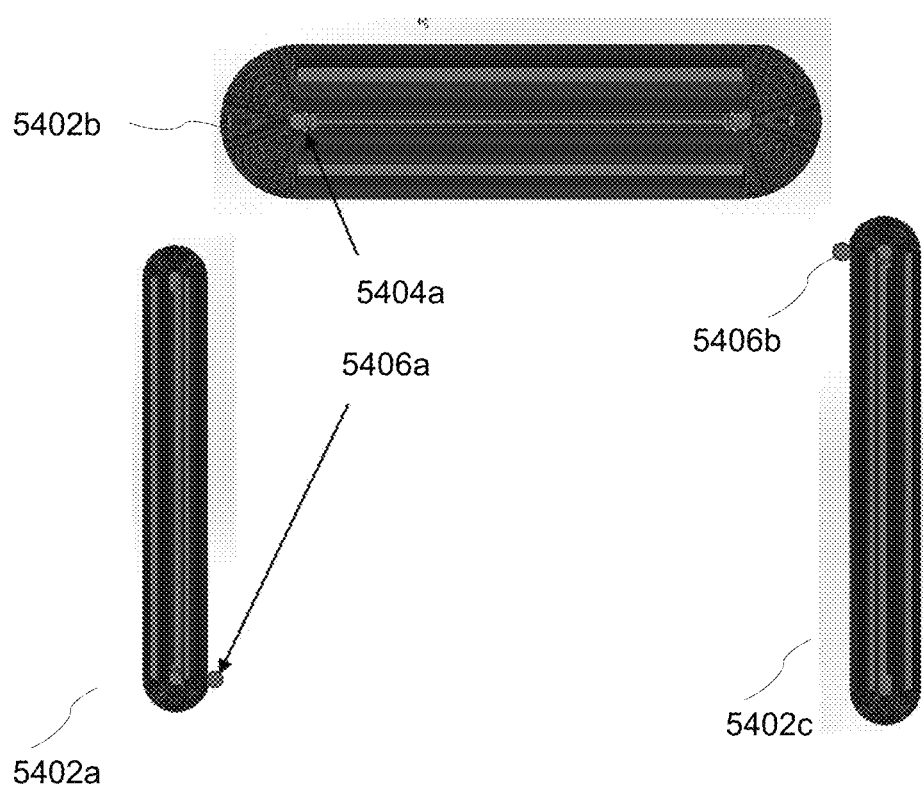
FIG. 54 illustrates surface mount coil portions according to an embodiment.
Figure 55:
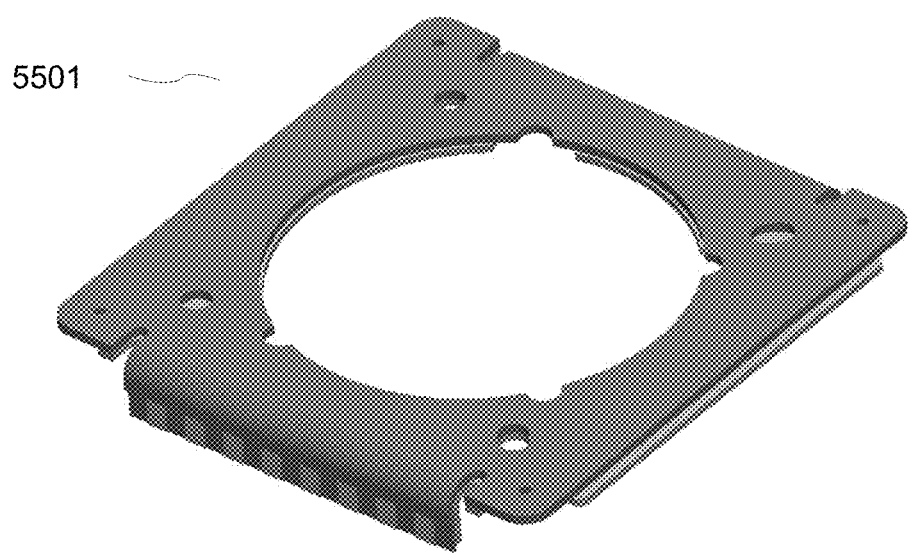
FIG. 55 illustrates a circuit board configured for mounting coil portions to form a coil structure according to an embodiment.

FIG. 54 illustrates surface mount coil portions 5402 according to an embodiment. Similar to other embodiments of surface mount coil portions described herein, such coil portions 5402 enable directly attaching the high density coil(s) to a substrate, such as a circuit board (e.g., FPC). For example, some coil portions may include internal electrical connector pads 5404 and/or external electrical connector pads 5406. FIG. 55 illustrates a circuit board 5501 configured for mounting coil portions, such as surface mount coils as described herein, to form a coil structure according to an embodiment. Further, assembly of a coil structure, for example mounting surface mount coils on a substrate, can include using a pick and place assembly process as is used in current manufacturing processes. Thus, the manufacturing cost of incorporating coil structures is reduced. Moreover, the surface mount coils to form coil structures removes the need for an additional substrate (Circuits and support structure designed directly into the FPC).

Figure 56:
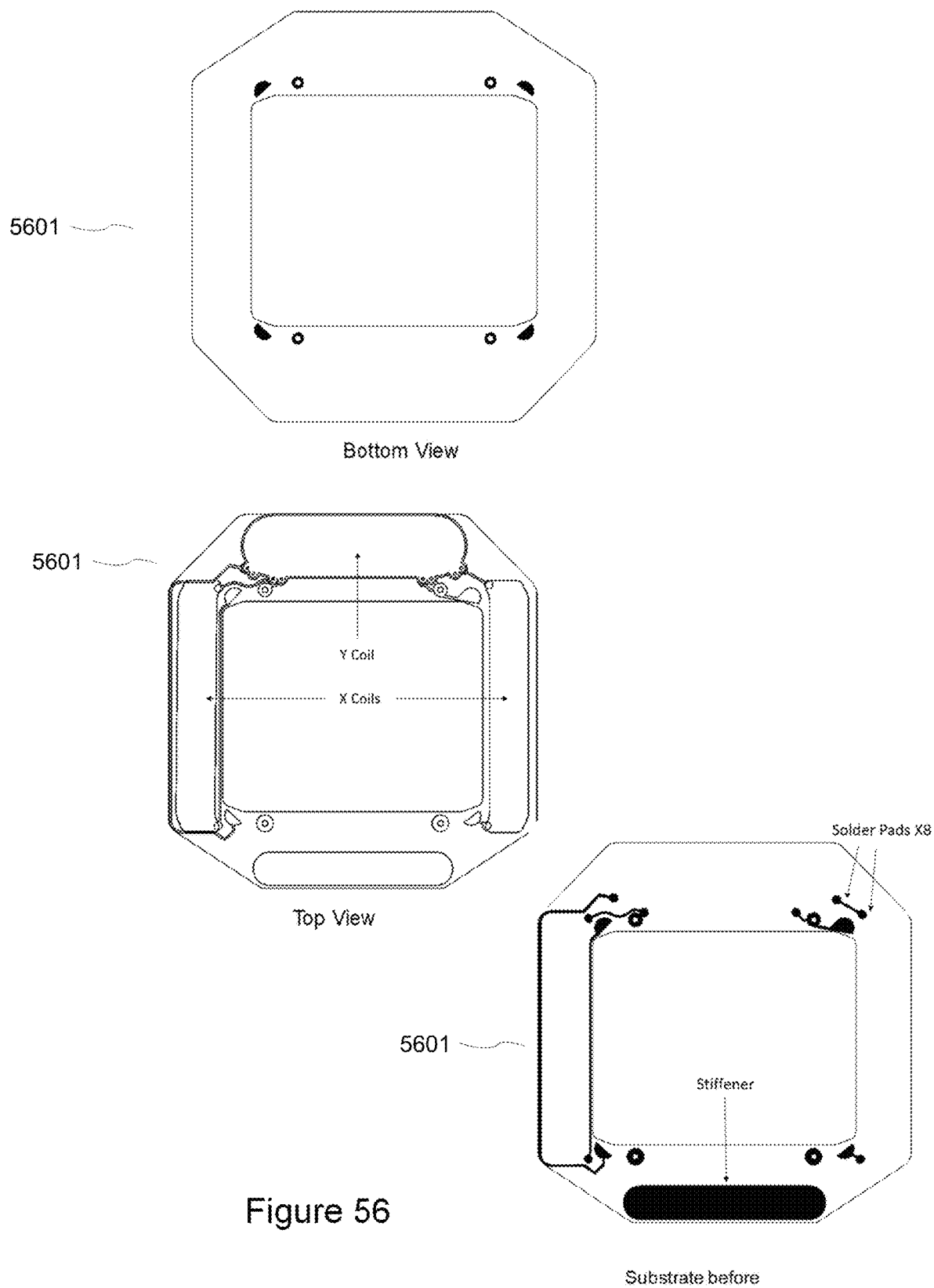
FIG. 56 illustrates multiple views of a coil structure according to an embodiment.
Figure 57:
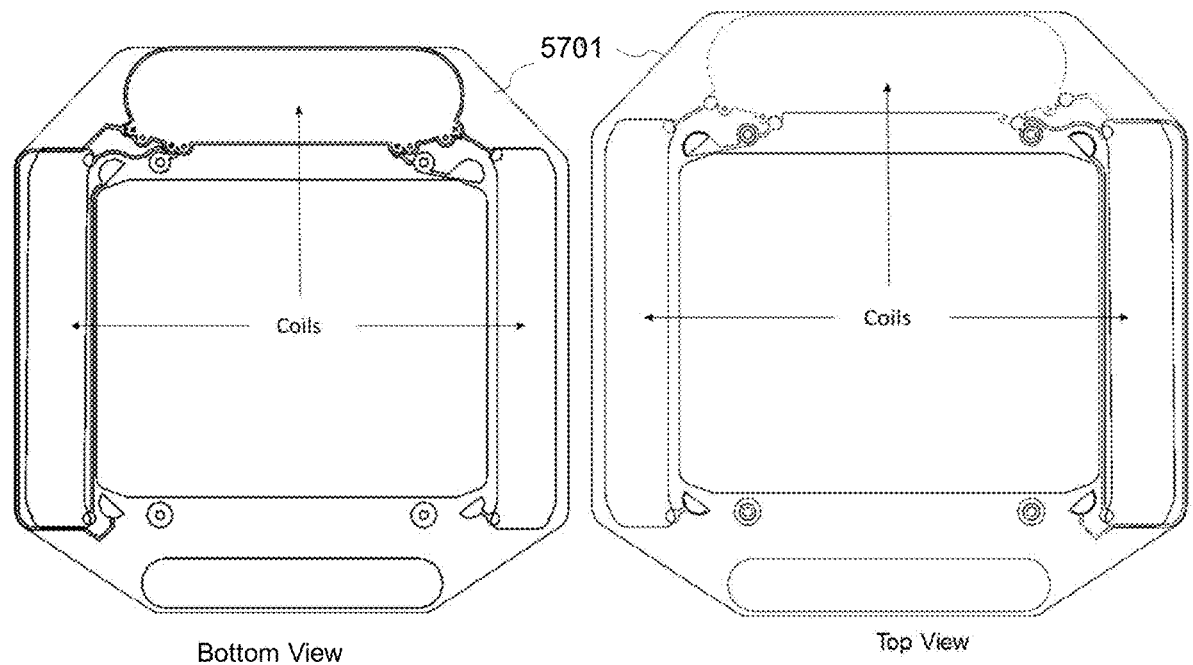
FIG. 57 illustrates multiple view of a coil structure including surface mount coils according to an embodiment.

FIG. 56 illustrates multiple views of a coil structure 5601 according to an embodiment. FIG. 57 illustrates multiple views 5701 of a coil structure including surface mount coils according to an embodiment.

Figure 58:
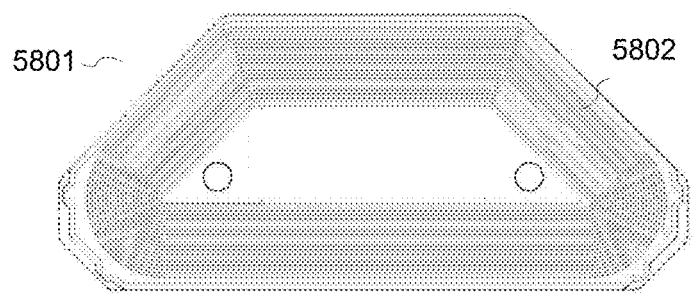
FIG. 58 illustrates a coil portion according to an embodiment.

FIG. 58 illustrates a coil portion according to an embodiment. The coil portion 5801 includes a coil 5802 formed using techniques including those described herein in substantially the shape of a trapezoid. One or more coil portions 5801 having a coil 5802 formed in substantially the shape of a trapezoid can be used with a coil structure, such as those described herein. Such a coil portion 5801 having a coil 5802 formed in substantially the shape of a trapezoid can be used with one or more other coil portions having a coil formed in other shapes. Further, other embodiments of a coil portion include having a coil formed substantially in shapes other than a trapezoid.

Figure 59:
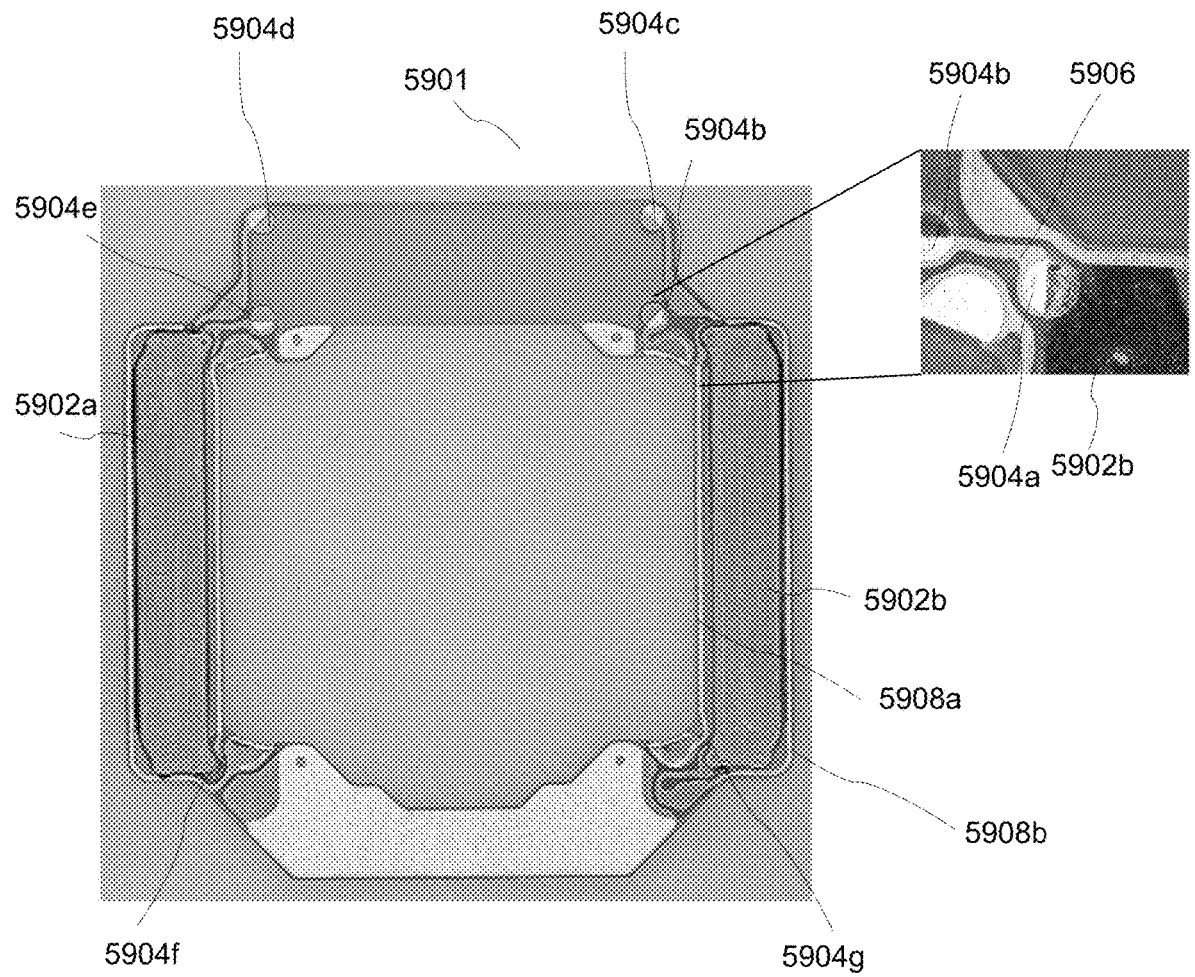
FIG. 59 illustrates a coil structure according to an embodiment including a solder joint for attaching one or more surface mount coils.

FIG. 59 illustrates a coil structure according to an embodiment including a solder joint for attaching one or more surface mount coils. The coil structure 5901 includes one or more surface mount coils 5902. The one or more surface mount coils 5902 are formed using techniques including those described herein. The coil structure 5901 includes solder joints 5904 for mechanically and electrically coupling the one or more surface mount coils 5902 to the one or more traces 5906 and/or one or more trace jumpers 5908, such as those described herein. For some embodiments, the surface mount coils 5902 are affixed to the coil structure prior to soldering the surface mount coil 5902 to a solder joint 5904. According to some embodiments, the surface mount coils 5902 are affixed to the coil structure using adhesive. For some embodiments, a spacer is disposed between a surface mount coil 5902 and the coil structure 5901. For some embodiments the spacer is configured to have a height to place the surface mount coil 5902 at a desired distance from another component.

Figure 60:
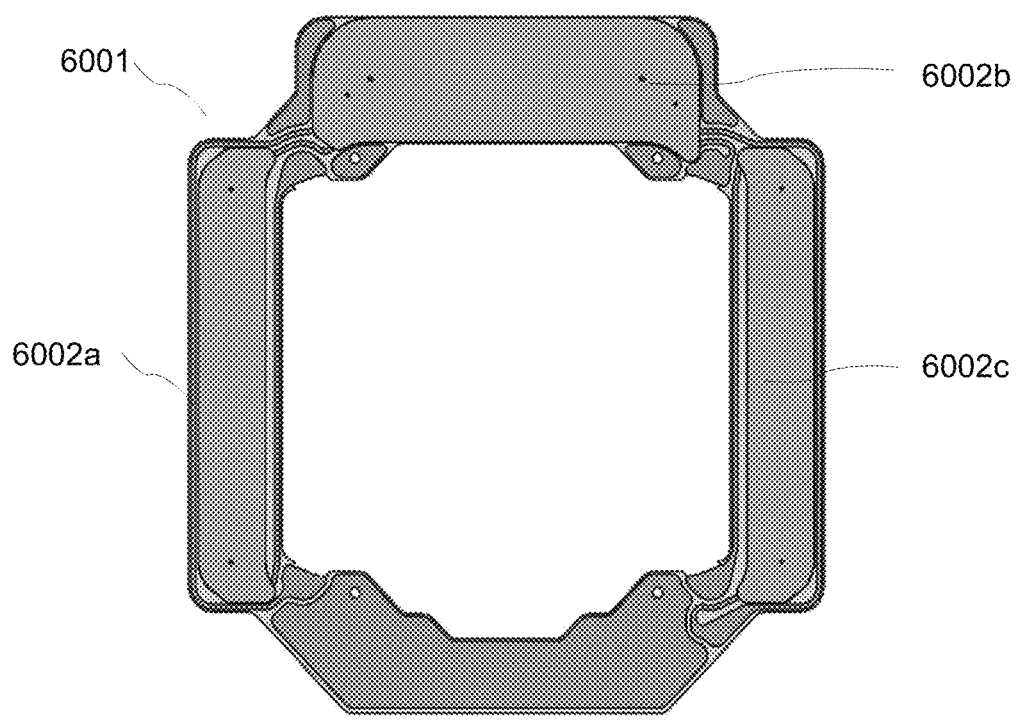
FIG. 60 illustrates a top view of a structure including solder joints for mechanically and electrically coupling a surface mount circuit to the structure according to an embodiment.

FIG. 60 illustrates a top view of a structure including solder joints for mechanically and electrically coupling a surface mount circuit to the structure according to an embodiment. The structure 6001 includes surface mount circuits 6002. The surface mount circuits 6002 can be any circuit and not limited to surface mount coils, such as those described herein. The surface mount circuits 6002 are mechanically and electrically coupled to the structure using solder joints, such as those described herein. The surface mount circuits 6002, according to some embodiments, are affixed to the structure 6001 using adhesive prior to soldering the surface mount circuits 6002 to the solder joints of the structure using techniques including those described herein.

Figure 61:
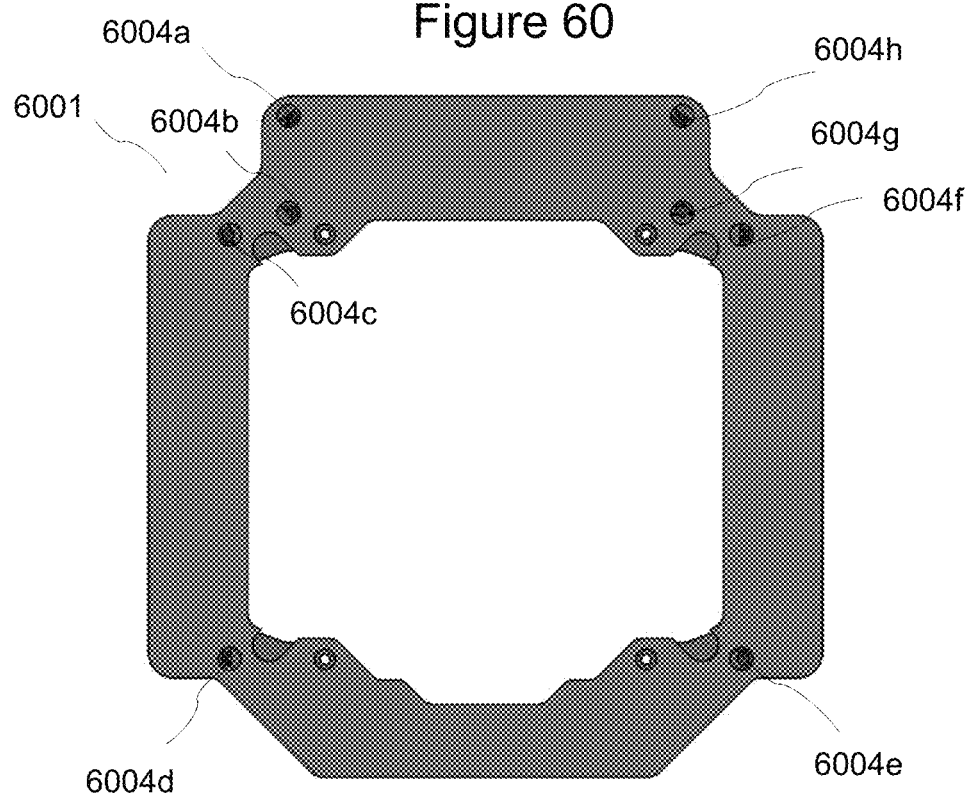
FIG. 61 illustrates a bottom view of a structure including solder joints for mechanically and electrically coupling the surface mount circuit to the structure of FIG. 60.

FIG. 61 illustrates a bottom view of a structure including solder joints for mechanically and electrically coupling the surface mount circuit to the structure of FIG. 60. For some embodiments, the solder joints are formed to be accessed on a surface of the structure 6001 that is opposite, for example the bottom surface, to the surface that the surface mount circuit is disposed, for example a top surface. Once the surface mount circuit is disposed on the structure using techniques including those described herein, solder is disposed in the solder joint 6004. Solder can be disposed in the solder joint 6004 using techniques including, but not limited to, applied using solder jetting, solder paste, and manually applied. For other embodiments, a surface mount circuit, including a surface mount coil, is coupled with the solder joint using conductive adhesive or resistive welding.

Figure 62:
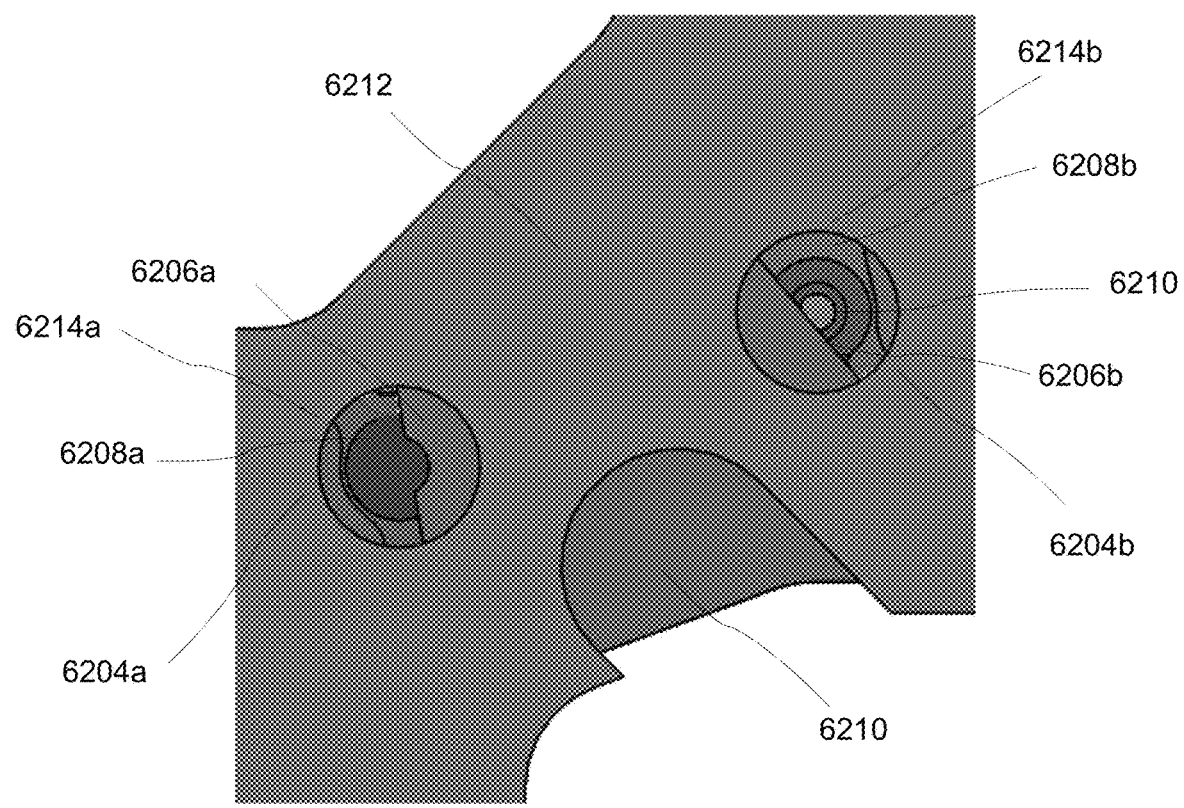
FIG. 62 illustrates a structure including solder joints according to an embodiments.

FIG. 62 illustrates a structure including solder joints according to an embodiments. A first solder joint 6204a includes a substrate solder pad 6206a and a surface mount circuit solder pad 6208a. The substrate solder pad 6206a is formed by creating a void 6214 in the substrate 6212 of a structure to expose a portion of a conductive layer 6210. For some embodiments, the void 6214 can be formed in the substrate 6210 using etch techniques including those known in the art. For other embodiments, drilling or laser ablation is used to form a void 6214 in the substrate 6210 to expose a portion of the conductive layer 6210. The conductive layer 6210 disposed on the substrate using techniques including those described herein. The portion of the conductive layer 6210 exposed by the creation of the void 6214 is the substrate solder pad 6206. For some embodiments, a solder joint 6204 includes a datum 6210. For some embodiments, a datum is a via, a void, a conductive layer, fiducial, or other reference point used for alignment. The datum is used to align the surface mount solder pad in relation to the substrate solder pad. For example, optical inspection techniques, such as those known in the art, can be used to detect datum 6210 within the void 6214 to ensure the surface mount circuit is properly aligned prior to applying solder to the solder joint 6204.

Figure 63:
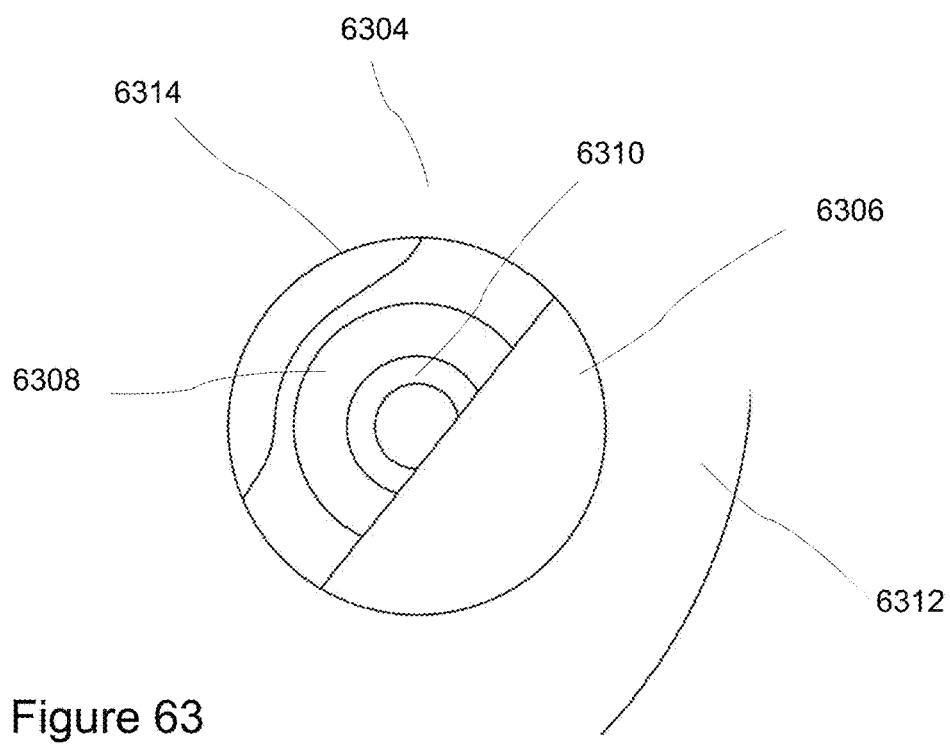
FIG. 63 illustrates a solder joint according to an embodiment.

FIG. 63 illustrates a solder joint according to an embodiment. The solder joint 6304 includes a substrate solder pad 6306, such as those described herein, exposed through a void 6314 in a substrate 6312. The void 6314 is formed using techniques including those described herein. The solder joint 6304 also includes a circuit solder pad 6308. A circuit solder pad 6308 includes solder pads such as those described herein. The circuit solder pad 6308 can be formed on any substrate including, but not limited, to a substrate of a surface mount coil, a surface mount circuit, or other component.

Figure 64:
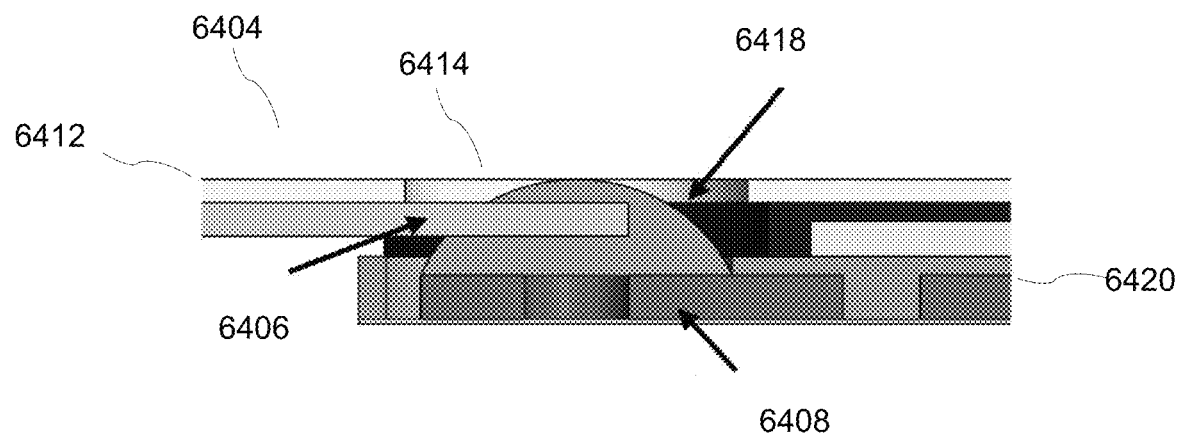
FIG. 64 illustrates a cross-sectional view of a solder joint according to an embodiment.

FIG. 64 illustrates a cross-sectional view of a solder joint according to an embodiment. The solder joint 6404 includes a substrate solder pad 6406, such as those described herein, exposed through a void 6414 in a substrate 6412. The void 6414 is formed using techniques including those described herein. The solder joint 6404 also includes a circuit solder pad 6408. A circuit solder pad 6408 includes solder pads such as those described herein. The circuit solder pad 6408 can be formed on any substrate including, but not limited, to a substrate of a surface mount coil, substrate of a surface mount circuit 6420, or substrate of any type of component. According to some embodiments, solder 6416 is disposed in the void 6414 to mechanically and electrically couple the substrate solder pad 6406 with the circuit solder pad 6408. The solder 6416 is disposed in the void using techniques including those described herein. For other embodiments, an adhesive such as a conductive adhesive is disposed in the void 6414.

The solder joint according to embodiments described herein enables the reduction or elimination of shorted electrical connections by containing the solder or conductive adhesive within the area of the void. The solder joint also enables a surface mount circuit, a surface mount coil, or other component to be affixed to a substrate prior to adding solder to the solder joint because the void of the solder joint is formed in an opposing surface which the surface mount circuit, the surface mount coil, or other component is affixed. This also enables the ability to minimize the distance between the substrate and the surface mount circuit, the surface mount coil, or other component, which improves flatness and eliminates voids, for example between a surface mount coil and a substrate. The improved flatness of the surface mount circuit, the surface mount coil, or other component disposed on the substrate enables the ability to use components with a great thickness (i.e., height above the substrate). According to some embodiments the flatness of the surface mount circuit, the surface mount coil, or other component is 100 micrometers or less.

Further, the void enables visual inspection of the solder joint after the solder is added to the solder joint. This aids in the verification of electrical connections. The access to the solder joint enabled by the void also enables the ability to rework the solder joint, for example reapply solder or adhesive, after the manufacture if the solder joint. Moreover, the solder joint can be configured to be compatible with industry standard soldering processes by modifying the dimensions to accommodate required solder volumes and gap height variations. The solder joint also enables a robust substrate trace that improves yield in manufacturing processes.

Figure 65:
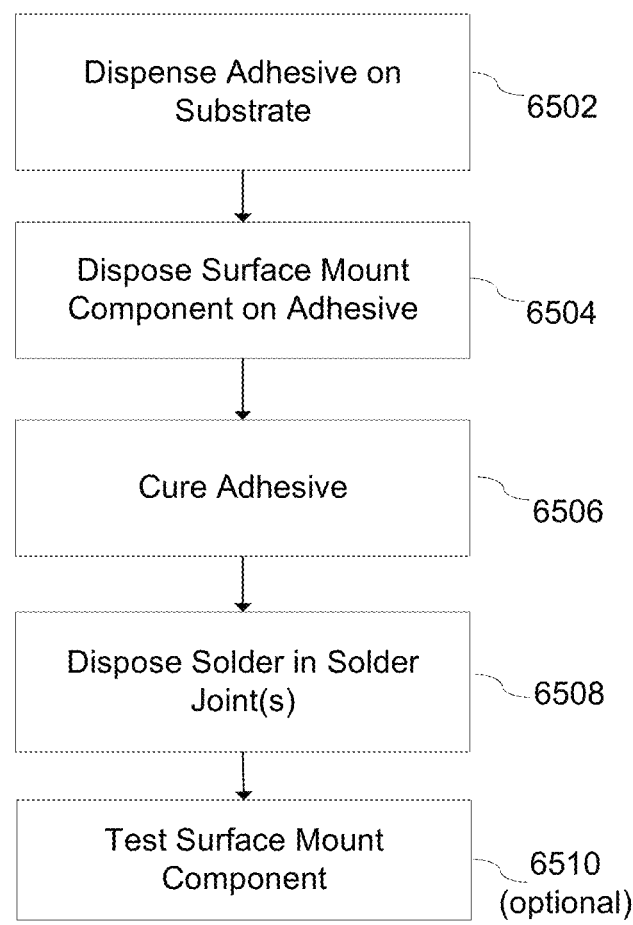
FIG. 65 illustrates a flow diagram for a manufacturing process using the solder joint according to an embodiment.

FIG. 65 illustrates a flow diagram for a manufacturing process using the solder joint according to an embodiment. The process includes dispensing adhesive on a substrate (6502), such as those described herein. The adhesive is disposed on the substrate to affix a surface mount component, for example a surface mount coil, a surface mount circuit, or other component, to the substrate. The surface mount component is disposed on the adhesive (6504) for example by using pick and place techniques known in the art. The adhesive is cured (6506) using techniques including those known in the art to affix the one or more surface mount components to the substrate. Solder is disposed in the void of a solder joint (6508) according to embodiments described herein using techniques including those described herein. Alternatively, a conductive adhesive is disposed in the void of a solder joint according to embodiments described herein using techniques including those known in the art. Optionally, the manufacturing process includes testing the surface mount component (6510). Such testing can include, but is not limited, visual inspection of the solder joint, electrical verification of the surface mount component or circuit created by the addition of the surface mount component, and other manufacturing testing.

Figure 66:
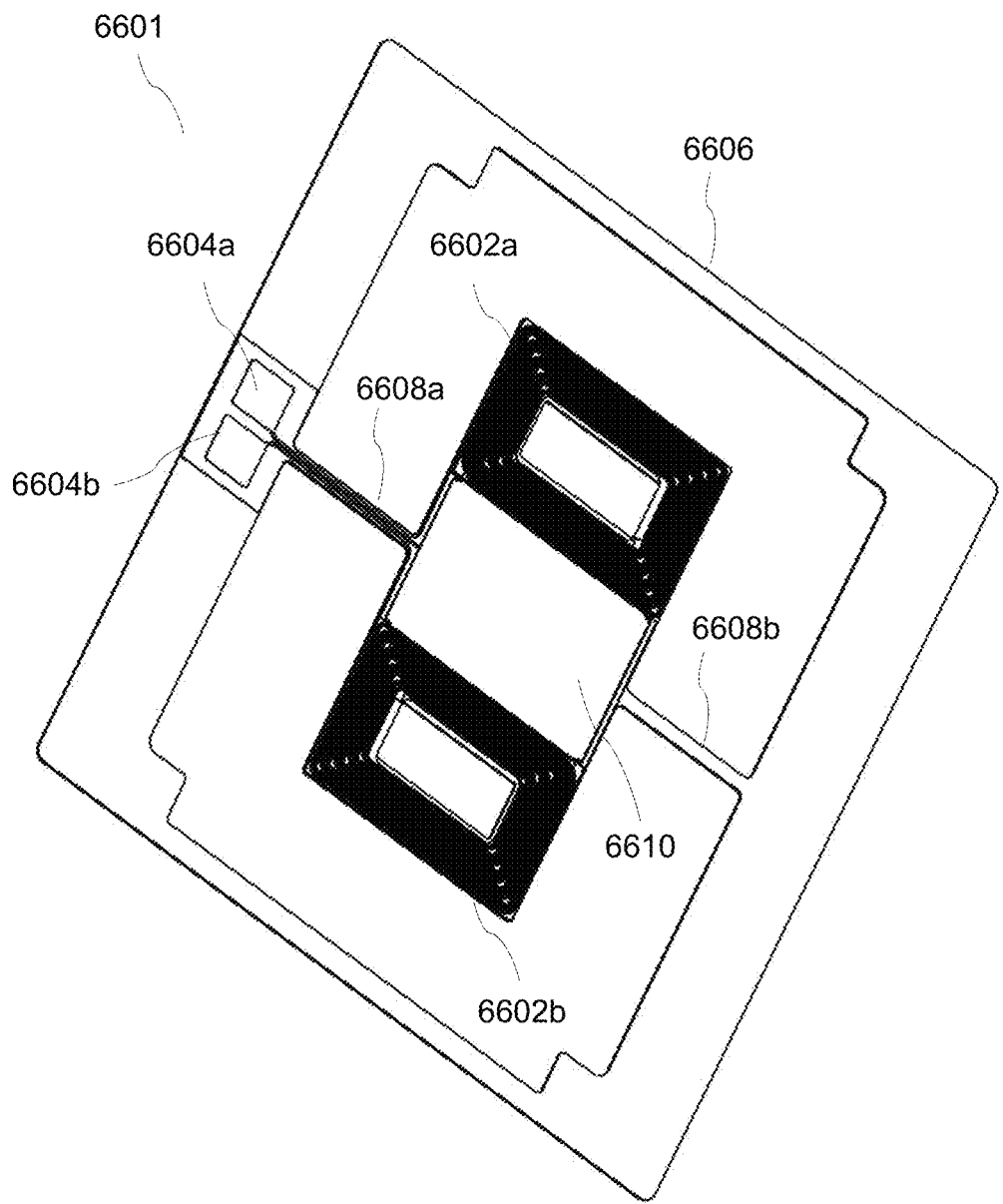
FIG. 66 illustrates a coil structure according to an embodiment.

FIG. 66 illustrates a coil structure according to an embodiment. The coil structure is formed using techniques including those described herein. The coil structure 6601 includes surface mount coils 6602. The surface mount coils 6602 are affixed to the coil structure 6601 using techniques including those described herein. The surface mount coils 6602 are disposed on a center portion 6604 of the coil structure 6601. The center portion 6610 is attached to an outer portion 6606 by one or more connecting portions 6608. For some embodiments, one or more traces are disposed on the substrate including the center portion 6610, the outer portion 6606, and at least one of the connecting portions 6608 to electrically couple the surface mount coils 6602 to one or more terminal pads 6604 formed on the outer portion 6606.

Figure 67:
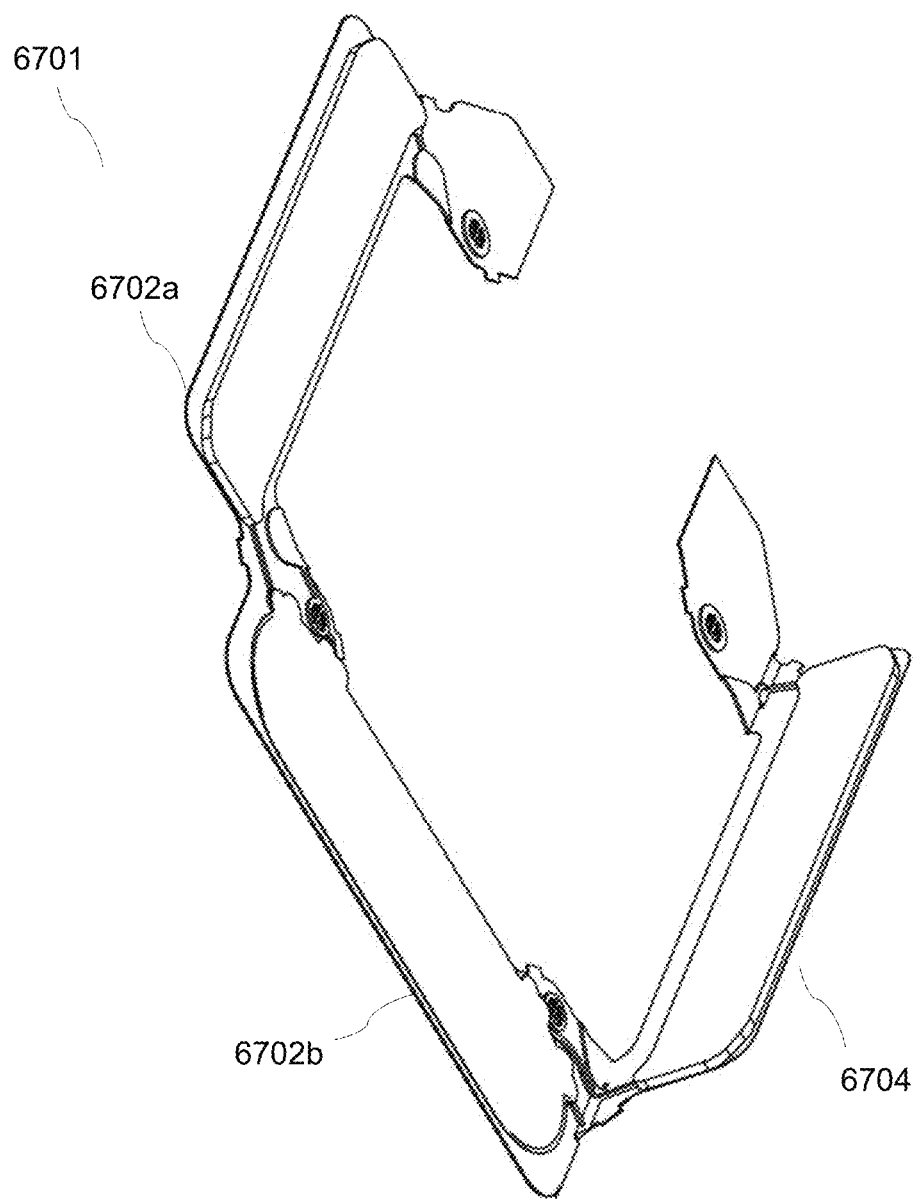
FIG. 67 illustrates a coil structure according to an embodiment.

FIG. 67 illustrates a illustrates a coil structure according to an embodiment. The coil structure 6701 is formed using techniques including those describe herein. The coil structure 6701 includes in-plane and out-of-plane portions. The in-plan portions 6702 are disposed such that they substantially reside in the same plan. The in-plane and out-of-plane portions are each configured to have a surface mount component, such as a surface mount coil disposed thereon. The out-of-plane portion 6704 substantially reside in a separate plan than the in-plan portions 6702. Such a configuration enables a coil structure to have non-planar configuration, such that one or more portions of the substrate do not substantially reside in the same plane as other portions of the substrate. This enables configures to meet the space and design requirement while still enabling the use of a coil structure. Some embodiments include more than one non-plan portions.

All of the coil structures, surface mount coils, surface mount circuits, and coil portions described herein can be manufactured using techniques including those described herein.

According to some embodiments, the processes described herein are used to form one or more of any of mechanical structures and electro-mechanical structures.

Although described in connection with these embodiments, those of skill in the art will recognize that changes can be made in form and detail without departing from the spirit and scope of the invention.

What is claimed is:

1. A device comprising:
    a substrate; and
    a plurality of coil portions disposed on the substrate, the plurality of coil portions electrically coupled to form a coil structure, each of the coil portions including a metal crown portion formed over at least a portion of a trace, the metal crown formed on a top surface and sidewalls of the portion of the trace, the metal crown having a final height to width aspect ratio greater than an initial height to width aspect ratio of the trace.

2. The device of claim 1, wherein the coil structure forms a C-Shape coil structure.

3. The device of claim 1, wherein the coil portions are surface mount coils.

4. The device of claim 3, wherein the coil portions are electrically coupled with a trace on the substrate through a solder joint.

5. The device of claim 1, wherein the substrate is a circuit board.

6. The device of claim 2 including a bridge.

7. The device of claim 6, wherein the bridge is formed of adhesive.

8. The device of claim 1, wherein at least one of the one or more coil portions includes a trace jumper integrated with the coil portion.

9. The device of claim 1, wherein the substrate is formed of a plurality of portions.

10. The device of claim 9, wherein at least one of the plurality of portions include an assembly tab.

11. A coil structure comprising:
    a metal substrate including a plurality of solder joints, the plurality of solder joints includes at least a first solder joint and a second solder joint; and
    a plurality of surface mount circuits, the first solder joint and the second solder joint are formed to provide electrical contacts for at least one surface mount circuit of the plurality of surface mount circuits,
    wherein each of the plurality of surface mount circuits are disposed on separate portions of the metal substrate and electrically coupled to each other through the plurality of solder joints.

12. The coil structure of claim 11, wherein at least one of the plurality of surface mount circuits is a surface mount coil.

13. The coil structure of claim 11, wherein at least one of the plurality of surface mount circuits includes a circuit solder pad.

14. The coil structure of claim 11, wherein each solder joint includes a substrate solder pad exposed in a void formed in the metal substrate and the circuit solder pad.

15. The coil structure of claim 14, wherein each solder joint further includes solder disposed on the circuit solder pad and the substrate solder pad.

16. The coil structure of claim 11, wherein the metal substrate includes a center portion coupled to an outer portion by one or more connecting portions, at least one of the plurality of surface mount circuits disposed on the center portion.

17. The coil structure of claim 16, wherein one or more terminal pads are disposed on the outer portion and the one or more terminal pads are coupled with at least one of the plurality of surface mount circuits disposed on the center portion by one or more traces disposed in part on at least one of the one or more connecting portions.

18. The coil structure of claim 11, wherein the metal substrate includes at least one out-of-plane portion such that the substrate is non-planar.

19. The coil structure of claim 18, wherein at least one of the plurality of surface mount circuits is disposed on the out-of-plane portion.

* * * * *